(12) United States Patent
Ogata

(10) Patent No.: US 9,768,187 B2
(45) Date of Patent: Sep. 19, 2017

(54) METHOD OF MANUFACTURING SPLIT-GATE NON-VOLATILE MEMORY WITH HI-VOLTAGE AND LOW-VOLTAGE PERIPHERAL CIRCUITRY

(71) Applicant: Renesas Electronics Corporation, Tokyo (JP)

(72) Inventor: Tamotsu Ogata, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/266,914

(22) Filed: Sep. 15, 2016

(65) Prior Publication Data

US 2017/0133394 A1    May 11, 2017

(30) Foreign Application Priority Data

Nov. 11, 2015 (JP) .................................. 2015-221671

(51) Int. Cl.
| | | |
|---|---|---|
| *H01L 27/115* | (2017.01) | |
| *H01L 27/11568* | (2017.01) | |
| *H01L 27/11573* | (2017.01) | |
| *H01L 29/423* | (2006.01) | |
| *H01L 27/11575* | (2017.01) | |
| *H01L 27/11526* | (2017.01) | |
| *H01L 27/11563* | (2017.01) | |

(52) U.S. Cl.
CPC .. *H01L 27/11568* (2013.01); *H01L 27/11526* (2013.01); *H01L 27/11563* (2013.01); *H01L 27/11573* (2013.01); *H01L 27/11575* (2013.01); *H01L 29/4234* (2013.01)

(58) Field of Classification Search
CPC ......... H01L 27/11526; H01L 27/11563; H01L 27/11568; H01L 27/11575
See application file for complete search history.

(56) References Cited

U.S. PATENT DOCUMENTS

| | | | |
|---|---|---|---|
| 9,318,500 B2 | 4/2016 | Shinohara | |
| 9,543,315 B1 * | 1/2017 | Chakihara | ......... H01L 27/11573 |
| 2008/0203466 A1 * | 8/2008 | Sakai | ................ H01L 21/82384 |
| | | | 257/324 |

(Continued)

FOREIGN PATENT DOCUMENTS

| | | |
|---|---|---|
| JP | 2011-049282 A | 3/2011 |
| JP | 2014-154789 A | 8/2014 |
| JP | 2014-204041 A | 10/2014 |

*Primary Examiner* — Evan Pert
(74) *Attorney, Agent, or Firm* — McGinn IP Law Group, PLLC

(57) ABSTRACT

To provide a semiconductor device having improved performance. A method of manufacturing the semiconductor device includes forming, after formation of a control gate electrode and a memory gate electrode, a conductive film on an insulating film made of a high-dielectric-constant film via a metal film; patterning the conductive film and thereby forming a gate electrode including the metal film and the conductive film in a high-voltage MISFET region, while forming a metal film portion and a conductive film portion in a low-voltage MISFET region; and then, removing the conductive film portion from the low-voltage MISFET region, forming another conductive film on the metal film portion, and forming a gate electrode including the metal film portion and the another conductive film.

10 Claims, 51 Drawing Sheets

(56) References Cited

U.S. PATENT DOCUMENTS

| | | | |
|---|---|---|---|
| 2009/0090948 A1* | 4/2009 | Sato | H01L 27/105 257/296 |
| 2010/0059810 A1* | 3/2010 | Homma | H01L 27/11 257/324 |
| 2010/0200909 A1* | 8/2010 | Kawashima | H01L 21/28282 257/326 |
| 2012/0243339 A1* | 9/2012 | Seo | G11C 16/0425 365/185.29 |
| 2014/0302646 A1 | 10/2014 | Hirano et al. | |
| 2015/0048439 A1* | 2/2015 | Shum | H01L 29/7816 257/326 |
| 2016/0035734 A1* | 2/2016 | Kawashima | H01L 27/11529 438/258 |

\* cited by examiner

METHOD OF MANUFACTURING SPLIT-GATE NON-VOLATILE MEMORY WITH HI-VOLTAGE AND LOW-VOLTAGE PERIPHERAL CIRCUITRY

CROSS-REFERENCE TO RELATED APPLICATIONS

The disclosure of Japanese Patent Application No. 2015-221671 filed on Nov. 11, 2015 including the specification, drawings, and abstract is incorporated herein by reference in its entirety.

BACKGROUND

The present invention relates to a semiconductor device and a manufacturing method thereof which can be suited for use, for example, for a semiconductor device equipped with a semiconductor element formed on a semiconductor substrate and a manufacturing method of the semiconductor device.

A semiconductor device widely used has a memory cell region having a memory cell, for example, a nonvolatile memory formed on a semiconductor substrate and a peripheral circuit region having a peripheral circuit comprised of, for example, a MISFET (metal insulator semiconductor field effect transistor) formed on the semiconductor substrate. As the nonvolatile memory, a memory cell comprised of a split-gate type cell using a MONOS (metal-oxide-nitride-oxide-semiconductor) is sometimes formed. In this case, the memory cell is comprised of two MISFETs, that is, a control transistor having a control gate electrode and a memory transistor having a memory gate electrode. The memory gate electrode is formed by leaving a conductive film in sidewall spacer form on the side surface of the control gate electrode via an insulating film.

Japanese Unexamined Patent Application Publication No. 2014-154789 (Patent Document 1) discloses a technology of forming, in a manufacturing method of a semiconductor device, a control gate electrode and a memory gate electrode for memory cell in a memory cell region and then forming a gate electrode for MISFET in a peripheral circuit region.

Japanese Unexamined Patent Application Publication No. 2014-204041 (Patent Document 2) discloses a technology of forming, in a manufacturing method of a semiconductor device, a gate electrode for first MISFET and a dummy gate electrode for second MISFET and then after removal of the dummy gate electrode, forming a gate electrode for second MISFET in a region from which the dummy gate electrode has been removed.

Japanese Unexamined Patent Application Publication No. 2011-49282 (Patent Document 3) discloses a technology of forming, in a semiconductor device, a gate electrode made of a polysilicon film in a MONOS memory formation region, forming a gate electrode made of a polysilicon film in a high-voltage MISFET formation region, and forming a metal gate electrode made of a metal film in a low-voltage MISFET formation region.

PATENT DOCUMENTS

[Patent Document 1] Japanese Unexamined Patent Application Publication No. 2014-154789
[Patent Document 2] Japanese Unexamined Patent Application No. 2014-204041
[Patent Document 3] Japanese Unexamined Patent Application No. 2011-49282

SUMMARY

Some of such semiconductor devices have a memory cell formed in a memory cell region, a high-voltage MISFET formed in a high-voltage MISFET region in a peripheral circuit region and having a metal gate electrode, and a low-voltage MISFET formed in a low-voltage MISFET region in the peripheral circuit region and having a metal gate electrode. In the manufacturing steps of such semiconductor devices, a metal gate electrode is formed by forming a control gate electrode and a memory gate electrode in a memory cell region; forming a dummy gate electrode made of a polysilicon film for the formation of the control gate electrode and another polysilicon film formed separately therefrom on an insulating film made of a high-dielectric-constant film in a high-voltage MISFET region and a low-voltage MISFET formation region; and removing the dummy gate electrode from the high-voltage MISFET region and the low-voltage MISFET region to form a trench, filling the trench with a conductive film, and then polishing it.

The semiconductor devices thus manufactured however cannot have improved performance because a gate length of the gate electrode in the high-voltage MISFET region is long and dishing occurs when the conductive film that has filled the trench is polished. When a gate electrode made of a polysilicon film is formed in the high-voltage MISFET region while preventing dishing, on the other hand, the proportion of an area of a boundary region between the high-voltage MISFET region and the low-voltage MISFET region may increase.

Another problem and novel features will be apparent from the description herein and accompanying drawings.

In one embodiment, there is provided a method of manufacturing a semiconductor device including forming a control gate electrode and a memory gate electrode in a memory cell region, forming a conductive film made of a silicon film on a gate insulating film including an insulating film made of a high-dielectric-constant film in a high-voltage MISFET region and a low-voltage MISFET region via a metal-nitride-containing metal film, patterning the conductive film and the metal film to form a gate electrode containing the metal film and the conductive film in the high-voltage MISFET region, while forming a metal film portion including the metal film and a conductive film portion including the conductive film in the low-voltage MISFET region, and then removing the conductive film portion from the low-voltage MISFET region to expose the metal film portion, forming another conductive film on the exposed metal film portion to form a gate electrode including the metal film portion and the another conductive film on the metal film portion.

In the other embodiment, there is provided a semiconductor device having a control gate electrode and a memory gate electrode formed in a memory cell region. The semiconductor device has a gate insulating film formed on a semiconductor substrate in a high-voltage MISFET region and a gate electrode formed on the gate insulating film in the high-voltage MISFET region. The gate insulating film in the high-voltage MISFET region has a low-dielectric-constant film and a high-dielectric-constant film on the low-dielectric constant film. The gate electrode in the high-voltage MISFET region has a metal-nitride-containing metal film on the high-dielectric-constant film and a conductive film made of a silicon film on the metal film. In addition, the semiconductor device has a gate insulating film formed on the semiconductor substrate in the low-voltage MISFET region and a gate electrode formed on the gate insulating film in the low-voltage MISFET region. The gate electrode in the low-voltage MISFET region has a low-dielectric-constant film and a high-dielectric constant film on the low-dielectric-constant film. The gate electrode in the low-voltage MISFET region has a metal-nitride-containing metal film portion on the high-dielectric-constant film and another conductive film on the metal film portion. The low-dielectric-constant film included in the gate insulating film in the low-voltage MISFET region has a film thickness less than that of the low-dielectric-constant film included in the gate insulating film in the high-voltage MISFET region.

According to one of the embodiments, a semiconductor device having improved performance can be provided.

DETAILED DESCRIPTION

Figure 1:
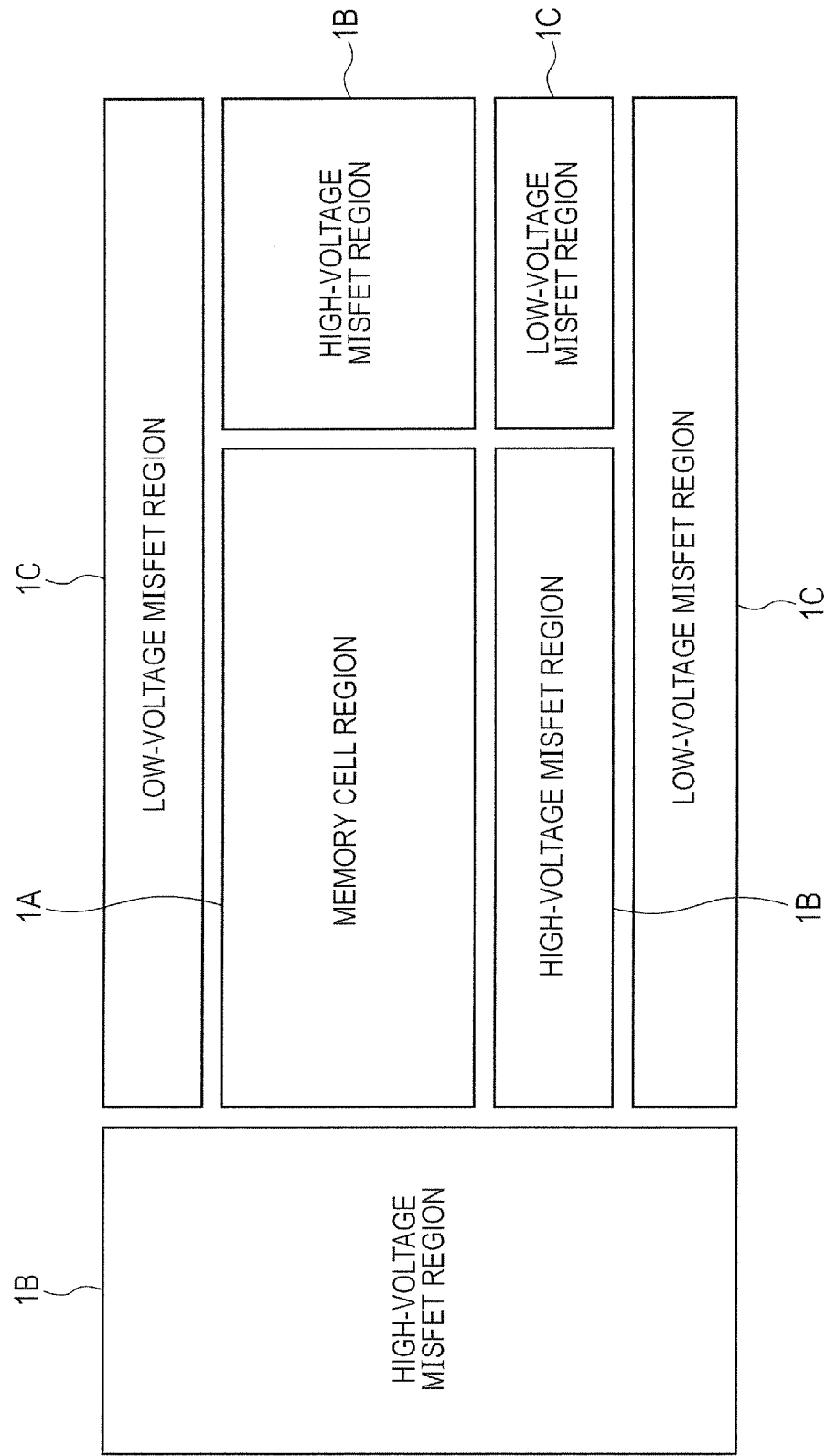
FIG. 1 shows a layout configuration example of a semiconductor device of First Embodiment.

In the following embodiments, a description will be made after divided into a plurality of sections or embodiments if necessary for the sake of convenience. These sections or embodiments are not independent from each other unless otherwise particularly specified, but one of them may be a modification example, a detailed description, a complementary description, or the like of a part or whole of the other one.

In the following embodiments, when a reference is made to the number or the like (including the number, value, amount, range, or the like) of a component, the number is not limited to a specific number but may be more or less than the specific number, unless otherwise particularly specified or principally apparent that the number is limited to the specific number.

Further, in the following embodiments, the constituent component (including component step or the like) is not always essential unless otherwise particularly specified or principally apparent that it is essential. Similarly, in the following embodiments, when a reference is made to the shape, positional relationship, or the like of the constituent component, that substantially approximate or analogous to its shape or the like is also embraced unless otherwise particularly specified or principally apparent that it is not. This also applies to the above-described number and range.

Typical embodiments will hereinafter be described in detail based on some drawings. In all the drawings for describing the embodiments, members having the same function will be identified by the same sign and overlapping descriptions will be omitted. In the following embodiments, a description on the same or similar portion is not repeated in principle unless otherwise particularly necessary.

In the drawings used in the following embodiments, even from cross-sectional views, hatching may be omitted to facilitate viewing of them.

First Embodiment

<Layout Configuration Example of Semiconductor Device>

First, a layout configuration example of a semiconductor device of First Embodiment will be described. FIG. 1 shows the layout configuration example of a semiconductor device of First Embodiment.

As shown in FIG. 1, the semiconductor device of First Embodiment is equipped with a memory cell region 1A, a high-voltage MISFET region 1B, and a low-voltage MISFET region 1C.

As will be described later using FIG. 2, the memory cell region 1A has therein a memory cell as a nonvolatile memory.

The memory cell as a nonvolatile memory is one of nonvolatile memories capable of electrically rewriting writing operation and erasing operation and is also called an electrically erasable programmable read-only memory. In First Embodiment, the memory cell as a nonvolatile memory is comprised of a MONOS transistor. The MONOS transistor makes use of source side injection (SSI) for the write operation of the MONOS transistor and, for example, a band-to-band tunneling (BTBT) phenomenon for the erase operation.

On the other hand, the high-voltage MISFET region 1B has therein a high-voltage MISFET, in other words, a high-breakdown-voltage MISFET and the low-voltage MISFET region 1C has therein a low-voltage MISFET, in other words, a low-breakdown-voltage MISFET.

The high-voltage MISFET region 1B and the low-voltage MISFET region 1C are peripheral circuit regions where a peripheral circuit is formed. The term "peripheral circuit" as used herein means a circuit other than a memory cell and it is, for example, a processor such as CPU (central processing unit), a control circuit, a sense amplifier, a column decoder, a row decoder, or an input/output circuit.

<Manufacture of Semiconductor Device>

Next, the structure of the semiconductor device of First Embodiment will be described. FIG. 2 is a fragmentary cross-sectional view of the semiconductor device of First Embodiment. A memory cell, a high-voltage MISFET, and a low-voltage MISFET described in First Embodiment are each an n channel type. Their conductivity type may alternatively be a p channel type.

Figure 2:
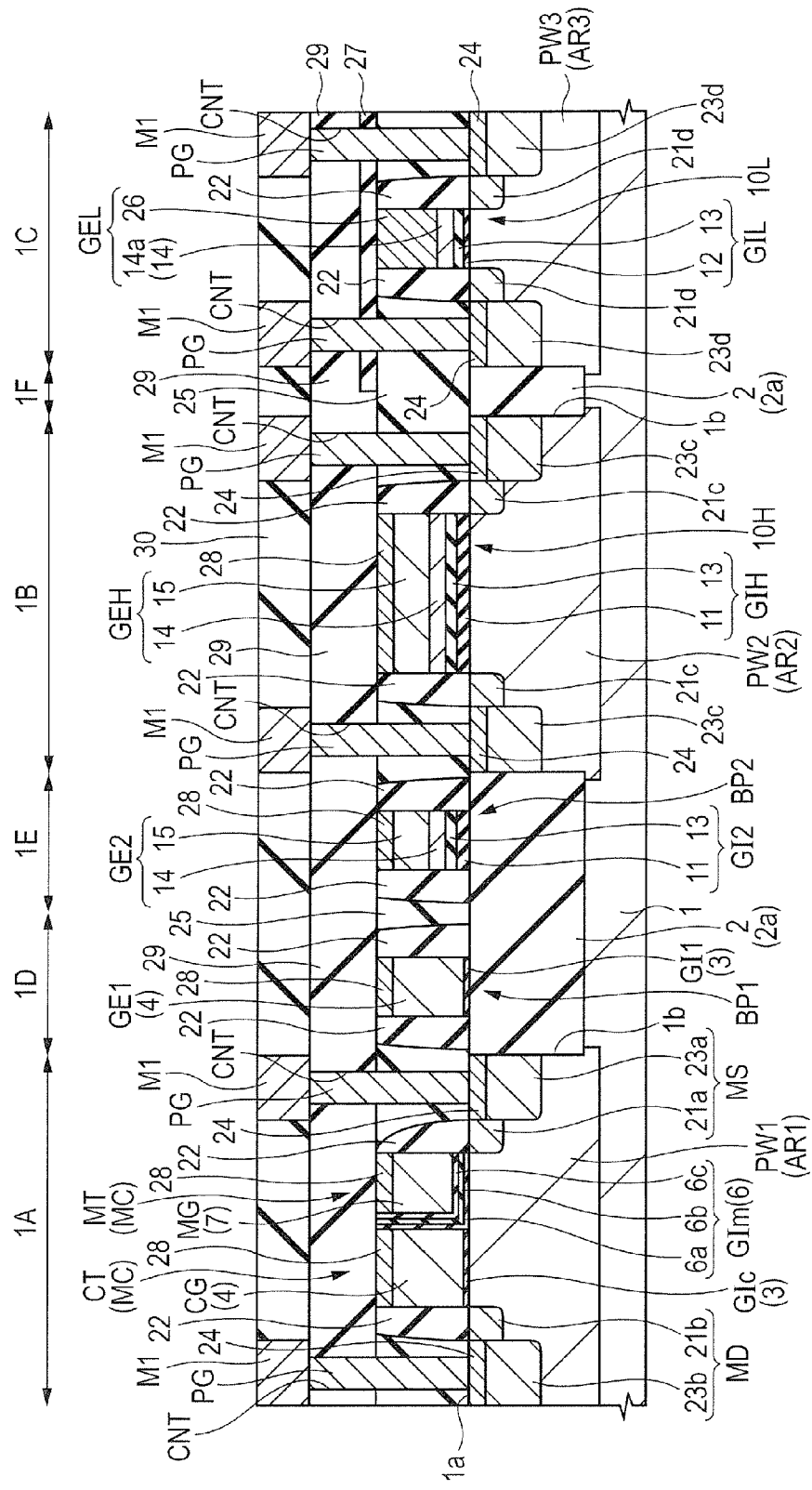
FIG. 2 is a fragmentary cross-sectional view of the semiconductor device of First Embodiment.

As shown in FIG. 2, the semiconductor device has a semiconductor substrate 1. The semiconductor substrate 1 is a semiconductor wafer made of, for example, p-type single crystal silicon having a specific resistance of from about 1 to 10 Ωcm.

The semiconductor substrate 1 has, as some regions of a main surface 1a of the semiconductor substrate 1, a memory cell region 1A, a high-voltage MISFET region 1B, and a low-voltage MISFET region 1C. The memory cell region 1A has therein a memory cell MC as a nonvolatile memory. The high-voltage MISFET region 1B has therein, a high-voltage MISFET, in other words, a MISFET 10H which is a high-voltage MISFET. The low-voltage MISFET region 1C has therein a low-voltage MISFET, in other words, a MISFET 10L which is a low-voltage MISFET.

The memory cell region 1A and the high-voltage MISFET region 1B may be or may not be adjacent to each other. The memory cell region 1A and the low-voltage MISFET region 1C may be or may not be adjacent to each other. The high voltage MISFET region 1B and the low-voltage MISFET region 1C may be or may not be adjacent to each other.

The cross-sectional view of FIG. 2 shows, as an example, the memory cell region 1A and the high-voltage MISFET region 1B adjacent to each other and the high-voltage MISFET region 1B and the low-voltage MISFET region 1C adjacent to each other. In this case, the memory cell region 1A and the high-voltage MISFET region 1B adjacent to each other have therein a boundary region 1D and the boundary region 1D and the high-voltage MISFET region 1B have therebetween a boundary region 1E. The boundary region 1D has therein a film portion BP1 as a boundary portion and the boundary region 1E has therein a film portion BP2 as a boundary portion.

First, the configuration of the memory cell MC formed in the memory cell region 1A will be described specifically.

The semiconductor device has, in the memory cell region 1A thereof, an active region AR1. The active region AR1 is surrounded by the boundary regions 1D and 1E serving as an element isolation region. In the boundary regions 1D and 1E, the semiconductor substrate 1 has, in the main surface 1a thereof, an element isolation trench 1b and the element isolation trench 1B has therein an element isolation film 2. The element isolation film 2 includes an insulating film 2a which has filled the element isolation trench 1b therewith. The active region AR1 is defined, in other words, partitioned by the element isolation film 2 and is electrically isolated from another active region by the element isolation film 2. The active region AR1 has therein a p well PW1. This means that the active region AR1 is a region having therein the p well PW1. The p well PW1 has a p-type conductivity.

As shown in FIG. 2, the p well PW1 in the memory cell region 1A has therein the memory cell MC comprised of a memory transistor MT and a control transistor CT. Although the memory cell region 1A actually has therein a plurality of memory cells MC arranged in array form, FIG. 2 shows the the cross-section of one of these memory cells MC. The memory cell MC is included in a nonvolatile memory which the semiconductor device has.

The memory cell MC is a split-gate type memory cell. Described specifically, as shown in FIG. 2, the memory cell MC has a control transistor CT having a control gate electrode CG and a memory transistor MT coupled to the control transistor CT and having a memory gate electrode MG.

As shown in FIG. 2, the memory cell MC has an n type semiconductor region MS, an n type semiconductor region MD, the control gate electrode CG, and the memory gate electrode MG. The n type semiconductor region MS and the n type semiconductor region MD have n type conductivity which is a conductivity type opposite to p-type conductivity. In addition, the memory cell MC has a gate insulating film GIc formed between the control gate electrode CG and the p well PW1 of the semiconductor substrate 1 and a gate insulating film GIm formed between the memory gate electrode MG and the p well PW1 of the semiconductor substrate 1 and between the memory gate electrode MG and the control gate electrode CG. In short, the gate insulating film GIc, the control gate electrode CG, the gate insulating film GIm, and the memory gate electrode MG configure the memory cell MC as a nonvolatile memory.

The control gate electrode CG and the memory gate electrode MG extend and are juxtaposed along the main surface 1a of the semiconductor substrate 1 while having the gate insulating film GIm between their side surfaces, that is, side walls facing to each other. The control gate electrode CG and the memory gate electrode MG extend in a direction perpendicular to the paper surface of FIG. 2. The control gate electrode CG is on a portion of the p well PW1 located between the semiconductor region MD and the semiconductor region MS, that is, on the main surface 1a of the semiconductor substrate 1 with the gate insulating film GIc therebetween. The memory gate electrode MG is on a portion of the p well PW1 located between the semiconductor region MD and the semiconductor region MS, that is, on the main surface 1a of the semiconductor substrate 1 with the gate insulating film GIm therebetween. The memory gate electrode MG is placed on the side of the semiconductor region MS and the control gate electrode CG is placed on the side of the semiconductor region MD. The control gate electrode CG and the memory gate electrode MG are gate electrodes configuring the memory cell MC, that is, a nonvolatile memory.

The control gate electrode CG and the memory gate electrode MG are adjacent to each other with the gate insulating film GIm therebetween and the memory gate electrode MG has a sidewall spacer form on the side surface, that is, the side wall of the control gate electrode CG with the gate insulating film GIm therebetween. The gate insulating film GIm extends over both a region between the memory gate electrode MG and the p well PW1 of the semiconductor substrate 1 and a region between the memory gate electrode MG and the control gate electrode CG.

The gate insulating film GIc formed between the control gate electrode CG and the p well PW1 functions as a gate insulating film of the control transistor CT. The gate insulating film GIm formed between the memory gate electrode MG and the p well PW1 functions as a gate insulating film of the memory transistor MT.

The gate insulating film GIc includes an insulating film formed on the semiconductor substrate 1. The insulating film 3 is made of a silicon oxide film, a silicon nitride film, or a silicon oxynitride film, or a high-dielectric-constant film, that is, a so-called high-k film, having a dielectric constant higher than that of a silicon nitride film. The term "high-k film" or "high-dielectric-constant film" as used herein means a film having a dielectric constant higher than that (for example, from about 7.0 to 8.0) of silicon nitride, for example, a film having a dielectric constant higher than 8.0. A film having a dielectric constant not higher than that of silicon nitride, for example, a film having a dielectric constant not higher than 8.0 may hereinafter be called "low-dielectric-constant film". As a material of the high-dielectric-constant film, for example, a metal oxide such as hafnium oxide ($HfO_2$), zirconium oxide ($ZrO_2$), aluminum oxide ($Al_2O_3$), tantalum oxide ($Ta_2O_5$), or lanthanum oxide ($La_2O_3$) may be used.

The gate insulating film GIm includes an insulating film 6. The insulating film 6 is made of a stacked film including a silicon oxide film 6a, a silicon nitride film 6b as a charge storage portion on the silicon oxide film 6a, and a silicon oxide film 6c on the silicon nitride film 6b and being called "ONO (oxide nitride oxide) film". As described above, the gate insulating film GIm between the memory gate electrode MG and the p well PW1 functions as a gate insulating film of the memory transistor MT. The gate insulating film GIm between the memory gate electrode MG and the control gate electrode CG, on the other hand, functions as an insulating film for insulating, that is, electrically isolating between the memory gate electrode MG and the control gate electrode CG.

The silicon nitride film 6b in the insulating film 6 is an insulating film for storing charges therein and functions as a charge storage portion. This means that the silicon nitride film 6b is a trap insulating film formed in the insulating film 6 and having a trap level. The insulating film 6 can therefore be regarded as an insulating film having therein a charge storage portion.

Instead of the silicon nitride film that serves as a trap insulating film having a trap level, a high-dielectric-constant film such as aluminum oxide (alumina) film, hafnium oxide film, or tantalum oxide film having a dielectric constant higher than that of a silicon nitride film may be used.

The silicon oxide film 6c and the silicon oxide film 6a disposed on and under the silicon nitride film 6b can function as charge block layers for confining charges therein. This structure of sandwiching the silicon nitride film 6b between the silicon oxide film 6c and the silicon oxide film 6a enables storage of charges in the silicon nitride film 6b.

The control gate electrode CG includes a conductive film 4 formed on the gate insulating film GIc. As the conductive film 4, usable is a silicon-containing conductive film, for example, an n type polysilicon film doped with an n type impurity and containing polycrystalline silicon.

The memory gate electrode MG includes a conductive film 7. As the conductive film 7, usable is a silicon-containing conductive film, for example, an n type polysilicon film doped with an n type impurity and containing polycrystalline silicon. The memory gate electrode MG is formed by anisotropically etching, that is, etching back the conductive film 7 formed on the semiconductor substrate 1 so as to cover the control gate electrode CG and thereby leaving the conductive film 7 on the side wall of the control gate electrode CG via the insulating film 6. The memory gate electrode MG therefore has a sidewall spacer form on the side wall located on a first side of the control gate electrode CG adjacent to this memory gate electrode MG via the insulating film 6.

The semiconductor region MS is a semiconductor region functioning as one of a source region and a drain region, while the semiconductor region MD is a semiconductor region functioning as the other one of these source and drain regions. In this embodiment, the semiconductor region MS is, for example, a semiconductor region functioning as a source region and the semiconductor region MD is, for example, a semiconductor region functioning as a drain region. The semiconductor region MS and the semiconductor region MD are each comprised of a semiconductor region having an n type impurity doped therein and are equipped with an LDD (lightly doped drain) structure.

The semiconductor region MS for source has an $n^-$ type semiconductor region 21a and an $n^+$ type semiconductor region 23a having an impurity concentration higher than that of the $n^-$ type semiconductor region 21a. The semiconductor region MD for drain has an $n^-$ type semiconductor region 21b and an $n^+$ type semiconductor region 23b having an impurity concentration higher than that of the $n^-$ type semiconductor region 21b. The $n^+$ type semiconductor region 23a has a junction depth greater and at the same time, has an impurity concentration higher than those of the $n^-$ type semiconductor region 21a and the $n^+$ type semiconductor region 23b has a junction depth greater and at the same time, has an impurity concentration higher than those of the $n^-$ type semiconductor region 21b. Although not illustrated, a pocket region or a halo region surrounding the $n^-$ type semiconductor region 21a and the $n^-$ type semiconductor region 21b may be formed so as to prevent or suppress a short channel effect.

The memory gate electrode MG and the control gate electrode CG have, on the side walls thereof on the side where they are not adjacent to each other, a sidewall spacer 22 made of an insulating film such as silicon oxide film, silicon nitride film, or stacked film thereof. Described specifically, the memory gate electrode MG has, on the side wall thereof, that is, on the side surface thereof on the side opposite to the side adjacent to the control gate electrode CG via the gate insulating film GIm a sidewall spacer 22; and the control gate electrode CG has, on the side wall thereof, that is, on the side surface thereof on the side opposite to the side adjacent to the memory gate electrode MG via the gate insulating film GIm a sidewall spacer 22.

The memory gate electrode MG and the sidewall spacer 22, the control gate electrode CG and the sidewall spacer 22, and the control gate electrode CG and the gate insulating film GIm may each have therebetween a sidewall insulating film not illustrated in the drawing.

The $n^-$ type semiconductor region 21a is self-aligned with the side surface of the memory gate electrode MG and the $n^+$ type semiconductor region 23a is self-aligned with the side surface of the sidewall spacer 22. Therefore, the lightly-doped $n^-$ type semiconductor region 21a lies below the sidewall spacer 22 on the side wall of the memory gate electrode MG and the heavily-doped $n^+$ type semiconductor region 23a lies outside the lightly-doped $n^-$ type semiconductor region 21a. The lightly-doped $n^-$ type semiconductor region 21a is therefore adjacent to the p well PW1 serving as a channel region of the memory transistor MT. The heavily-doped $n^+$ type semiconductor region 23a is in contact with the lightly-doped $n^-$ type semiconductor region 21a and is separated from the p well PW1 serving as a channel region of the memory transistor MT by the width of the $n^-$ type semiconductor region 21a.

The $n^-$ type semiconductor region 21b is self-aligned with the side surface of the control gate electrode CG and the $n^+$ type semiconductor region 23b is self-aligned with the side surface of the sidewall spacer 22. The lightly-doped $n^-$ type semiconductor region 21b therefore lies below the sidewall spacer 22 on the side wall of the control gate electrode CG and the heavily-doped $n^+$ type semiconductor region 23b lies outside the lightly-doped $n^-$ type semiconductor region 21b. The lightly-doped $n^-$ type semiconductor region 21b is adjacent to the p well PW1 serving as a channel region of the control transistor CT. The heavily-doped $n^+$ type semiconductor region 23b is adjacent to the lightly-doped $n^-$ type semiconductor region 21b and is separated from the p well PW1 serving as a channel region of the control transistor CT by the width of the $n^-$ type semiconductor region 21b.

The gate insulating film GIm under the memory gate electrode MG has therebelow a channel region of the memory transistor MT and the gate insulating film GIc under the control gate electrode CG has therebelow a channel region of the control transistor CT.

The $n^+$ type semiconductor region 23a or the $n^+$ type semiconductor region 23b has thereon, in other words, the $n^+$ type semiconductor region 23a or the $n^+$ type semiconductor region 23b has, on the upper surface thereof, a metal silicide layer 24 formed by the salicide (self aligned silicide) technology or the like. The metal silicide layer 24 is comprised of, for example, a cobalt silicide layer, a nickel silicide layer, or a platinum-added nickel silicide layer. The metal silicide layer 24 contributes to decrease of the contact resistance of the n+ type semiconductor region 23a or the n+ type semiconductor region 23b.

The control gate electrode CG or the memory gate electrode MG has thereon, in other words, the control gate electrode CG or the memory gate electrode MG has, on the upper surface thereof, a metal silicide layer 28 formed by the salicide technology. The metal silicide layer 28 is, similar to the metal silicide layer 24, comprised of, for example, a cobalt silicide layer, a nickel silicide layer, or a platinum-added nickel silicide layer. The metal silicide layer 28 contributes to decrease of the contact resistance of the control gate electrode or memory gate electrode MG.

Although not illustrated, the memory cell MC may have a halo region. The halo region has a conductivity type opposite to that of the n− type semiconductor regions 21a and 21b but same as that of the p well PW1. The halo region is formed to suppress short channel characteristics (punchthrough). The halo region is formed so as to wrap therein the n− type semiconductor region 21a or 21b and the p type impurity concentration in the halo region is higher than that in the p well PW1.

Next, the configuration of the high-voltage MISFET 10H formed in the high-voltage MISFET region 1B will be described specifically.

In the high-voltage MISFET region 1B, the semiconductor device has an active region AR2. The active region AR2 is sandwiched between the boundary regions 1D and 1E as an element isolation region and a boundary region 1F as an element isolation region. In the boundary region 1F, the semiconductor substrate 1 has, in the main surface 1a thereof, an element isolation trench 1b and the element isolation trench 1b has therein an element isolation film 2. The element isolation film 2 includes an insulating film 2a that has filled the element isolation trench 1b therewith. The active region AR2 is electrically isolated from another active region by the boundary regions 1D and 1E and the boundary region 1F. The active region AR2 has therein a p well PW2. This means that the active region AR2 is a region in which the p well PW2 has been formed. The p well PW2 has a p-type conductivity.

As shown in FIG. 2, the p well PW2 in the high-voltage MISFET region 1B has therein a high voltage MISFET 10H. The high-voltage MISFET region 1B actually has therein a plurality of high-voltage MISFETs 10H. FIG. 2 shows a cross-section, perpendicular to a gate width direction, of one of the high-voltage MISFETs 10H.

As shown in FIG. 2, the high-voltage MISFET 10H has semiconductor regions comprised of an n− type semiconductor region 21c and an n+ type semiconductor region 23c, a gate insulating film GIH formed on the p well PW2, and a gate electrode GEH formed on the gate insulating film GIH. This means that the gate insulating film GIH and the gate electrode GEH configure the high-voltage MISFET 10H. The p well PW2 of the semiconductor substrate 1 has, in an upper layer portion thereof, the n− type semiconductor region 21c and the n+ type semiconductor region 23c. The n− type semiconductor region 21c and the n+ type semiconductor region 23c have an n type conductivity, which is a conductivity type opposite to a p type conductivity.

The gate insulating film GIH functions as the gate insulating film of the MISFET 10H. The gate insulating film GIH includes, in the high-voltage MISFET region 1B, an insulating film 11 formed on the semiconductor substrate 1, that is, on the p well PW2 and an insulating film 13 formed on the insulating film 11. The insulating film 11 contains silicon oxide, silicon nitride, or silicon oxynitride. This means that the insulating film 11 has a dielectric constant lower than that of silicon nitride.

The insulating film 13 is, on the other hand, made of a high-dielectric-constant material film containing a high-dielectric-constant material, that is, a so-called high-k material, having a dielectric constant higher than that of silicon nitride. As the high-k material, for example, a metal oxide such as hafnium oxide ($HfO_2$), zirconium oxide ($ZrO_2$), aluminum oxide ($Al_2O_3$), tantalum oxide ($Ta_2O_5$), or lanthanum oxide ($La_2O_3$) can be used.

The gate electrode GEH functions as the gate electrode of the MISFET 10H. The gate electrode GEH includes a metal film 14 formed on the insulating film 13 and a conductive film 15 formed on the metal film 14. This means that the gate electrode GEH is a so-called metal gate electrode because it includes the metal film 14 contiguous to the gate insulating film GIH. The term "metal film" as used herein means a conductive film exhibiting metallic conduction.

As the metal film 14, usable is a metal film containing a metal nitride such as titanium nitride (TiN), tantalum nitride (TaN), or tungsten nitride (WN), a metal carbide such as titanium carbide (TiC), tantalum carbide (TaC), or tungsten carbide (WC), tantalum carbonitride (TaCN), or tungsten (W). As the conductive film 15, on the other hand, a silicon-containing conductive film, for example, an n type polysilicon film doped with an n type impurity and containing polycrystalline silicon can be used.

As the conductive film 15, usable is a conductive film formed by a step different from that of forming the conductive film 4 included in the control gate electrode CG. This makes it possible to narrow the width of a boundary region between the high-voltage MISFET region 1B and the low-voltage MISFET region 1C and thereby manufacture a downsized semiconductor device.

The semiconductor regions comprised of the n− type semiconductor region 21c and the n+ type semiconductor region 23c are impurity-doped semiconductor regions for source and drain and similar to the semiconductor regions MS and MD of the memory cell MC, they have an LDD structure. This means that the n+ type semiconductor region 23c has a junction depth less and an impurity concentration higher than those of the n− type semiconductor region 21c.

The gate electrode GEH has, on the side wall thereof, a sidewall spacer 22 made of an insulating film such as silicon oxide film, silicon nitride film, or stacked film thereof.

Similar to the n+ type semiconductor region 23a or the n+ type semiconductor region 23b in the memory cell MC, the n+ type semiconductor region 23c has thereon, that is, on the upper surface of the n+ type semiconductor region 23c, a metal silicide layer 24 formed by the salicide technology or the like. The metal silicide layer 24 contributes to decrease the contact resistance of the n+ type semiconductor region 23c.

The gate electrode GEH has thereon, that is, on the upper surface of the gate electrode GEH, a metal silicide layer 28 formed by the salicide technology or the like. The metal silicide layer 28 contributes to decrease the contact resistance of the gate electrode GEH.

Although not illustrated, the high-voltage MISFET 10H may have a halo region. The conductivity type of the halo region is opposite to that of the n− type semiconductor region 21c and at the same time, is same as that of the p well PW2. The halo region wraps the n− type semiconductor region 21c therein and the halo region has a p type impurity concentration higher than that of the p type impurity concentration of the p well PW2.

Next, the configuration of the low-voltage MISFET 10L formed in the low-voltage MISFET region 1C will be described specifically.

In the low-voltage MISFET region 1C, the semiconductor device has an active region AR3. The active region AR3 is electrically isolated from another active region by the boundary region 1F as an element isolation region. The active region AR3 has therein a p well PW3. The active region AR3 is a region having therein the p well PW3. The p well PW3 has a p type conductivity.

As shown in FIG. 2, the p well PW3 in the low-voltage MISFET region 1C has therein a low-voltage MISFET 10L. The low-voltage MISFET region 1C actually has a plurality of MISFETs 10L. FIG. 2 shows a cross-section, perpendicular to the gate width direction, of one of the MISFETs 10L.

As shown in FIG. 2, the low-voltage MISFET 10L has semiconductor regions comprised of an $n^-$ type semiconductor region 21d and an $n^+$ type semiconductor region 23d, a gate insulating film GIL formed on the p well PW3, and a gate electrode GEL formed on the gate insulating film GIL. This means that the gate insulating film GIL and the gate electrode GEL configure the low-voltage MISFET 10L. The n type semiconductor region 21d and the $n^+$ type semiconductor region 23d are in the upper layer portion of the p well PW3 of the semiconductor substrate 1. The n type semiconductor region 21d and the $n^+$ type semiconductor region 23d have an n type conductivity which is a conductivity type opposite to a p type conductivity.

The gate insulating film GIL functions as a gate insulating film of the MISFET 10L. The gate insulating film GIL includes an insulating film 12 formed on the semiconductor substrate 1, that is, on the p well PW3 in the low-voltage MISFET region 1C and an insulating film 13 formed on the insulating film 12. The insulating film 12 includes, similar to the insulating film 11, silicon oxide, silicon nitride, or silicon oxynitride. This means that the insulating film 12 has a dielectric constant not higher than that of silicon nitride.

On the other hand, the insulating film 13 included in the gate insulating film GIL is, similar to the insulating film 13 included in the gate insulating film GIH, made of a high-dielectric-constant film containing a high-dielectric-constant material, that is, a so-called high-k material, having a dielectric constant higher than that of silicon nitride. This means that the insulating film 13 has a dielectric constant higher than that of silicon nitride. As the high-k material, for example, metal oxides such as hafnium oxide, zirconium oxide, aluminum oxide, tantalum oxide, and lanthanum oxide are usable.

The gate electrode GEL functions as a gate electrode of the MISFET 10L. The gate electrode GEL includes a metal film portion 13a formed on the insulating film 13 and a conductive film 26 formed on the metal film portion 14a. The metal film portion 14a includes a metal film 14. This means that the gate electrode GEL is a so-called metal gate electrode because it includes the metal film 14 contiguous to the gate insulating film GIL.

As the metal film 14 included in the gate electrode GEL, similar to the metal film 14 included in the gate electrode GEH, a metal film containing a metal nitride such as titanium nitride, tantalum nitride or tungsten nitride, a metal carbide such as titanium carbide, tantalum carbide, or tungsten carbide, tantalum carbonitride, or tungsten can be used. More preferably, a metal film made of titanium nitride can be used as the metal film 14 from the standpoint of enhancing electroconductivity and from the standpoint of allowing it to function as an etching stopper when the conductive film 15 is removed during manufacturing steps of the semiconductor device.

On the other hand, as the conductive film 26, a metal film such as aluminum (Al) film can be used. This means that the conductive film 26 contains a metal.

The semiconductor regions comprised of the $n^-$ type semiconductor region 21d and the $n^+$ type semiconductor region 23d are semiconductor regions for source and drain having an n type impurity doped therein and similar to the semiconductor regions MS and MD of the memory cell MC, they have an LDD structure. This means that the $n^+$ type semiconductor region 23d has a junction depth greater and an impurity concentration higher than those of the $n^-$ type semiconductor region 21d.

The gate electrode GEL has, on the side wall thereof, a sidewall spacer 22 comprised of an insulating film such as silicon oxide film, silicon nitride film, or stacked film thereof.

Similar to the $n^+$ type semiconductor region 23a or $n^+$ type semiconductor region 23b in the memory cell MC, the $n^+$ type semiconductor region 23d has thereon, that is, on the upper surface of the $n^+$ type semiconductor region 23d, a metal silicide layer 24 formed by the salicide technology or the like. The metal silicide layer 24 contributes to reduction in the contact resistance of the $n^+$ type semiconductor region 23d.

The gate electrode GEL has thereon, that is, on the upper surface of the gate electrode GEL, no metal silicide layer formed by the salicide technology or the like, because when a metal film such as aluminum film is used as the conductive film 26, reduction in the contact resistance of the gate electrode GEL by the metal silicide layer is not required.

Although not illustrated, the low-voltage MISFET 10L may have a halo region. The halo region has a conductivity type opposite to that of the $n^-$ type semiconductor region 21d and at the same time, same as that of the p well PW3. The halo region wraps the $n^-$ type semiconductor region 21d therein and the p type impurity concentration in the halo region is higher than the p type impurity concentration in the p well PW3.

As described above, the MISFET 10H formed in the high-voltage MISFET region 1B is a high-voltage MISFET and the MISFET 10L formed in the low-voltage MISFET region 1C is a low-voltage MISFET. The high-voltage MISFET 10H is, for example, an element used in a circuit for inputting/outputting an electric current between a semiconductor device and a device outside thereof. On the other hand, the low-voltage MISFET 10L is, for example, an element configuring a logic circuit and required to conduct high-speed operation.

The gate length (channel length) of the high-voltage MISFET 10H is therefore longer than the gate length (channel length) of the low-voltage MISFET 10L. The drive voltage of the high-voltage MISFET 10H is higher than the drive voltage of the low-voltage MISFET 10L and the breakdown voltage of the high-voltage MISFET 10H is higher than the breakdown voltage of the low-voltage MISFET 10L.

The thickness of the insulating film 12 is preferably less than the thickness of the insulating film 11. This enables the gate insulating film GIH to have a thickness greater than that of the gate insulating film 11 GIH and enables the high-voltage MISFET 10H to have a drive voltage greater than that of the low-voltage MISFET 10L.

The p type impurity concentration in the p well PW2 is preferably lower than the p type impurity concentration in the p well PW3. This enables the high-voltage MISFET 10H to have a drive voltage greater than that of the low-voltage MISFET 10L.

Next, the configuration of a film portion formed in the boundary regions 1D and 1E will be described specifically.

In the boundary region 1D, the semiconductor device has a film portion BP1. The film portion BP1 includes a gate insulating film GI1 formed on the element isolation film 2 and a gate electrode GE1 formed on the gate insulating film GI1.

The gate insulating film GI1 does not function as a gate insulating film of a MISFET. The gate insulating film GI1 includes, similar to the gate insulating film GIc, an insulating film 3 formed on the element isolation film 2. The insulating film 3 included in the gate insulating film GI1 is, similar to the insulating film 3 included in the gate insulating film GIc, made of a silicon oxide film, a silicon nitride film, or a silicon oxynitride film, or a high-dielectric-constant film, that is, a so-called high-k film, having a dielectric constant higher than that of a silicon nitride film.

The gate electrode GE1 does not function as a gate electrode of a MISFET. The gate electrode GE1 includes a conductive film 4 formed on the gate insulating film GI1. As the conductive film 4 included in the gate electrode GE1, similar to the conductive film 4 included in the control gate electrode CG, a silicon-containing conductive film can be used. For example, an n type polysilicon film doped with an n type impurity and containing polycrystalline silicon can be used.

The gate electrode GE1 has, on the side wall thereof, a sidewall spacer 22 comprised of an insulating film such as silicon oxide film, silicon nitride film, or stacked film thereof.

The gate electrode GE has thereon, that is, on the upper surface of the gate electrode GE1, a metal silicide layer 28 comprised of, for example, a cobalt silicide layer, a nickel silicide layer, or a platinum-added nickel silicide layer formed by the salicide technology or the like.

In the boundary region 1E, the semiconductor device has a film portion BP2. The film portion BP2 includes a gate insulating film GI2 formed on the element isolation film 2 and a gate electrode GE2 formed on the gate insulating film GI2.

The gate insulating film GI2 does not function as a gate insulating film of a MISFET. The gate insulating film GI2 includes, similar to the gate insulating film GIH, an insulating film 11 formed on the element isolation film 2 and an insulating film 13 formed on the insulating film 11. The insulating film 11 included in the gate insulating film GI2 contains, similar to the insulating film 11 included in the gate insulating film GIH, silicon oxide, silicon nitride, or silicon oxynitride. This means that the dielectric constant of the insulating film 11 included in the gate insulating film GI1 is, similar to the dielectric constant of the insulating film 11 included in the gate insulating film GIH, not greater than that of silicon nitride.

The insulating film 13 included in the gate insulating film GI1 is, similar to the insulating film 13 included in the gate insulating film GIH, made of a high-dielectric-constant film containing a high-dielectric-constant material, that is, a so-called high-k material, having a dielectric constant higher than that of silicon nitride. As the high-k material, for example, a metal oxide such as hafnium oxide, zirconium oxide, aluminum oxide, tantalum oxide, or lanthanum oxide is usable.

The gate electrode GE2 does not function as a gate electrode of a MISFET. The gate electrode GE2 includes, similar to the gate electrode GEH, a metal film 14 formed on the insulating film 13 and a conductive film 15 formed on the metal film 14.

As the metal film 14 included in the gate electrode GE2, similar to the metal film 14 included in the gate electrode GEH, usable is a metal film containing a metal nitride such as titanium nitride, tantalum nitride, or tungsten nitride, a metal carbide such as titanium carbide, tantalum carbide, or tungsten carbide, tantalum carbonitride, or tungsten. On the other hand, as the conductive film 15 included in the gate electrode GE2, similar to the conductive film 15 included in the gate electrode GEH, a silicon-containing conductive film, for example, an n type polysilicon film doped with an n type impurity and containing polycrystalline silicon can be used.

As the conductive film 15 included in the gate electrode GE2, similar to the conductive film 15 included in the gate electrode GEH, usable is a conductive film formed by a step different from that of forming the conductive film 4 included in the control gate electrode CG. As described later while referring to FIG. 38, therefore, the width of a boundary region between the high-voltage MISFET region 1B and the low-voltage MISFET region 1C can be decreased, making it possible to provide a downsized semiconductor device.

The gate electrode GE2 has, on the sidewall thereof, a sidewall spacer 22 made of an insulating film such as silicon oxide film, silicon nitride film, or stacked film thereof.

The gate electrode GE2 has thereon, that is, on the upper surface of the gate electrode GE2, a metal silicide layer 28 made of, for example, a cobalt silicide layer, a nickel silicide layer, or a platinum-added nickel silicide layer each formed by the salicide technology or the like.

Next, the configuration on the memory cell MC formed in the memory cell region 1A, on the MISFET 10H formed in the high-voltage MISFET region 1B, and on the MISFET 10L formed in the low-voltage MISFET region 1C will be described specifically.

The semiconductor substrate 1 has thereon an insulating film 25 for filling spaces among the memory cell MC, the film portion BP1, the film portion BP2, the MISFET 10H, and the MISFET 10L. The insulating film 25 is made of, for example, a silicon nitride film. The control gate electrode CG, the memory gate electrode MG, the gate electrode GEH, the gate electrode GEL, the gate electrode GE1, the gate electrode GE2, the sidewall spacer 22, and the insulating film 25 each have a planarized upper surface.

The control gate electrode CG, the memory gate electrode MG, the gate electrode GEH, the gate electrode GEL, the gate electrode GE1, the gate electrode GE2, the sidewall spacer 22, and the insulating film 25 each have thereon an interlayer insulating film 29. The interlayer insulating film 29 is made of a single silicon oxide film or a stacked film of a silicon nitride film and a silicon oxide film. The interlayer insulating film 29 has a planarized upper surface.

The interlayer insulating film 29 has therein a contact hole CNT and the contact hole CH has therein a conductive plug PG as a conductor portion.

The plug PG is comprised of a thin barrier conductor film formed on the bottom portion and the side wall, that is, side surface of the contact hole CNT and a main conductor film formed on this barrier conductor film to fill the contact hole CNH therewith. FIG. 2 shows the barrier conductor film and the main conductor film configuring the plug PG as one film in order to simplify the drawing. The barrier conductor film configuring the plug PG may be, for example, a titanium (Ti)

film, a titanium nitride (TiN) film, or a stacked film thereof, while the main conductor film configuring the plug PG may be a tungsten (W) film.

The contact hole CNT and the plug PG formed therein lie on the n$^+$ type semiconductor regions 23a, 23b, 23c, and 23d. From the bottom portion of the contact hole CNT, for example a portion of the metal silicide layer 24 on the surface of each of the n$^+$ type semiconductor regions 23a, 23b, 23c, and 23d is exposed. The plug PG is coupled to the exposed portions. Although not illustrated, the contact hole CNT and the plug PG formed therein may be formed on the control gate electrode CG, the memory gate electrode MG, the gate electrode GEH, and the gate electrode GEL.

The interlayer insulating film 29 having the plug PG therein has thereon a first-layer wiring M1 formed as a damascene wiring which is a buried wiring using, for example, copper (Cu) as a main conductive material. Although upper-layer wirings are formed as damascene wirings above the first-layer wiring, illustration and description of them are omitted here. The first-layer wiring M1 and upper-layer wirings thereabove are not limited to a damascene wiring and they can be formed by patterning a conductive film for wiring. For example, they may be a tungsten (W) or aluminum (Al) wiring.

Next, the operation of the memory cell MC formed in the memory cell region 1A will be described.

In First Embodiment, injection of electrons into the silicon nitride film 6b, which is a charge storage portion in the gate insulating film GIm of the memory transistor, is defined as "writing" and injection of holes is defined as "erasing". Further, a power supply voltage is set at 1.5V.

As a write method, hot electron writing so-called source side injection (SSI) method can be used. At this time, a voltage Vd applied to the semiconductor region MD is set, for example, at about 0.8V; a voltage Vcg applied to the control gate electrode CG is set, for example, at about 1V; a voltage Vmg applied to the memory gate electrode MG is set, for example, at about 12V. A voltage Vs applied to the semiconductor region MS is set, for example, at about 6V and a voltage Vb applied to the p well PW1 is set, for example, at about 0V. The above-described voltages are applied to the respective sites of the memory cell MC where writing is performed and electrons are injected into the silicon nitride film 6b in the gate insulating film GIm of the memory cell MC.

Hot electrons are mainly generated in a portion of a channel region located below the memory gate electrode MG via the gate insulating film GIm and injected into the silicon nitride film 6b which is a charge storage portion in the gate insulating film GIm. The hot electrons thus injected are trapped at the trap level in the silicon nitride film 6b in the gate insulating film GIm and this results in an increase in a threshold voltage (Vth) of the memory transistor.

As an erase method, a hot hole injection erase method making use of a band-to-band tunneling (BTBT) phenomenon can be used. Described specifically, erasing is performed by injecting holes, which have been generated by the BTBT phenomenon, into the charge storage portion, that is, the silicon nitride film 6b in the gate insulating film GIm. During erasing, the voltage Vd is set, for example, at about 0V; the voltage Vcg is set, for example, at about 0V; the voltage Vmg is set, for example, at about −6V; the voltage Vs is set, for example, at about 6V; and the voltage Vb is set, for example, at about 0V. The threshold voltage of the memory transistor is reduced by applying the above-described voltages to the respective sites of the memory cell MC where erasing is performed, generating holes by the BTBT phenomenon to accelerate an electric field, and thereby injecting holes into the silicon nitride film 6b in the gate insulating film GIm of the memory cell MC.

As the erase method, a hole injection erase method making use of a Fowler-Nordheim (FN) type tunneling phenomenon can also be used. Described specifically, erasing is performed by injecting holes into the silicon nitride film 6b in the charge storage portion, that is, the gate insulating film GIm by the FN tunneling phenomenon. During erasing, the voltage Vmg is set, for example, at about 12V and the voltage Vb is set, for example, at about 0V. By directly injecting holes from the side of the memory gate electrode MG into the charge storage portion, that is, the silicon nitride film 6b via the silicon oxide film 6c by a tunneling phenomenon and thereby offsetting the electrons in the silicon nitride film 6b, erasing is performed. Alternatively, erasing is performed by trapping holes injected into the silicon nitride film 6b at the trap level in the silicon nitride film 6b. As a result, the threshold voltage of the memory transistor decreases and an erase state is achieved. Such an erase method, compared with the erase method using the BTBT phenomenon, contributes to reduction in consumption current.

During reading, the voltage Vd is set, for example, at about a power supply voltage Vdd; the voltage Vcg is set, for example, at a power supply voltage Vdd, the voltage Vmg is set, for example, at about 0V; the voltage Vs is set, for example, at about 0V; and the voltage Vb is set, for example, at about 0V. The above-described voltages are applied to the respective sites of the memory cell MC where reading is performed. The write state and the erase state can be distinguished by setting the voltage Vmg to be applied to the memory gate electrode MG during reading at a value between the threshold voltage of the memory transistor under the write state and the threshold voltage of the memory transistor under the erase state.

<Manufacturing Method of Semiconductor Device>

Figure 3:
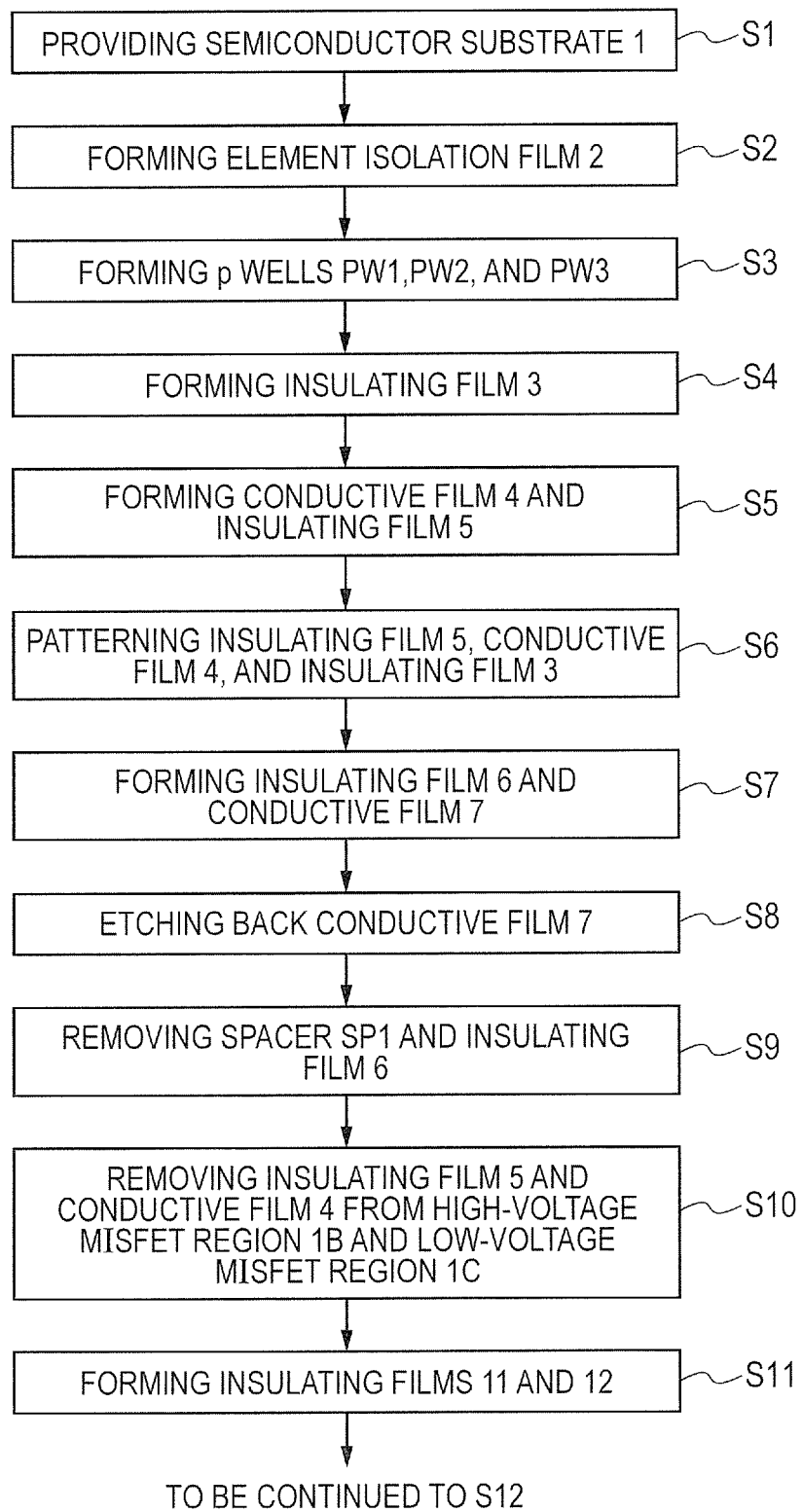
FIG. 3 is a process flow chart showing some of manufacturing steps of the semiconductor device of First Embodiment.
Figure 4:
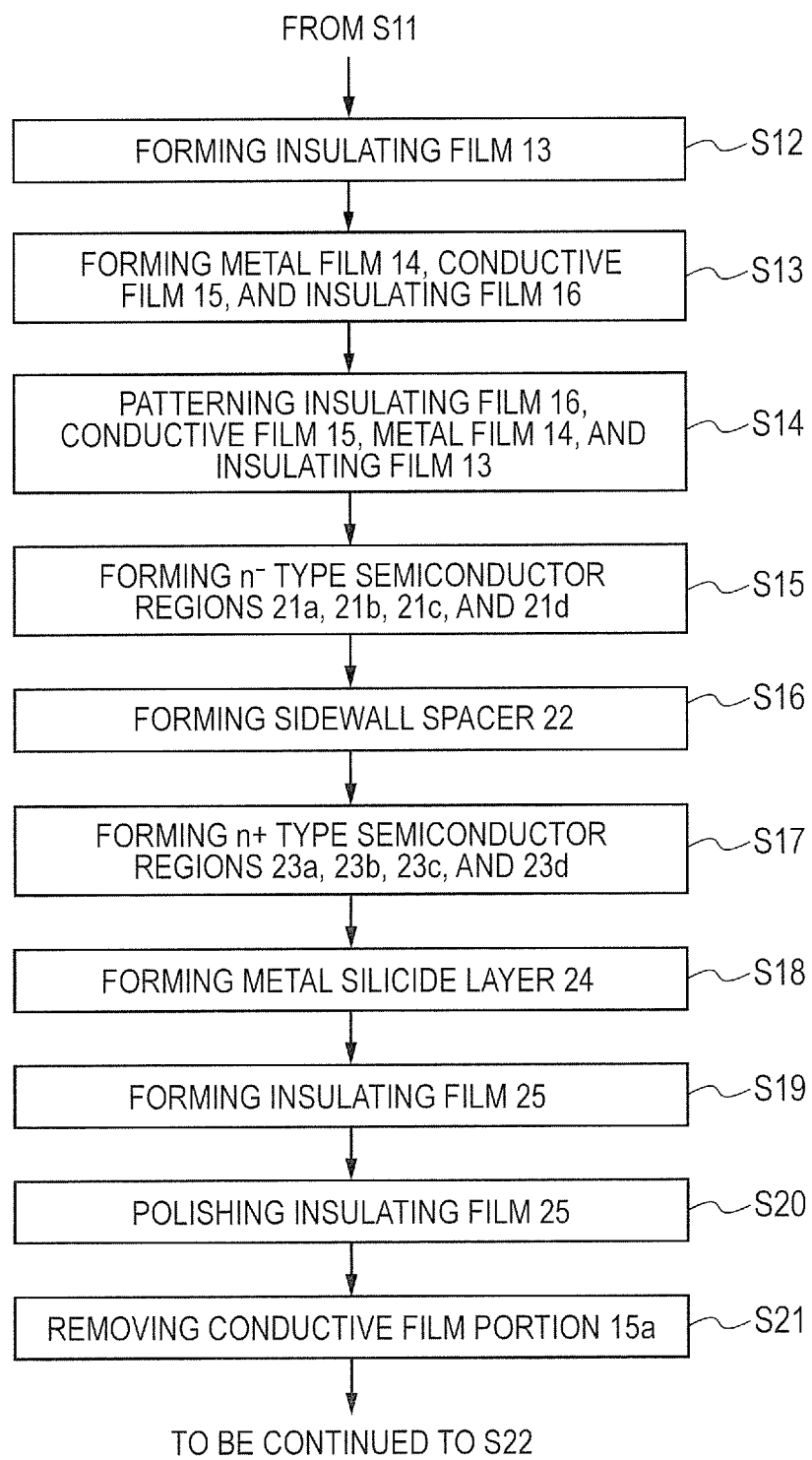
FIG. 4 is a process flow chart showing some of the manufacturing steps of the semiconductor device of First Embodiment.
Figure 5:
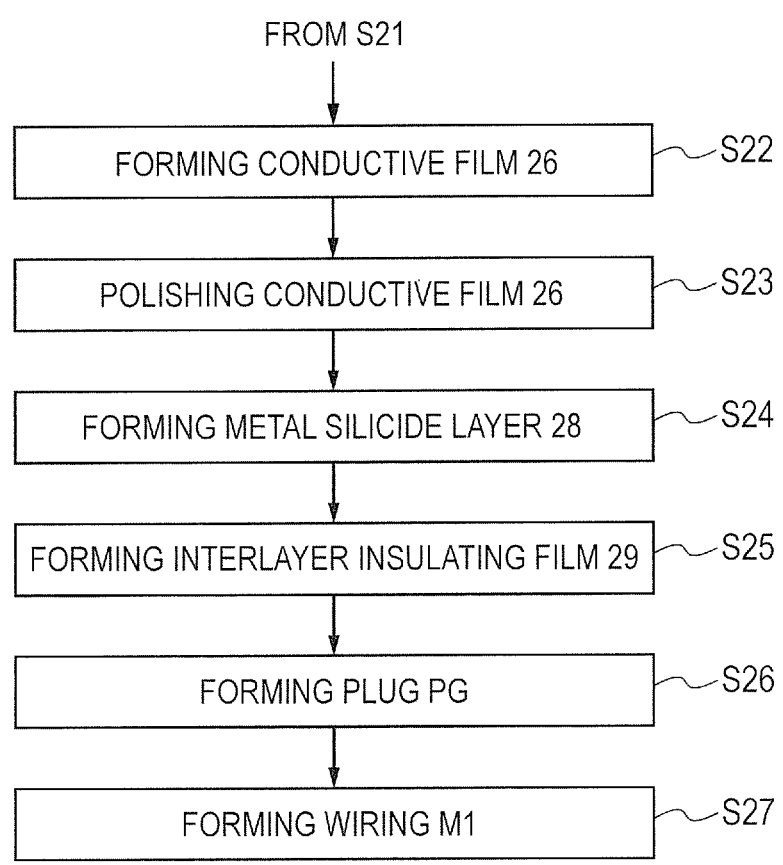
FIG. 5 is a process flow chart showing some of the manufacturing steps of the semiconductor device of First Embodiment.

Next, a method of manufacturing the semiconductor device of First Embodiment will be described. FIGS. 3 to 5 are process flow charts showing some of the manufacturing steps of the semiconductor device of First Embodiment. FIGS. 6 to 33 are fragmentary cross-sectional views of the semiconductor device of First Embodiment during their manufacturing steps. The cross-sectional views of FIGS. 6 to 33 include fragmentary cross-sectional views of the memory cell region 1A, the high-voltage MISFET region 1B, and the low-voltage MISFET region 1C. The cross-sectional views of FIGS. 6 to 33 include fragmentary cross-sectional views of the boundary regions 1D, 1E, and 1F.

It is to be noted that the width of the boundary regions 1D and 1E in FIGS. 14 to 18 is wider than the width of the boundary regions 1D and 1E in FIGS. 6 to 13 and FIGS. 19 to 33.

As described above, the memory cell region 1A and the high-voltage MISFET region 1B may be adjacent to each other or they may not be adjacent to each other. The memory cell region 1A and the low-voltage MISFET region 1C may be adjacent to each other or they may not be adjacent to each other. The high-voltage MISFET region 1B and the low-voltage MISFET region 1C may be adjacent to each other or they may not be adjacent to each other.

The cross-sectional views in FIGS. 6 to 33 show, as one example, the memory cell region 1A and the high-voltage MISFET region 1B adjacent to each other and the high-voltage MISFET region 1B and the low-voltage MISFET region 1C adjacent to each other. In this case, the boundary region 1D is placed between the memory cell region 1A and the high-voltage MISFET region 1B adjacent to each other and the boundary region 1E is placed between the boundary region 1D and the high-voltage MISFET region 1B.

In First Embodiment, described is formation of an n channel type control transistor CT and memory transistor MT in the memory cell region 1A. Alternatively, a conductivity type is reversed and a p channel type control transistor CT and memory transistor MT may be formed in the memory cell region 1A (this will equally apply to Second Embodiment).

Similarly, in First Embodiment, described is formation of an n channel type MISFET 10H in the high-voltage MISFET region 1B. It is also possible to reverse the conductivity type and form a p channel type MISFET 10H in the high-voltage MISFET region 1B or to form a CMISFET (complementary MISFET) or the like in the high-voltage MISFET region 1B (this will equally apply to Second Embodiment).

Also in First Embodiment, described is formation of an n channel type MISFET 10L in the low-voltage MISFET region 1C. It is also possible to reverse the conductivity type and form a p channel type MISFET 10L in the low-voltage MISFET region 1C or to form a CMISFET (complementary MISFET) or the like in the low-voltage MISFET region 1C (this will equally apply to Second Embodiment).

Figure 6:
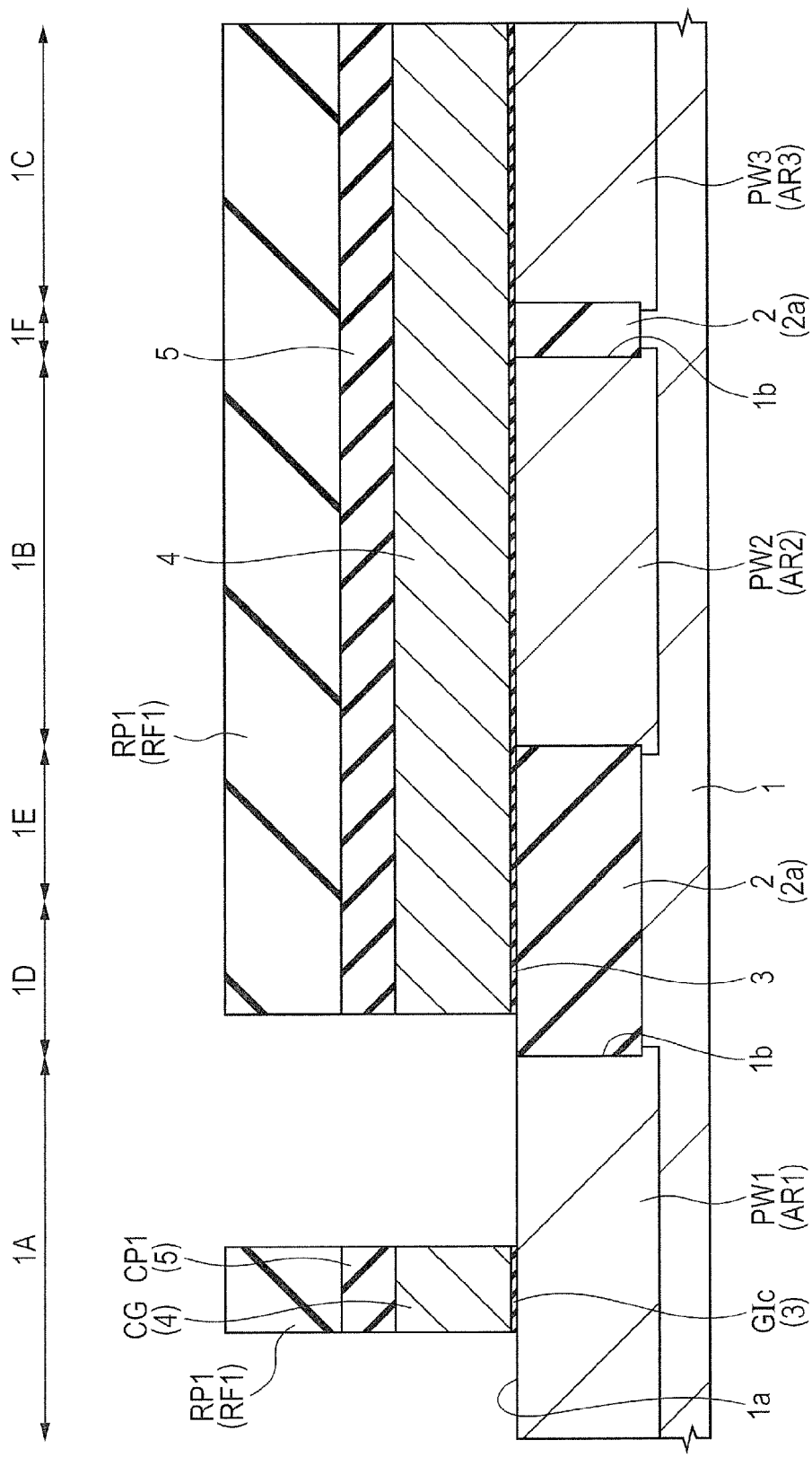
FIG. 6 is a fragmentary cross-sectional view of the semiconductor device of First Embodiment during a manufacturing step thereof.

As shown in FIG. 6, first, a semiconductor substrate 1 is provided or prepared as a semiconductor wafer made of, for example, p type single crystal silicon having a specific resistance of from about 1 to 10 Ωcm (Step S1 in FIG. 3).

Next, as shown in FIG. 6, an element isolation film 2 is formed (Step S2 in FIG. 3). In the boundary regions 1D and 1E in the main surface 1a of the semiconductor substrate 1, the element isolation film 2 becomes an element isolation region surrounding an active region AR1 therewith. In the boundary region 1F of the main surface 1a of the semiconductor substrate 1, the element isolation film 2 becomes an element isolation region that defines an active region AR2 and an active region AR3.

The element isolation film 2 is made of an insulator such as silicon oxide and can be formed, for example, by STI (shallow trench isolation), LOCOS (local oxidization of silicon), or the like method. For example, by forming a trench for element solation, that is, an element isolation trench 1b in the boundary regions 1D, 1E, and 1F as the element isolation regions and then filling this element isolation trench 1b with an insulating film 2a made of, for example, silicon oxide, an element isolation film 2 including the insulating film 2a that has filled the element isolation trench 1b can be formed.

Next, as shown in FIG. 6, p wells PW1, PW2, and PW3 are formed (Step S3 in FIG. 3). In Step S3, a p well PW1 is formed in the active region AR1 in the memory cell region 1A; a p well PW2 is formed in the active region AR2 in the high-voltage MISFET region 1B; and a p well PW3 is formed in the active region AR3 in the low-voltage MISFET region 1C. The p wells PW1, PW2, and PW3 can be formed by doping the semiconductor substrate 1 with a p type impurity such as boron (B) by ion implantation or the like. The p wells PW1, PW2, and PW3 extend from the main surface 1a of the semiconductor substrate 1 with a predetermined depth.

Next, the surface of the semiconductor substrate 1 is cleaned by removing a natural oxide film from the surface of the semiconductor substrate 1, for example, by wet etching with an aqueous hydrofluoric (HF) solution and washing the surface of the semiconductor substrate 1. By this cleaning, the surface of the semiconductor substrate 1 is exposed; the surface of the p well PW1 is exposed in the memory cell region 1A; the surface of the p well PW2 is exposed in the high-voltage MISFET region 1B; and the surface of the p well PW3 is exposed in the low-voltage MISFET region 1C.

Next, as shown in FIG. 6, an insulating film 3 is formed (Step S4 in FIG. 3). In Step S4, first, an insulating film 3 is formed on the main surface 1a of the semiconductor substrate 1 in the memory cell region 1A, the high-voltage MISFET region 1B, and the low-voltage MISFET region 1C. Also in the boundary regions 1D, 1E, and 1F, an insulating film 3 is formed on the semiconductor substrate 1, that is, on the element isolation film 2. The insulating film 3 is an insulating film for a gate insulating film GIc of a memory cell MC (refer to FIG. 27 described later). The thickness of the insulating film 3 can be set, for example, at about 2 to 3 nm.

In the memory cell region 1A, the insulating film 3 is formed on the p well PW1; in the high-voltage MISFET region 1B, the insulating film 3 is formed on the p well PW2; and in the low-voltage MISFET region 1C, the insulating film 3 is formed on the p well PW3. In the boundary regions 1D, 1E, and 1F, the insulating film 3 is formed on the element isolation film 2.

As the insulating film 3, a silicon oxide film, a silicon nitride film, a silicon oxynitride film, or a high-k film, that is, a high-dielectric-constant film can be used. The insulating film 3 can be formed using thermal oxidation, sputtering, atomic layer deposition (ALD), chemical vapor deposition (CVD), or the like method.

Next, as shown in FIG. 6, a conductive film 4 and an insulating film 5 are formed (Step S5 in FIG. 3).

In Step S5, first, a conductive film 4 is formed on the insulating film 3 in the memory cell region 1A, the high-voltage MISFET region 1B, and the low-voltage MISFET region 1C. Also in the boundary regions 1D, 1E, and 1F, a conductive film 4 is formed on the insulating film 3. This means that the conductive film 4 covers the insulating film 3. The conductive film 4 is for a control gate electrode CG of a memory cell MC (refer to FIG. 27 described later). The conductive film 4 can have a thickness of, for example, from about 50 to 100 nm.

The conductive film 4 is preferably a silicon-containing conductive film and is, for example, an n type polysilicon film doped with an n type impurity and containing polycrystalline silicon. Such a conductive film 4 can be formed by the CVD method or the like. The conductive film 4 can also be formed by forming an amorphous silicon film and then carrying out heat treatment to turn the resulting amorphous silicon film into a polycrystalline silicon film.

As the conductive film 4, a film doped with an n type impurity such as phosphorus (P) or arsenic (As) and thereby having a reduced resistivity is preferred. The impurity can be doped during or after formation of the conductive film 4. When the impurity is doped during formation of the conductive film 4, the conductive film 4 doped with the impurity can be obtained by incorporating a doping gas in a gas for forming the conductive film 4. When the impurity is doped after formation of a silicon film, the conductive film 4 doped with the impurity can be obtained by forming the silicon film without intentionally doping an impurity therein and then doping the resulting silicon film with the impurity by ion implantation or the like.

In Step S5, next, an insulating film 5 is formed on the conductive film 4 in the memory cell region 1A, the high-voltage MISFET region 1B, and the low-voltage MISFET region 1C. Also in the boundary regions 1D, 1E, and 1F, an insulating film 5 is formed on the conductive film 4. The insulating film 5 is a conductive film for a cap insulating film CP1. The insulating film 5 can have a thickness of, for example, from about 20 to 100 nm. The insulating film 5 made of, for example, a silicon nitride film can be formed using, for example, CVD.

Although not illustrated, an insulating film made of a silicon oxide film can be formed between the conductive film 4 and the insulating film 5.

Next, as shown in FIG. 6, the insulating film 5, the conductive film 4, and the insulating film 3 are patterned (Step S6 in FIG. 3). In Step S6, the insulating film 5, the conductive film 4, and the insulating film 3 are patterned using, for example, photolithography and etching.

In Step S6, first, a resist film RF1 is formed on the insulating film 5. Then, an opening portion penetrating the resist film RF1 and reaching the insulating film 5 is formed and a resist pattern RP1 including the resist film RF1 having an opening portion therein is formed.

At this time, the insulating film 5 is exposed from the resist film RF1 in a portion of the memory cell region 1A except a portion thereof where a control gate electrode CG is to be formed, while the insulating film 5 is covered with the resist film RF1 in a portion of the memory cell region 1A where the control gate electrode CG is to be formed, the high-voltage MISFET region 1B, and the low-voltage MISFET region 1C. The insulating film 5 is exposed from the resist film RF1 in a portion of the boundary regions 1D and 1E on the side of the memory cell region 1A with respect to a portion of these regions where a gate electrode GE1 (refer to FIG. 11 described later) is to be formed. On the other hand, the insulating film 5 is covered with the resist film in a portion of the boundary regions 1D and 1E where the gate electrode GE1 is to be formed and in a portion of these regions on the side opposite to the memory cell region 1A with respect to the portion where the gate electrode GE1 is to be formed. In the boundary region 1F, the insulating film 5 is covered with the resist film RF1.

In Step S6, next, the insulating film 5 and the conductive film 4 are patterned by etching, for example, dry etching, with the resist pattern RP1 as an etching mask.

As a result, in the memory cell region 1A, a control gate electrode CG including the conductive film 4 is formed and a gate insulating film GIc including the insulating film 3 between the control gate electrode CG and the semiconductor substrate 1 is formed. In other words, in the memory cell region 1A, a gate insulating film GIc including the insulating film 3 on the p well PW1 is formed and a control gate electrode CG including the conductive film 4 on the gate insulating film GIc is formed. In addition, in the memory cell region 1A, a cap insulating film CP1 including the insulating film 5 on the control gate electrode CG is formed.

On the other hand, the insulating film 5, the conductive film 4, and the insulating film 3 are left in the high-voltage MISFET region 1B and the low-voltage MISFET region 1C. In addition, the insulating film 5, the conductive film 4, and the insulating film 3 are left in a portion of the boundary regions 1D and 1E where a gate electrode GE1 (refer to FIG. 11 described later) is to be formed and a portion of these regions on the side opposite to the memory cell region 1A with respect to the portion where the gate electrode GE1 is to be formed. Then, the resist pattern RP1, that is, the resist film RF1 is removed.

In the memory cell region 1A, a portion of the insulating film 3 exposed from the control gate electrode CG can be removed by dry etching in Step S6 or wet etching after dry etching in Step S6. The p well PW1 of the semiconductor substrate 1 is then exposed from a portion of the memory cell region 1A where the control gate electrode CG has not been formed.

Figure 7:
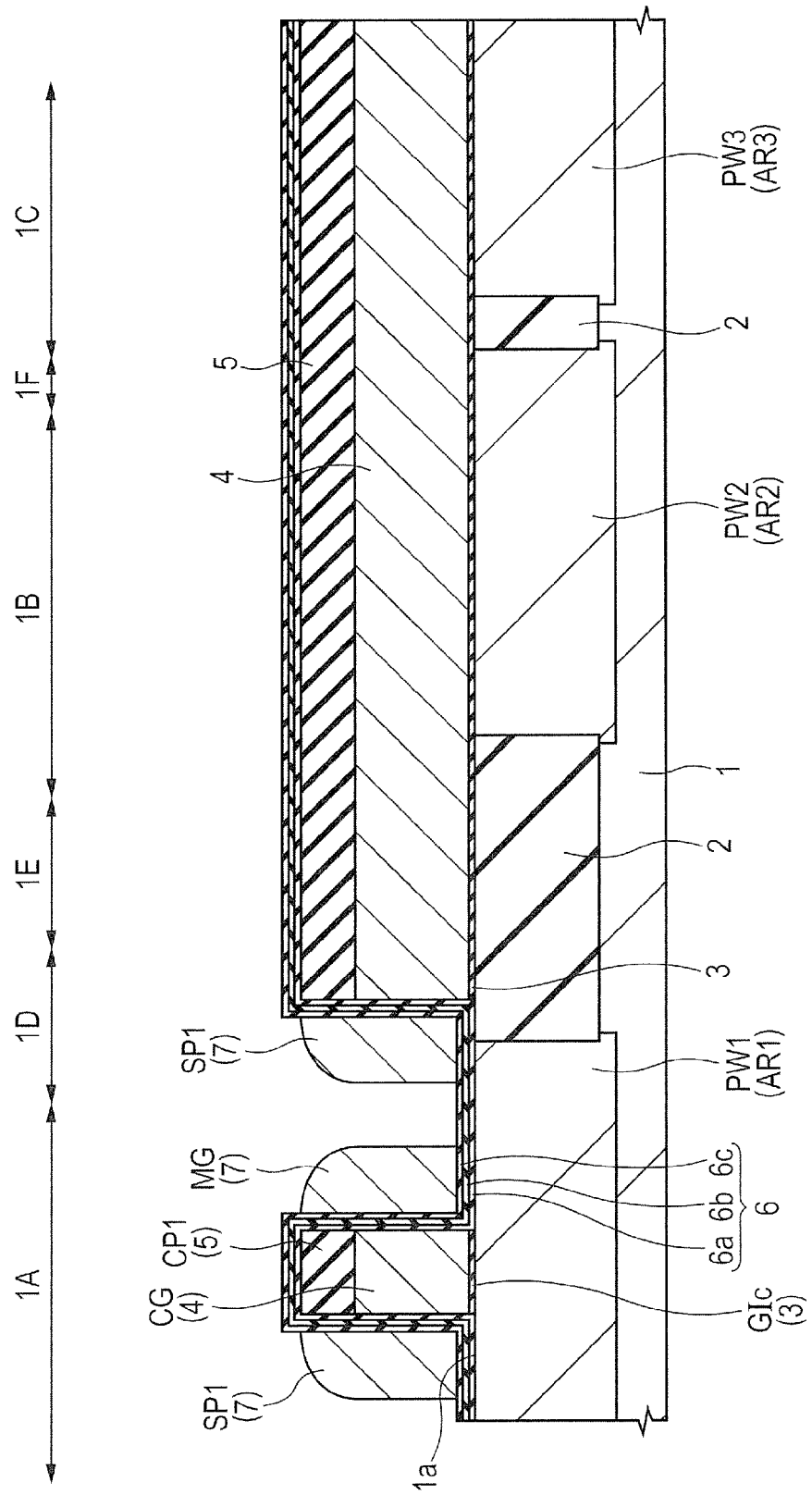
FIG. 7 is a fragmentary cross-sectional view of the semiconductor device of First Embodiment during a manufacturing step thereof.

Next, as shown in FIG. 7, an insulating film 6 and a conductive film 7 are formed (Step S7 in FIG. 3).

In Step S7, as shown in FIG. 7, an insulating film 6 for a gate insulating film GIm (refer to FIG. 9 described later) of a memory transistor MT (refer to FIG. 27 described later) on the main surface 1a of the semiconductor substrate 1 in the memory cell region 1A, the high voltage MISFET region 1B, and the low-voltage MISFET region 1C. At this time, in the memory cell region 1A, the insulating film 6 is formed on the exposed portion of the main surface 1a of the semiconductor substrate 1, the side surface of the control gate electrode CG, and the upper surface and the side surface of the cap insulating film CP2. In addition, the insulating film 6 is formed on the upper surface of a portion of the insulating film 5 left in the high-voltage MISFET region 1B and the low-voltage MISFET region 1C, the upper surface and the side surface of a portion of the film left in the boundary regions 1D and 1E, and the upper surface of a portion of the film left in the boundary region 1F. Still further, the insulating film 6 is formed on the side surface of a portion of the conductive film 4 left in the boundary regions 1D and 1E. This means that the insulating film 6 is formed on the semiconductor substrate 1 in the memory cell region 1A, the high-voltage MISFET region 1B, and the low-voltage MISFET region 1C and it covers the control gate electrode CG and the conductive film 4.

As described above, the insulating film 6 has therein a charge storage portion and is comprised of a film, as an insulating film, obtained by successively stacking a silicon oxide film 6a, a silicon nitride film 6b, and a silicon oxide film 6c in order of mention. The thickness of the silicon oxide film 6a can be set, for example, at from about 2 to 5 nm; the thickness of the silicon nitride film 6b can be set, for example, at from about 5 to 15 nm; and the thickness of the silicon oxide film 6c can be set, for example, at from about 5 to 15 nm. The silicon oxide film 6c may be replaced by a silicon oxynitride film.

Of the insulating film 6, the silicon oxide film 6a can be formed, for example, at about 900° C. by thermal oxidation or ISSG oxidation, which may be followed by nitriding treatment, for example, at a temperature as high as about 1025° C. Of the insulating film 6, the silicon nitride film 6b can be formed, for example, by CVD. Further, of the insulating film 6, the silicon oxide film 6c can be formed, for example, by CVD.

Described specifically, first, a silicon oxide film 6a is formed on the exposed portion of the main surface 1a of the semiconductor substrate 1, the side surface of the control gate electrode CG, and the upper surface and the side surface of the cap insulating film CP1, for example, by thermal oxidation or ISSG oxidation. The silicon oxide film 6a is formed on the upper surface of a portion of the insulating film 5 left in the high-voltage MISFET region 1B and the low-voltage MISFET region 1C, the upper surface and the side surface of a portion of the insulating film 5 left in the boundary regions 1D and 1E, and the upper surface of a portion of the insulating film 5 left in the boundary region 1F. Further, the silicon oxide film 6a is formed on the side surface of a portion of the conductive film 4 left in the boundary regions 1D and 1E. In other words, the silicon oxide film 6a that covers the control gate electrode CG and the conductive film 4 is formed on the semiconductor substrate 1 in the memory cell region 1A, the high-voltage MISFET region 1B, and the low-voltage MISFET region 1C. The thickness of the silicon oxide film 6a can be set, for example, at about 4 nm.

Next, a silicon nitride film 6b is formed on the silicon oxide film 6a, for example, by CVD and a silicon oxide film 6c is formed on the silicon nitride film 6b, for example, by CVD, thermal oxidation, or both of them. As a result, an insulating film 6 comprised of a stacked film of the silicon oxide film 6a, the silicon nitride film 6b, and the silicon oxide film 6c can be formed.

The insulting film 6 formed in the memory cell region 1A functions as a gate insulating film of the memory gate electrode MG and has a charge retention function. The insulating film 6 has such a structure that the silicon nitride film 6b as a charge storage portion is sandwiched between the silicon oxide films 6a and 6c serving as charge block layers. The potential barrier height of the charge block layer comprised of the silicon oxide films 6a and 6c becomes higher than that of the charge storage portion comprised of the silicon nitride film 6b.

Next, in Step S7, as shown in FIG. 7, a conductive film 7 is formed on the insulating film 6 in the memory cell region 1A, the high voltage MISFET region 1B, and the low-voltage MISFET region 1C. A conductive film 7 is also formed on the insulating film 6 in the boundary regions 1D, 1E, and 1F. The thickness of the conductive film 7 can be set, for example, at from about 30 to 100 nm.

The conductive film 7 is preferably a silicon-containing conductive film and is, for example, an n type polysilicon film doped with an n type impurity and containing polycrystalline silicon. Such a conductive film 7 can be formed using CVD or the like. The conductive film 7 is formed by forming an amorphous silicon film and then carrying out heat treatment to convert the resulting amorphous silicon film into a polycrystalline silicon film.

The conductive film 7 is preferably a film doped with an n type impurity such as phosphorus (P) or arsenic (AS) or a p type impurity such as boron (B) and thereby having a reduced resistivity. The impurity can be doped during or after formation of the conductive film 7. When the impurity is doped during formation of the conductive film 7, the conductive film 7 having an impurity doped therein can be obtained by incorporating a doping gas in a gas for forming the conductive film 7. When the impurity is doped after formation of a silicon film, on the other hand, the conductive film 7 having an impurity doped therein can be obtained by forming a silicon film without intentionally doping an impurity therein and then doping the impurity into the resulting silicon film by ion implantation or the like.

Next, as shown in FIG. 7, the conductive film 7 is etched back by anisotropic etching (Step S8 in FIG. 3).

In this Step S8, the conductive film is etched back by a thickness corresponding to the thickness of the conductive film 7 to leave, via the insulating film 6, the conductive film 7 in sidewall spacer form on the side wall, that is, the side surface on both sides of the control gate electrode CG and remove the conductive film 7 from other regions such as the high-voltage MISFET region 1B and the low-voltage MISFET region 1C.

As a result, as shown in FIG. 7, a memory gate electrode MG is formed, which is comprised of the conductive film 7 left in sidewall spacer form via the insulating film 6 on a first-side side wall of the both side walls of the control gate electrode CG. The memory gate electrode MG is formed on the semiconductor substrate 1 and is adjacent to the control gate electrode CG. A spacer SP1 comprised of the conductive film 7 left in sidewall spacer form is formed, via the insulating film 6, on the side wall opposite to the first-side side wall of the control gate electrode CG.

The memory gate electrode MG is formed on the insulating film 6 so as to be adjacent to the control gate electrode CG via the insulating film 6. The memory gate electrode MG and the spacer SP1 are formed on the side walls of the control gate electrode CG opposite to each other, respectively. They have a substantially symmetrical structure with the control gate electrode CG therebetween.

The control gate electrode CG has thereon the cap insulating film CP1. The memory gate electrode MG is therefore comprised of the conductive film 7 left in sidewall spacer form via the insulating film 6 on the first-side side wall of the cap insulating film CP1. The spacer SP1 is comprised of the conductive film 7 left in sidewall spacer form via the insulating film 6 on the side wall opposite to the first-side side wall of the cap insulating film CP1.

A spacer SP1 is also formed on the side surface of a portion of the conductive film 4 left in the boundary regions 1D and 1E via the insulating film 6.

The memory gate electrode MG formed in Step S8 and the p well PW1 of the semiconductor substrate 1 and the memory gate electrode MG and the control gate electrode CG each have therebetween the insulating film 6 and this memory gate electrode MG is comprised of the conductive film 7 contiguous to the insulating film 6.

When the etch-back step of Step S8 is performed, a portion of the insulating film 6 noncovered with the memory gate electrode MG and the spacer SP1 is exposed. The insulating film 6 under the memory gate electrode MG in the memory cell region 1A becomes a gate insulating film GIm (refer to FIG. 9 described later) of the memory transistor MT. The memory gate length can be adjusted by adjusting the thickness of the conductive film 7 formed in Step S8.

Figure 8:
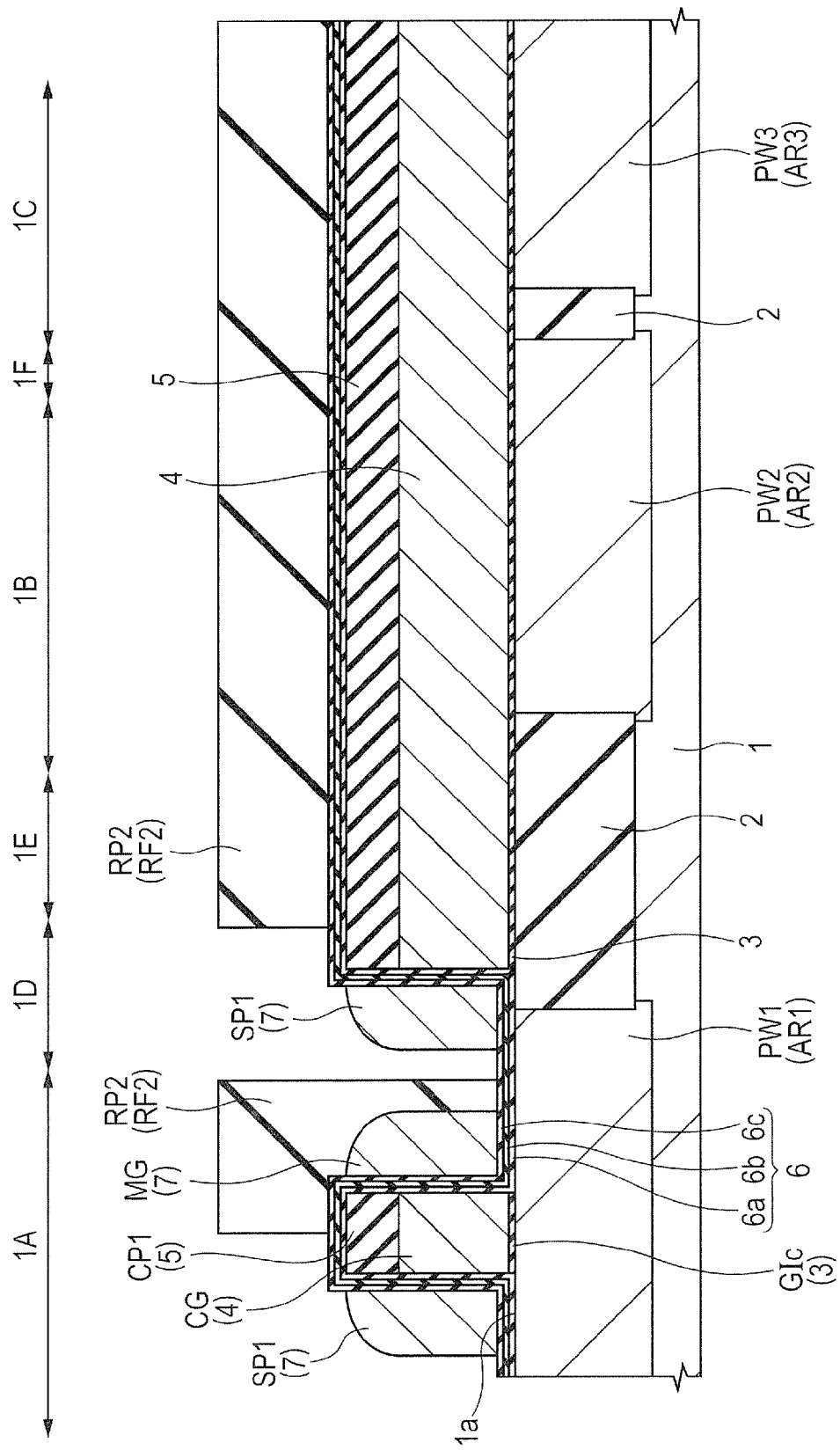
FIG. 8 is a fragmentary cross-sectional view of the semiconductor device of First Embodiment during a manufacturing step thereof.
Figure 9:
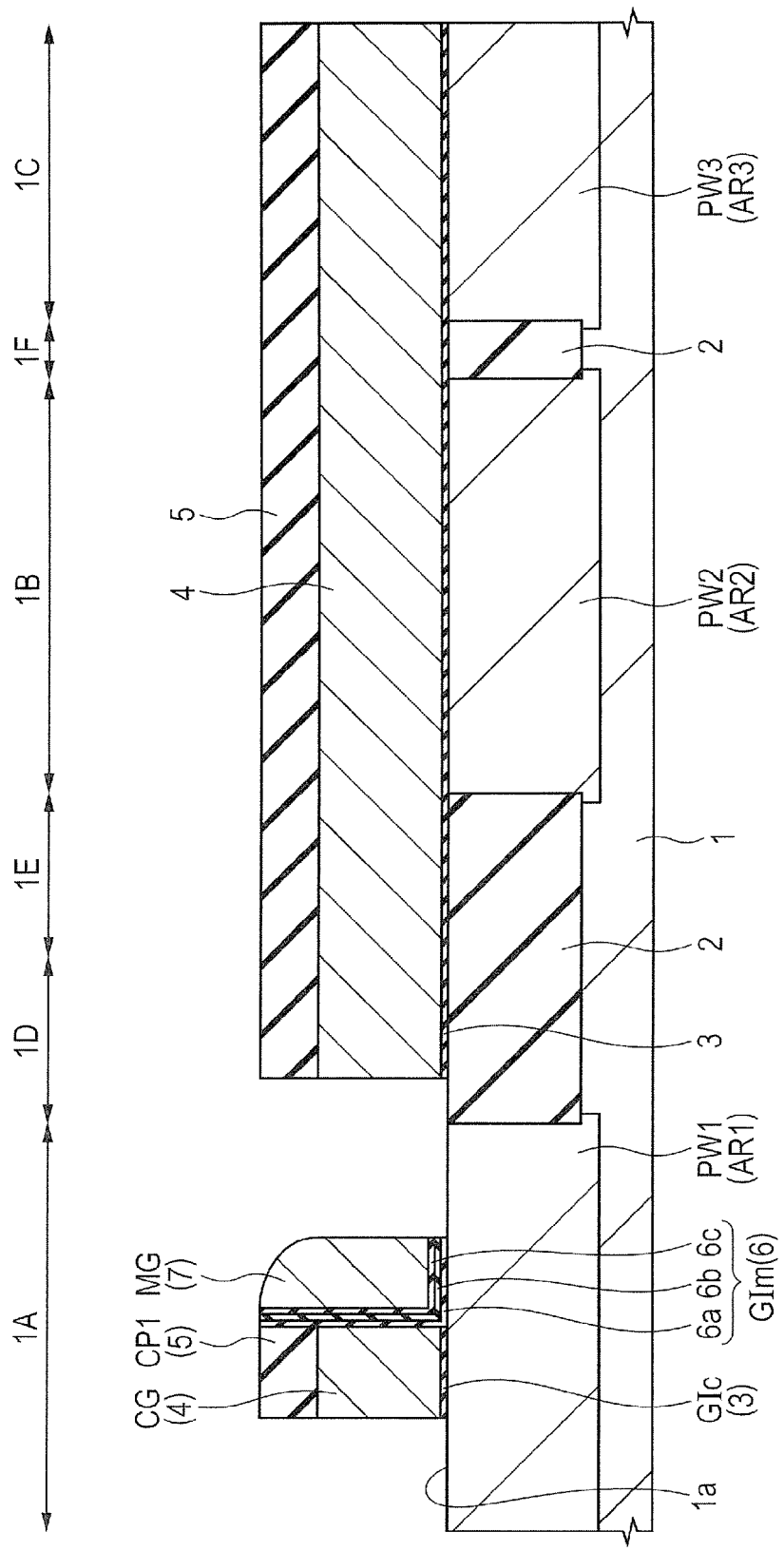
FIG. 9 is a fragmentary cross-sectional view of the semiconductor device of First Embodiment during a manufacturing step thereof.

Next, as shown in FIGS. 8 and 9, the spacer SP1 and the insulating film 6 are removed (Step S9 in FIG. 3).

In Step S9, as shown in FIG. 8, a resist pattern RP2 in which the memory gate electrode MG is covered with a resist film RF2 and the spacer SP1 is exposed from the resist film RF2 is formed on the semiconductor substrate 1 by photolithography. By isotropic etching such as dry etching, with the resulting resist pattern RP2 as an etching mask, the spacer SP1 is removed as shown in FIG. 9. On the other hand, the memory gate electrode MG remains without being etched because it is covered with the resist pattern RP2. This resist pattern RP2 is then removed.

Next, in Step S9, a portion of the insulating film 6 not covered with the memory gate electrode MG, that is, a portion of the insulating film exposed from the memory gate electrode MG is removed by etching, for example, wet etching. At this time, a portion of the insulating film 6 between the memory gate electrode MG and the p well PW1 and between the memory gate electrode MG and the control gate electrode CG remains without being removed in the memory cell region 1A, while the insulating film 6 is removed from the other regions such as the high-voltage MISFET region 1B and the low-voltage MISFET region 1C. As a result, a gate insulating film GIm including a portion of the insulating film 6 left between the memory gate electrode MG and the p well PW1 and a portion of the insulating film left between the memory gate electrode MG and the control gate electrode CG is formed in the memory cell region 1A.

In Step S9, etching may be performed so as to remove the silicon oxide film 6c and the silicon nitride film 6b from the insulating film 6 and leave the silicon oxide film 6a without being removed.

Figure 10:
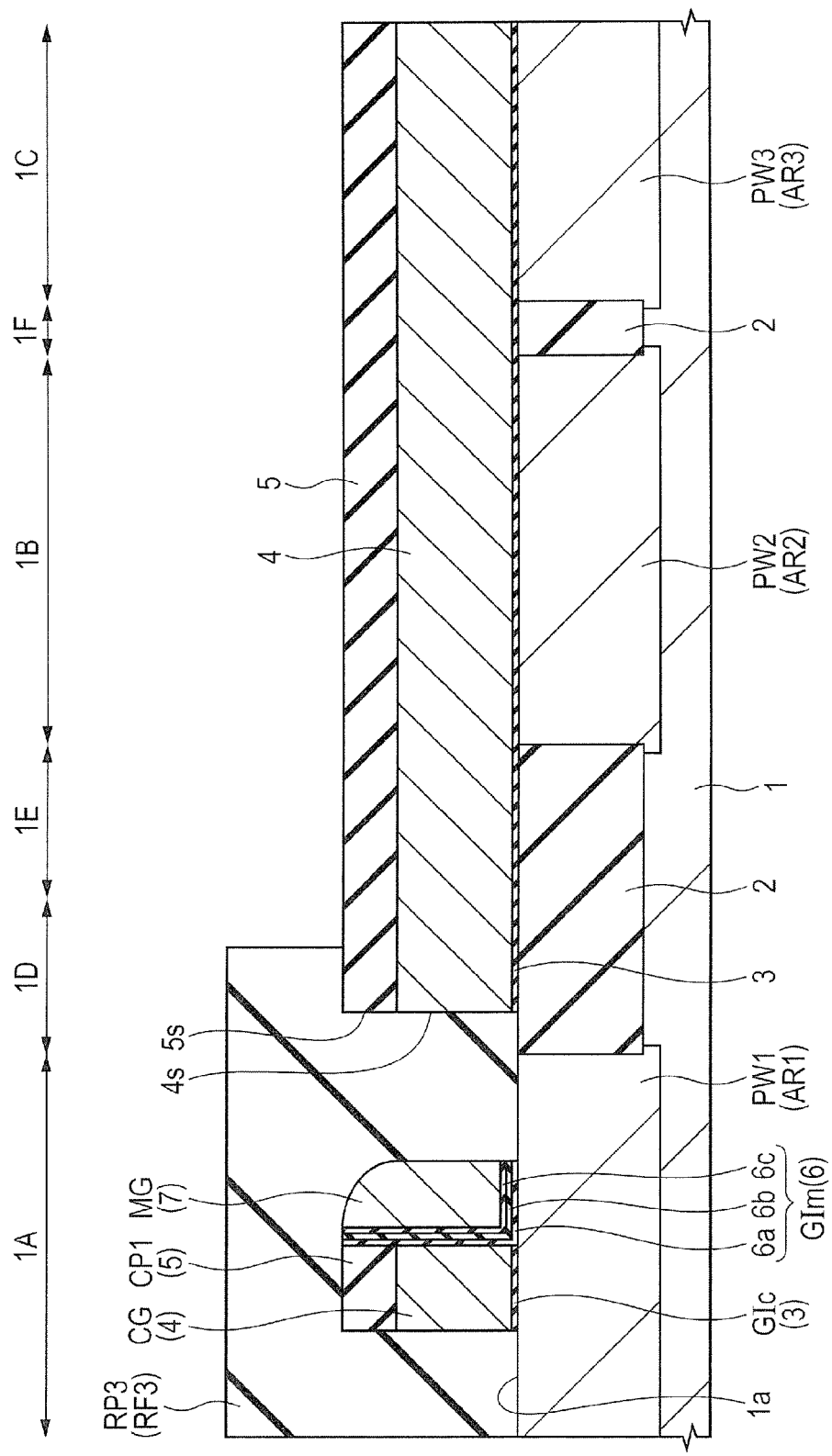
FIG. 10 is a fragmentary cross-sectional view of the semiconductor device of First Embodiment during a manufacturing step thereof.
Figure 11:
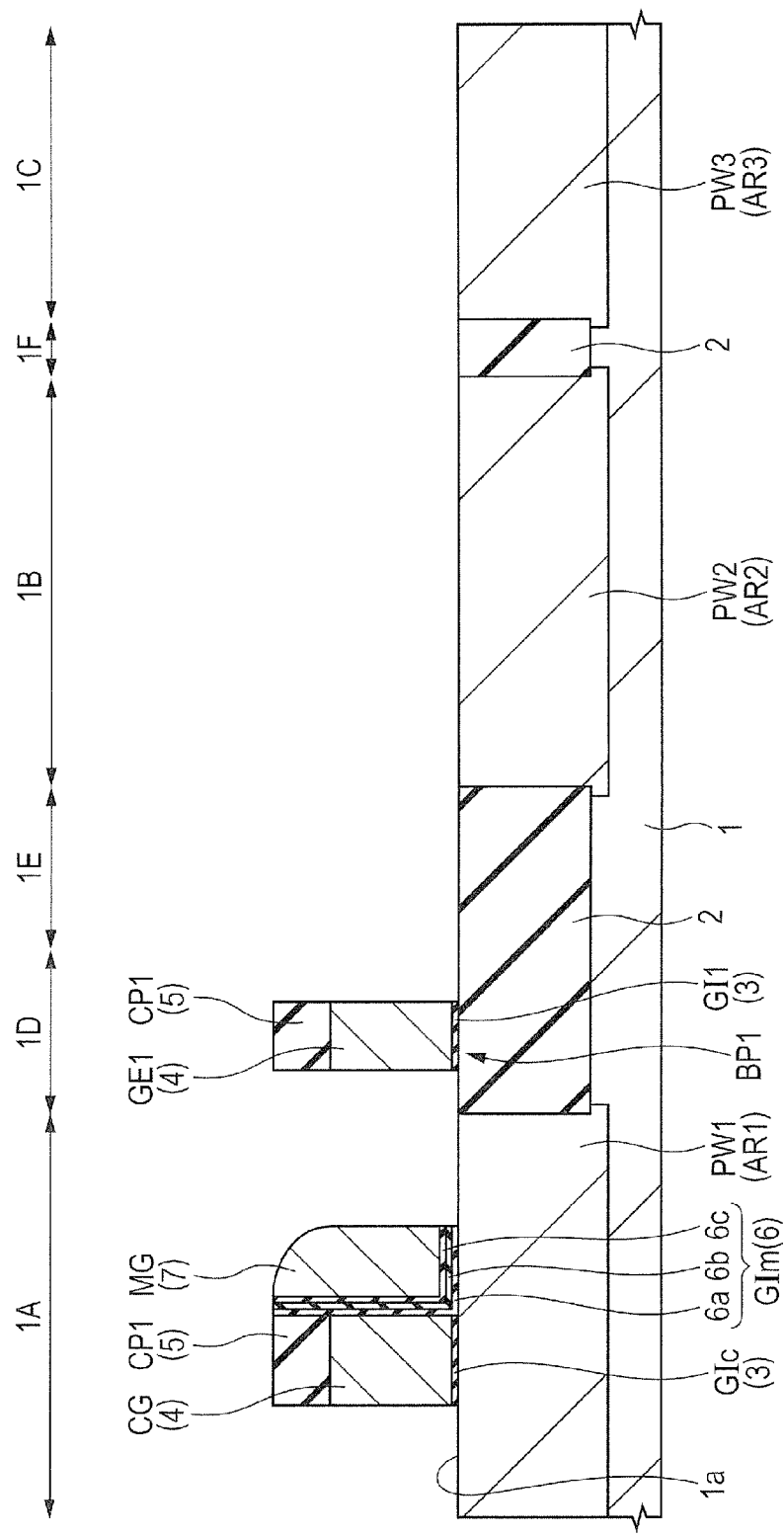
FIG. 11 is a fragmentary cross-sectional view of the semiconductor device of First Embodiment during a manufacturing step thereof.

Next, as shown in FIGS. 10 and 11, the insulating film 5 and the conductive film 4 are removed from the high-voltage MISFET region 1B and the low-voltage MISFET region 1C (Step S10 in FIG. 3). In Step S10, when the insulating film 5 and the conductive film 4 are removed from the high-voltage MISFET region 1B and the low-voltage MISFET region 1C, a film portion BP1 is formed in the boundary region 1D.

In Step S10, first, as shown in FIG. 10, a resist pattern RP3 including a resist film RF3 is formed. At this time, the insulating film 5 is exposed from the resist film in a portion of the boundary regions 1D and 1E on the side opposite to the side of the memory cell region 1A with respect to a portion of these regions where the film portion BP1 is to be formed. On the other hand, the insulating film 5 is covered with the resist film RF3 in a portion of the boundary regions 1D and 1E where the film portion BP1 is to be formed and in a portion of the regions on the side of the memory cell region 1A with respect to the portion of these regions where the film portion BP1 is to be formed. In the high-voltage MISFET region 1B, the low-voltage MISFET region 1C, and the boundary region 1F, the insulating film 5 is exposed from the resist film, while the memory cell region 1A is covered with the resist film RF3.

In Step S10, as shown in FIG. 11, the insulating film 5 and the conductive film 4 are then patterned by etching, for example, dry etching, with the resist pattern RP3 as an etching mask.

As a result, in the boundary region 1D, a gate electrode GE1 including the conductive film 4 is formed and a gate insulating film GI1 including the insulating film 3 between the gate electrode GE1 and the element isolation film 2 is formed. In other words, in the boundary region 1D, a gate insulating film GI1 including the insulating film 3 on the element isolation film 2 is formed; a gate electrode GE1 including the conductive film 4 on the gate insulating film GI1 is formed; and a film portion BP1 including the gate insulating film GI1 and the gate electrode GE1 is formed. In addition, in the boundary region 1D, a cap insulating film CP1 including the insulating film 5 on the gate electrode GE1 is formed.

On the other hand, in the high-voltage MISFET region 1B and the low-voltage MISFET region 1C, the insulating film 5, the conductive film 4, and the insulating film 3 are removed. In addition, in the boundary region 1E, the insulating film 5, the conductive film 4, and the insulating film 3 are removed. Then, the resist pattern RP3, that is, the resist film RF3 is removed.

In Step S10, when the insulating film 5 and the conductive film 4 are etched while exposing a side surface 5s of the insulating film 5 and a side surface 4s of the conductive film 4 from the resist film RF3 included in the resist pattern RP3, the film portion BP1 is not formed but an unnecessary etching residue is likely to occur.

In First Embodiment, on the other hand, in Step S10, as shown in FIG. 10, the insulating film 5 and the conductive film 4 are etched while covering the side surface 5s of the insulating film 5 and the side surface 4s of the conductive film 4 with the resist film RF3 included in the resist pattern RP3. As described above, the film portion BP1 is formed by this etching, but an unnecessary etching residue is unlikely to occur when the insulating film 5 and the conductive film 4 are etched.

Figure 12:
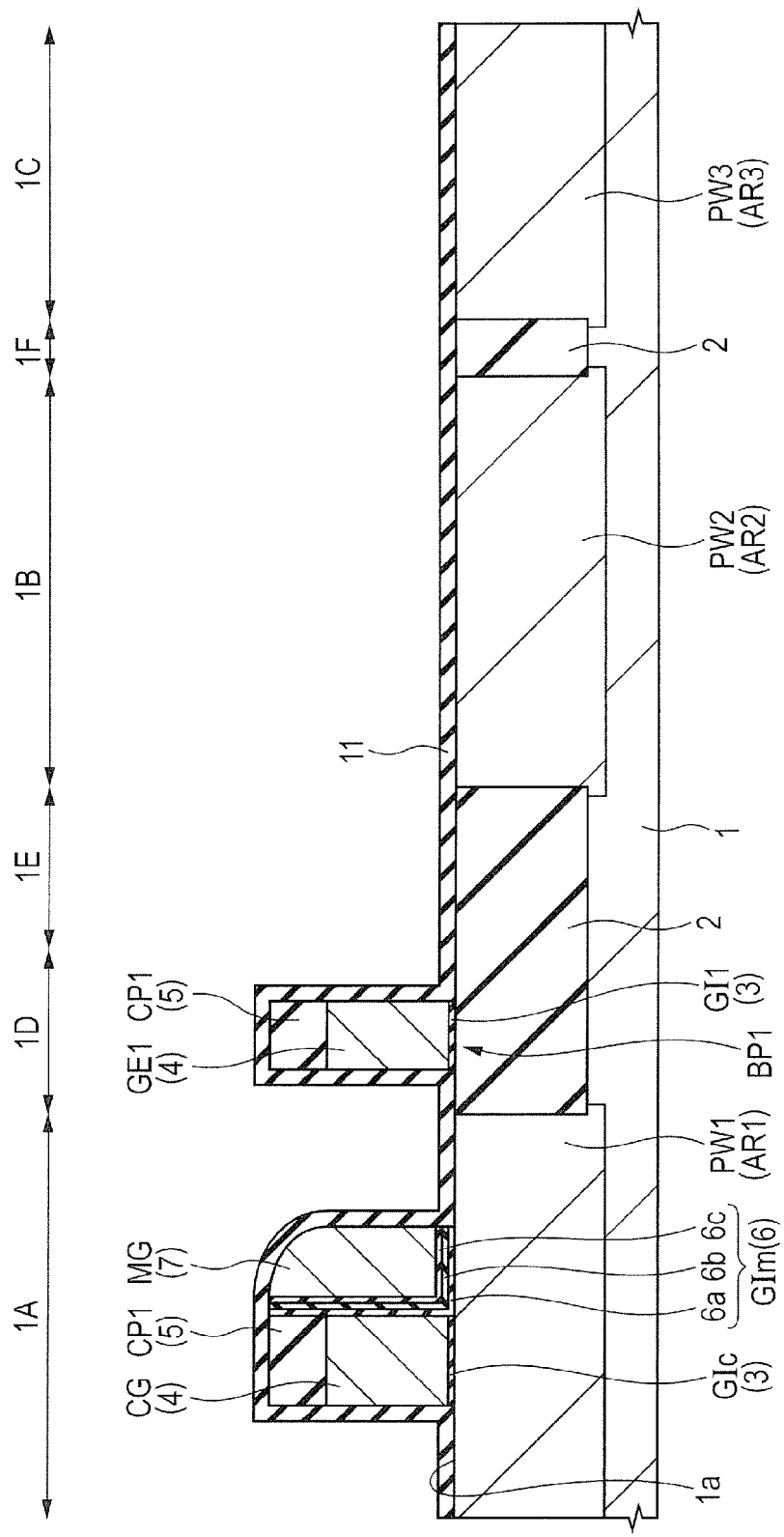
FIG. 12 is a fragmentary cross-sectional view of the semiconductor device of First Embodiment during a manufacturing step thereof.
Figure 13:
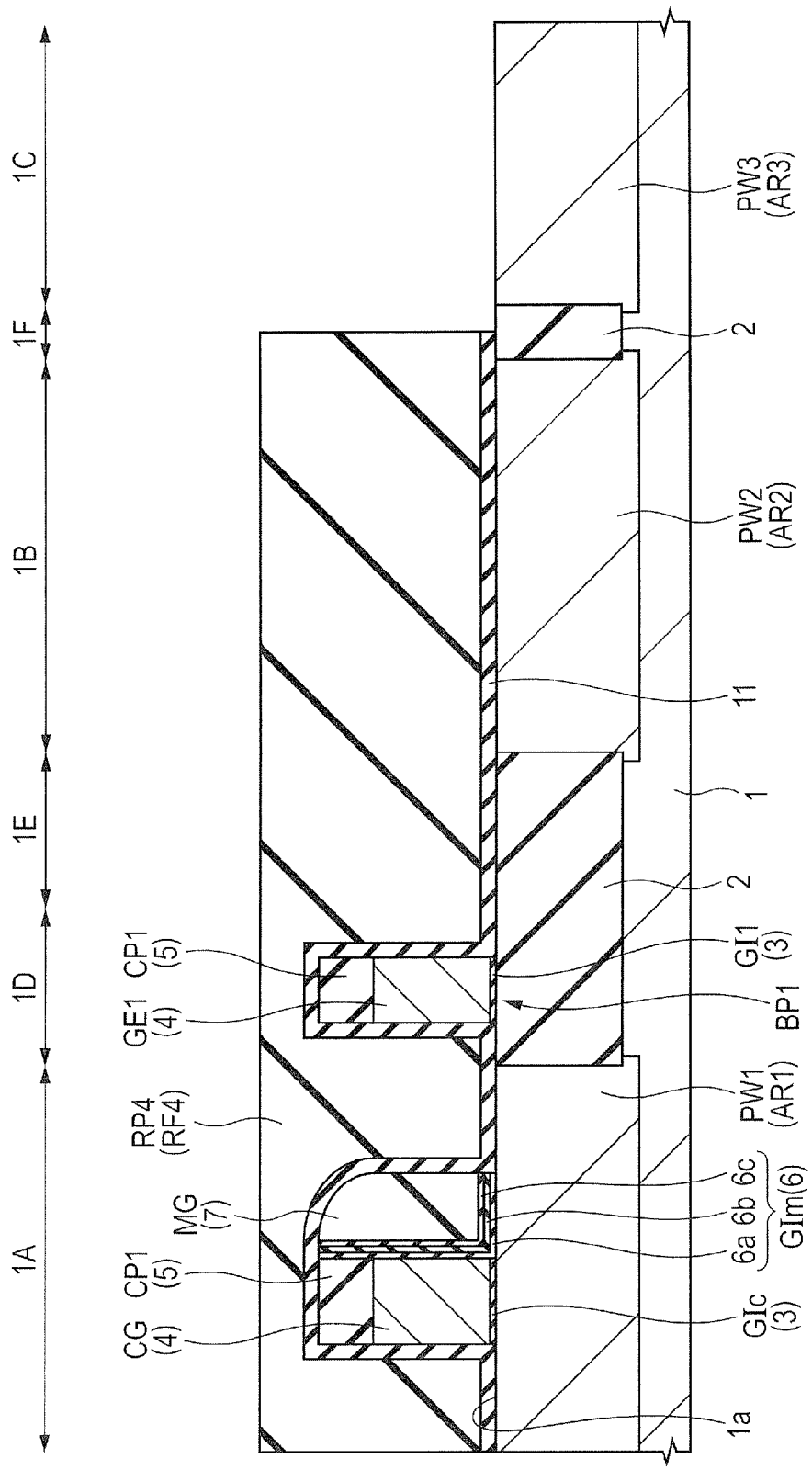
FIG. 13 is a fragmentary cross-sectional view of the semiconductor device of First Embodiment during a manufacturing step thereof.
Figure 14:
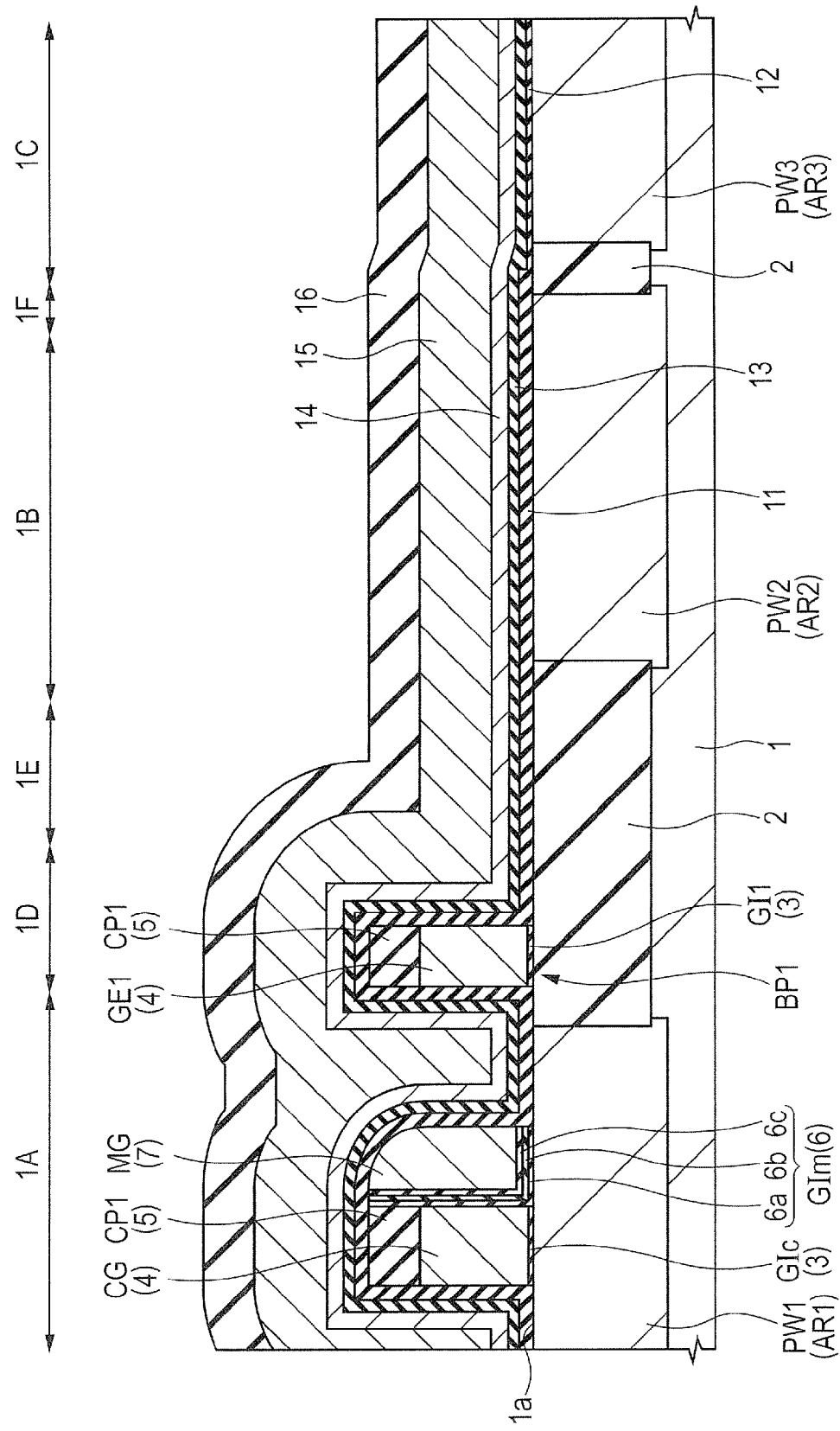
FIG. 14 is a fragmentary cross-sectional view of the semiconductor device of First Embodiment during a manufacturing step thereof.

Next, as shown in FIGS. 12 to 14, the insulating films 11 and 12 are formed (Step S11 in FIG. 3).

In Step S11, as shown in FIG. 12, an insulating film 11 is formed on the main surface 1a of the semiconductor substrate 1 in the memory cell region 1A, the high voltage MISFET region 1B, and the low-voltage MISFET region 1C. The insulating film 11 is also formed on the main surface 1a of the semiconductor substrate 1, that is, on the element isolation film 2 in the boundary regions 1D, 1E, and 1F. The insulating film 11 is an insulating film for gate insulating film GIH (refer to FIG. 18 described later) included in a high-voltage MISFET 10H (refer to FIG. 27 described later). The thickness of the insulating film 11 can be set, for example, at about 15 nm.

The insulating film 11 is formed on the p well PW1 in the memory cell region 1A, on the p well PW2 in the high voltage MISFET region 1B, and on the p well PW3 in the low-voltage MISFET region 1C. The insulating film 11 is formed on the element isolation film 2 in the boundary regions 1D and 1E so as to cover the film portion BP1. It is formed on the element isolation film 2 in the boundary region 1F.

The insulating film 11 has a dielectric constant not higher than that of silicon nitride. As the insulating film 11, a low-dielectric-constant film such as silicon oxide film, silicon nitride film, or silicon oxynitride film can be used. The insulating film 11 can be formed using thermal oxidation, sputtering, ALD, or CVD. When the insulating film 11 is formed, for example, by CVD, the insulating film 11 is formed, as shown in FIG. 12, also on the surface of the control gate electrode CG, the cap insulating film CP1, and the memory gate electrode MG.

The thickness of the insulating film 11, which is an insulating film for gate insulating film GIH (refer to FIG. 18 described later) included in a high-voltage MISFET 10H (refer to FIG. 27 described later) is greater than that of an insulating film 12, which is an insulating film for gate insulating film GIL (refer to FIG. 18 described later) included in a low-voltage MISFET 10L (refer to FIG. 31 described later).

When the insulating film 11 is formed only by thermal oxidation, for example, the lower surface of the memory gate electrode MG or the semiconductor substrate 1 below the memory gate electrode MG, that is, the upper surface of the p well PW1 is oxidized. The silicon oxide film between the memory gate electrode MG and the semiconductor substrate 1 becomes thicker on the side of the memory gate electrode MG opposite to the control gate electrode CG. There is a possibility of a so-called bird's beak being formed between the memory gate electrode MG and the semiconductor substrate 1. In order to prevent or suppress formation of this bird's beak, it is preferred to form the insulating film 11 as a stacked film of a silicon oxide film formed by thermal oxidation and a silicon oxide film formed by CVD and decrease the thickness of the silicon oxide film formed by thermal oxidation.

In Step S11, next, as shown in FIG. 13, a resist pattern RF4 is formed on the insulating film 11 by using photolithography so that the insulating film 11 is covered with a resist film RF4 in the memory cell region 1A and the high-voltage MISFET region 1B and the insulating film 11 is exposed from the resist film RF4 in the low-voltage MISFET region 1C.

By dry etching with the resulting resist pattern RP4 as an etching mask, a portion of the insulating film 11 formed in the low-voltage MISFET region 1C is removed. At this time, the p well PW3 is exposed in the low-voltage MISFET region 1C. On the other hand, a portion of the insulating film 11 formed in the memory cell region 1A and the high-voltage MISFET region 1B is covered with the resist pattern RP4 so that it remains without being etched. A portion of the insulating film 11 formed in the boundary regions 1D and 1E remain without being etched. Then, the resist pattern RP4, that is, the resist film RF4 is removed.

In Step S11, next, as shown in FIG. 14, an insulating film 12 is formed on the main surface 1a of the semiconductor substrate 1C in the low-voltage MISFET region 1C. The insulating film 12 is an insulating film for gate insulating film GIL (refer to FIG. 18 described later) included in a low-voltage MISFET 10L (refer to FIG. 31 described later). The insulating film 12 has a film thickness less than that of the insulating film 11. The insulating film 12 is formed on the p well PW3 in the low-voltage MISFET region 1C.

The insulating film 12 has a dielectric constant not higher than that of silicon nitride and as the insulating film 12, a low-dielectric-constant film such as silicon oxide film, silicon nitride film, or silicon oxynitride film can be used. The insulating film 12 can be formed using thermal oxidation, sputtering, ALD, or CVD. When the thickness of the insulating film 11 is set, for example, at about 15 nm, the thickness of the insulating film 12 can be set, for example, at from about 1 to 2 nm.

As described above, a MISFET 10H (refer to FIG. 27 described later) to be formed in the high-voltage MISFET region 1B is a high-voltage MISFET, while a MISFET 10L (refer to FIG. 31 described later) to be formed in the low-voltage MISFET region 1C is a low-voltage MISFET. The insulating film 12 for gate insulating film GIL (refer to FIG. 18 described later) has a thickness greater than that of the insulating film 11 for gate insulating film GIH (refer to FIG. 18 described later).

Next, as shown in FIG. 14, an insulating film 13 is formed (Step S12 in FIG. 4). In Step S12, an insulating film 13 is formed on the insulating film 11 and on the insulating film 12 in the memory cell region 1A, the high-voltage MISFET region 1B, and the low-voltage MISFET region 1C. The insulating film 13 is formed on the insulating film 11 and the insulating film 12 also in the boundary regions 1D, 1E, and 1F.

The insulating film 13 has a dielectric constant higher than that of silicon nitride. As the insulating film 13, a high-k film, that is, a high-dielectric-constant film can be used. Examples of materials usable for the insulating film 13 are as described above. The thickness of the insulating film 13 can be set, for example, at from 1 to 3 nm. The insulating film 13 can be formed using sputtering, ALD, or CVD.

Next, as shown in FIG. 14, a metal film 14, a conductive film 15, and an insulating film 16 are formed on the entire surface of the main surface 1a of the semiconductor substrate 1 (Step S13 in FIG. 4).

In Step S13, first, a metal film 14 is formed on the insulating film 13 in the memory cell region 1A, the high-voltage MISFET region 1B, and the low-voltage MISFET region 1C. The metal film 14 is formed on the insulating film 14 also in the boundary regions 1D, 1E, and 1F. The thickness of the metal film 14 can be set, for example, at from 2 to 3 nm.

As the metal film 14, usable is a metal film containing a metal nitride such as titanium nitride (TiN), tantalum nitride (TaN), or tungsten nitride (WN), a metal carbide such as titanium carbide (TiC), tantalum carbide (TaC), or tungsten carbide (WC), tantalum carbonitride (TaCN), or tungsten (W). From the standpoint of enhancing electroconductivity, a titanium nitride film can be preferably used as the metal film 14. The metal film 14 can be formed, for example, by PVD such as sputtering. The metal film 14 may be formed by CVD, though depending on the kind of a material used therefor.

In Step S13, next, a conductive film 15 is formed on the metal film 14 in the memory cell region 1A, the high-voltage MISFET region 1B, and the low-voltage MISFET region 1C. The conductive film 15 is formed on the metal film 14 also in the boundary regions 1D, 1E, and 1F. The conductive film 15 is a conductive film for gate electrode GEH (refer to FIG. 18 described later) included in a high-voltage MISFET 10H (refer to FIG. 27 described later). The thickness of the conductive film 15 can be set, for example, at from about 50 to 10 nm.

The conductive film 15 is preferably a silicon-containing conductive film and is a polysilicon film containing polycrystalline silicon. Such a conductive film 15 can be formed using CVD or the like. The conductive film 15 can also be obtained by forming an amorphous film and then subjecting it to thermal treatment to convert the resulting amorphous silicon film into a polycrystalline silicon film.

Although not illustrated, the conductive film 15 in the high-voltage MISFET region 1B is preferably a film doped with an n type impurity such as phosphorus (P) or arsenic (As) and thereby having a reduced resistivity. The impurity can be doped during or after formation of the conductive film 15. The impurity-doped conductive film 15 can be formed by forming a silicon film, forming a resist pattern having an opening therein, and doping an impurity into the opening portion by ion implantation or the like.

In Step S13, next, an insulating film 16 is formed on the conductive film 15 in the memory cell region 1A, the high-voltage MISFET region 1B, and the low-voltage MISFET region 1C. The insulating film 16 is formed on the conductive film 15 also in the boundary regions 1D, 1E, and 1F. The insulating film 16 is an insulating film for the formation of a cap insulating film CP2 (refer to FIG. 18 described later). The thickness of the insulating film 16 can be set, for example, at from about 20 to 50 nm. The insulating film 16 made of, for example, a silicon nitride film can be formed, for example, by CVD.

Although not illustrated, an insulating film made of a silicon oxide film can also be formed between the conductive film 15 and the insulating film 16.

Next, as shown in FIGS. 15 to 18, the insulating film 16, the conductive film 15, the metal film 14, and the insulating film 13 are patterned (Step S14 in FIG. 4). In Step S14, the insulating film 16, the conductive film 15, the metal film 14, and the insulating film 13 are patterned using, for example, photolithography and etching. When the insulating film 16, the conductive film 15, the metal film 14, and the insulating film 13 are patterned in Step S14, a film portion BP2 is formed in the boundary region 1E.

Figure 15:
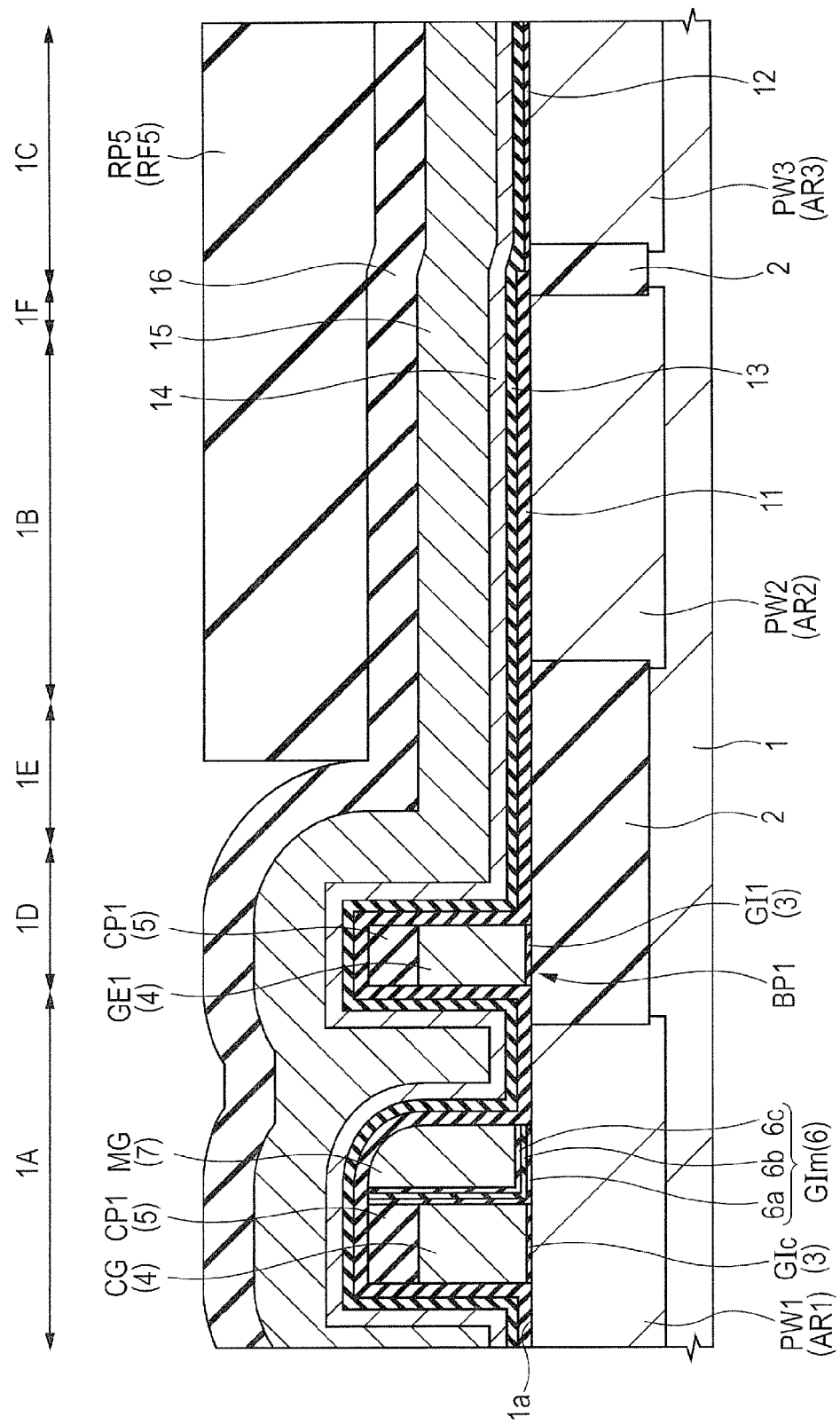
FIG. 15 is a fragmentary cross-sectional view of the semiconductor device of First Embodiment during a manufacturing step thereof.

In Step S14, first, as shown in FIG. 15, a resist film RF5 is formed on the insulating film 16. Then, an opening portion penetrating the resist film RF5 and reaching the insulating film 16 is formed and a resist pattern RP5 including the resist film RF5 having therein the opening portion is formed.

At this time, the insulating film 16 is exposed from the resist film RF5 in the memory cell region 1A, the boundary region 1D, and a portion of the boundary region 1E on the side of the memory cell region 1A with respect to a portion of this region where a film portion BP2 (refer to FIG. 18 described later) is to be formed. The insulating film 16 is, on the other hand, covered with the resist film RF5 in the high-voltage MISFET region 1B, the low-voltage MISFET region 1C, the boundary region 1F, a portion of the boundary region 1E where the film portion BP2 is to be formed, and a portion of the boundary region 1E on the side opposite to the memory cell region 1A with respect to a portion of the region where the film portion BP2 is to be formed.

Figure 16:
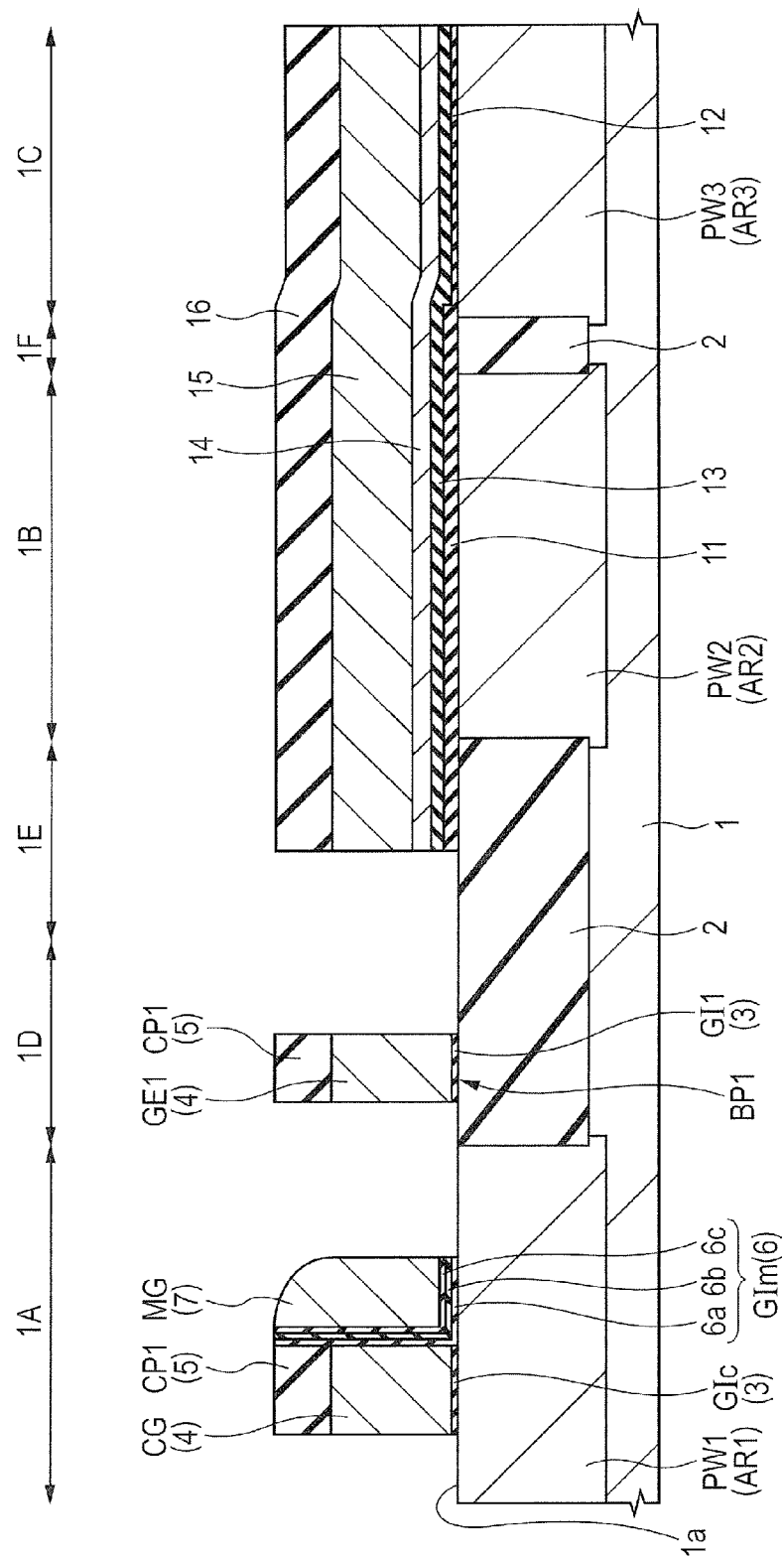
FIG. 16 is a fragmentary cross-sectional view of the semiconductor device of First Embodiment during a manufacturing step thereof.

In Step S14, next, as shown in FIG. 16, the insulating film 16, the conductive film 15, the metal film 14, and the insulating film 13 are patterned, for example, by etching such as dry etching, while using the resist pattern RP5 as an etching mask.

By this patterning, the insulating film 16, the conductive film 15, the metal film 14, and the insulating film 13 are removed from the memory cell region 1A, the boundary region 1D, and a portion of the boundary region 1E on the side of the memory cell region 1A with respect to a portion of this region where a film portion BP2 (refer to FIG. 18 described later) is to be formed. On the other hand, the insulating film 16, the conductive film 15, the metal film 14, and the insulating film 13 are left in the high-voltage MISFET region 1B, the low-voltage MISFET region 1C, the boundary region 1F, a portion of the boundary region 1E where the film portion BP2 is to be formed, and a portion of the boundary region 1E on the side opposite to the side of the memory cell region 1A with respect to the portion where the film portion BP2 is to be formed. Then, the resist pattern RP5, that is, the resist film RF5 is removed.

Figure 17:
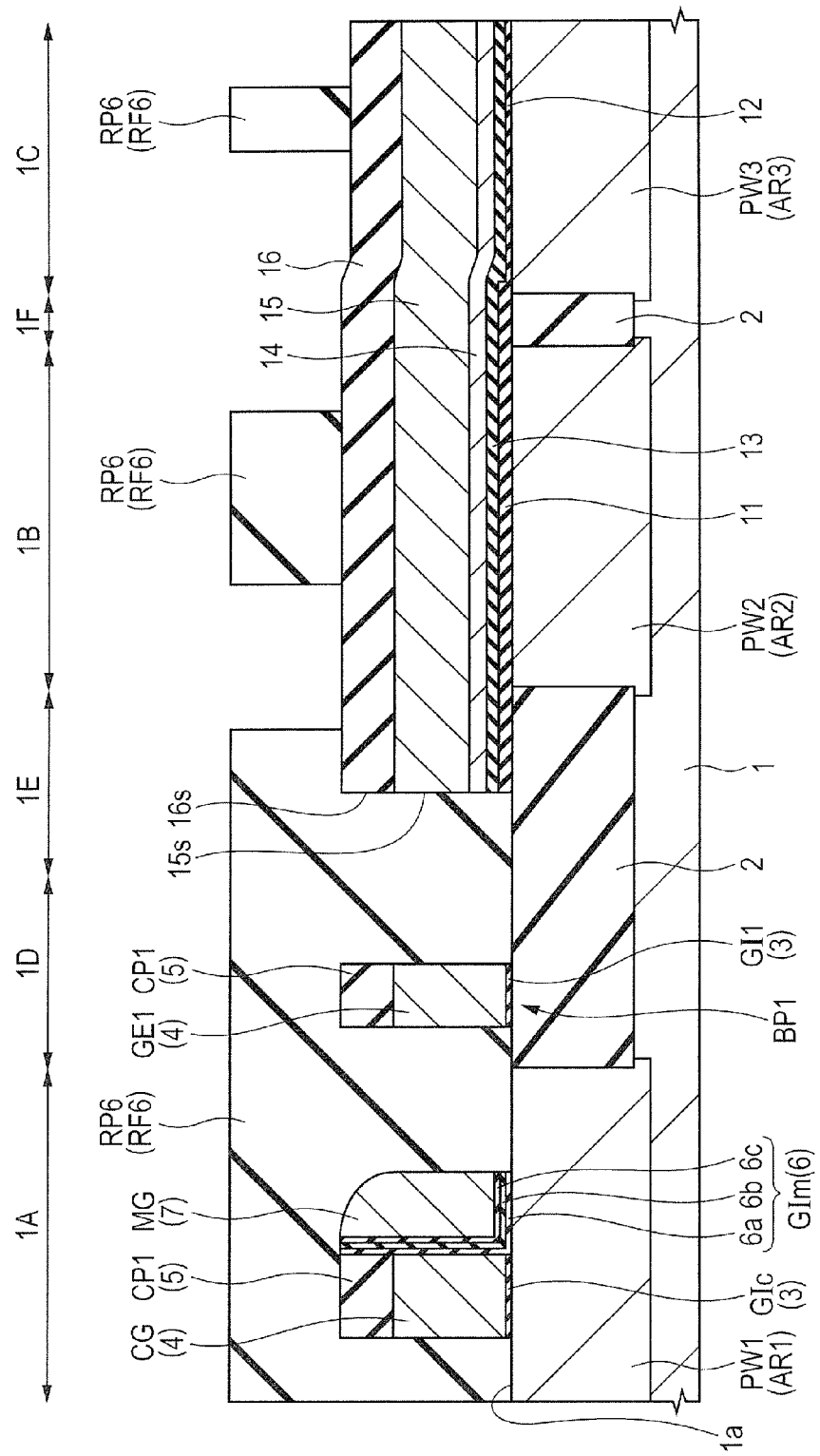
FIG. 17 is a fragmentary cross-sectional view of the semiconductor device of First Embodiment during a manufacturing step thereof.

In Step S14, next, as shown in FIG. 17, a resist film RF6 is formed on the main surface of the semiconductor substrate 1 and on the insulating film 16. Then, an opening portion penetrating the resist film RF6 and reaching the insulating film 16 is formed and a resist pattern RP6 including the resist film RF6 having therein the opening portion is formed.

At this time, a portion of the high-voltage MISFET region 1B except a portion thereof where a gate electrode GEH (refer to FIG. 18 described later) is to be formed and a portion of the low-voltage MISFET region 1C except a portion where a conductive film portion 15a (refer to FIG. 18 described later) is to be formed are exposed from the resist film RF6. In addition, a portion of the boundary region 1E except a portion where a film portion BP2 (refer to FIG. 18 described later) is to be formed is exposed from the resist film RF6. A portion of the high-voltage MISFET region 1B where the gate electrode GEH is to be formed, a portion of the low-voltage MISFET region 1C where a conductive film portion 15a is to be formed, and a portion of the boundary region 1E where the film portion BP2 is to be formed are covered with the resist film RF6. In the boundary region 1F, the insulating film 16 is exposed from the resist film and the memory cell region 1A and the boundary region 1D are covered with the resist film RF6.

Figure 18:
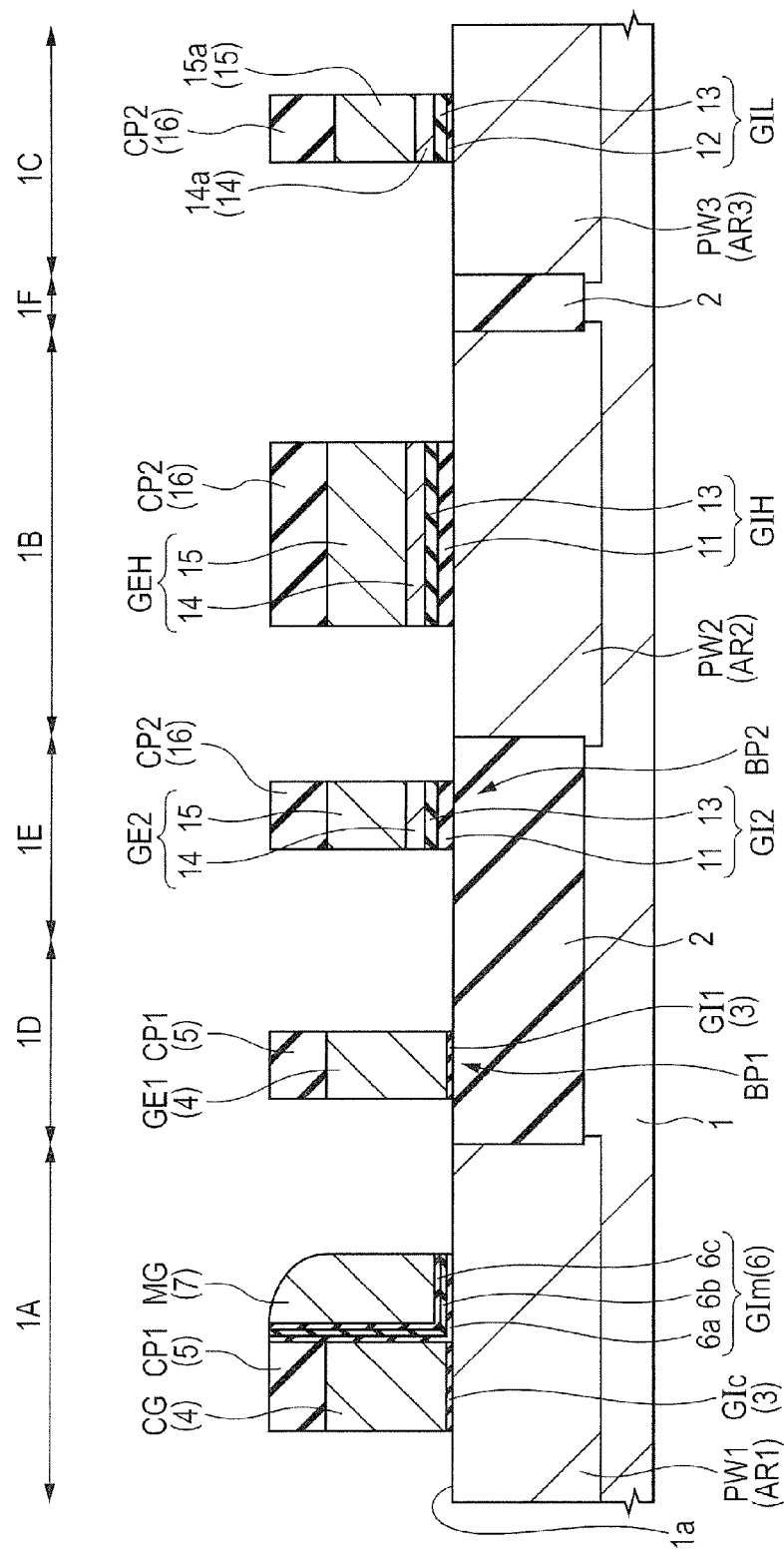
FIG. 18 is a fragmentary cross-sectional view of the semiconductor device of First Embodiment during a manufacturing step thereof.

In Step S14, next, as shown in FIG. 18, the insulating film 16, the conductive film 15, the metal film 14, and the insulating film 13 are patterned by etching, for example, dry etching while using the resist pattern RP6 as an etching mask.

As a result, in the high-voltage MISFET region 1B, the gate electrode GEH including the metal film 14 and the conductive film 15 is formed and the gate insulating film GIH including the insulating films 11 and 13 between the gate electrode GEH and the semiconductor substrate 1 is formed. This means that in the high-voltage MISFET region 1B, the gate insulating film GIH including the insulating films 11 and 13 on the semiconductor substrate 1 is formed and the gate electrode GEH including the metal film 14 and the conductive film 15 on the gate insulating film GIH is formed. In the high-voltage MISFET region 1B, a cap insulating film CP2 including the insulating film 16 on the gate electrode GEH is formed.

Since the metal film 14 made of, for example, a titanium nitride film is placed at a portion of the gate electrode GEH contiguous to the gate insulating film GIH, the gate electrode GEH can be allowed to function as a metal gate electrode. Compared with the case where a portion of the gate electrode GEH contiguous to the gate insulating film GIH is made of a silicon film, the portion of the gate electrode GEH contiguous to the gate insulating film GIH can be prevented from being depleted. As a result, a MISFET 10H (refer to FIG. 27 described later) can therefore have improved performance.

A conductive film 15 made of, for example, a silicon film is placed as a portion of the gate electrode GEH on the metal film 14. The gate electrode GEH is however a gate electrode included in a high-voltage MISFET 10H (refer to FIG. 27 described later) and the thickness of the gate insulating film GIH is greater than that of a gate insulating film GIL described later. Even when the conductive film 15 made of a silicon film is placed as a portion of the gate electrode GEH on the metal film 14, the MISFET 10H can therefore have improved performance.

In the low-voltage MISFET region 1C, a conductive film portion 15a including the conductive film 15 is formed; a metal film portion 14a including the metal film 14 between the conductive film portion 15a and the semiconductor substrate 1 is formed; and a gate insulating film GIL including the insulating films 12 and 13 between the metal film portion 14a and the semiconductor substrate 1 is formed. This means that in the low-voltage MISFET region 1C, a gate insulating film GIL including the insulating films 12 and 13 on the semiconductor substrate 1 is formed; a metal film portion 14a including the metal film 14 on the gate insulating film GIL is formed; and a conductive film portion 15a including the conductive film 15 on the metal film portion 14a is formed. In the low-voltage MISFET region 1C, a cap insulating film CP2 including the insulating film 16 on the conductive film portion 15a is formed.

In Step S21 FIG. 4, the conductive film portion 15a is removed as described later referring to FIG. 29. The gate electrode including the metal film portion 14a and the conductive film portion 15a is therefore a dummy gate electrode.

On the other hand, in the boundary region 1E, a gate electrode GE2 including the metal film 14 and the conductive film 15 is formed and a gate insulating film GI2 including the insulating films 11 and 13 between the gate electrode GE2 and the semiconductor substrate 1 is formed. This means that in the boundary region 1E, a gate insulating film GI2 including the insulating films 11 and 13 on the element isolation film 2 is formed; a gate electrode GE2 including the metal film 14 and the conductive film 15 on the gate insulating film GI2 is formed; and a film portion BP2 including the gate insulating film GI2 and the gate electrode GE2 is formed. In the boundary region 1E, a cap insulating film CP2 including the insulating film 16 on the gate electrode GE2 is formed. Then, the resist pattern RP6, that is, the resist film RF6 is removed.

When, in Step S14, the insulating film 16 and the conductive film 15 are etched while exposing a side surface 16s of the insulating film 16 and a side surface 15s of the conductive film 15 from the resist film RF6 included in the resist pattern RP6, the film portion BP2 is not formed but an unnecessary etching residue is likely to occur.

On the other hand, in First Embodiment, in Step S14, as shown in FIG. 17, the insulating film 16, the conductive film 15, the metal film 14, and the insulating film 13 are etched while covering the side surface 16s of the insulating film 16 and the side surface 15s of the conductive film 15 with the resist film RF6 included in the resist pattern RP6. As described above, a film portion BP2 is formed by this etching. An unnecessary etching residue is unlikely to occur during etching of the insulating film 16, the conductive film 15, the metal film 14, and the insulating film 13.

In the high-voltage MISFET region 1B, a portion of the insulating film 11 exposed from the gate electrode GEH can be removed by dry etching in Step S14 or wet etching after dry etching in Step S14. From a portion of the high-voltage MISFET region 1B having no gate electrode GEH therein, the p well PW2 of the semiconductor substrate 1 is exposed.

In the low-voltage MISFET region 1C, a portion of the insulating film 12 exposed from the metal film portion 14a and the conductive film portion 15a can be removed by dry etching in Step S14 or wet etching after dry etching in Step S14. From a portion of the low-voltage MISFET region 1C having neither metal film portion 14 nor the conductive film portion 15a therein, the p well PW3 of the semiconductor substrate 1 is exposed.

This means that in Step S14, the insulating film 11 and the insulating film 12 may be patterned.

Figure 19:
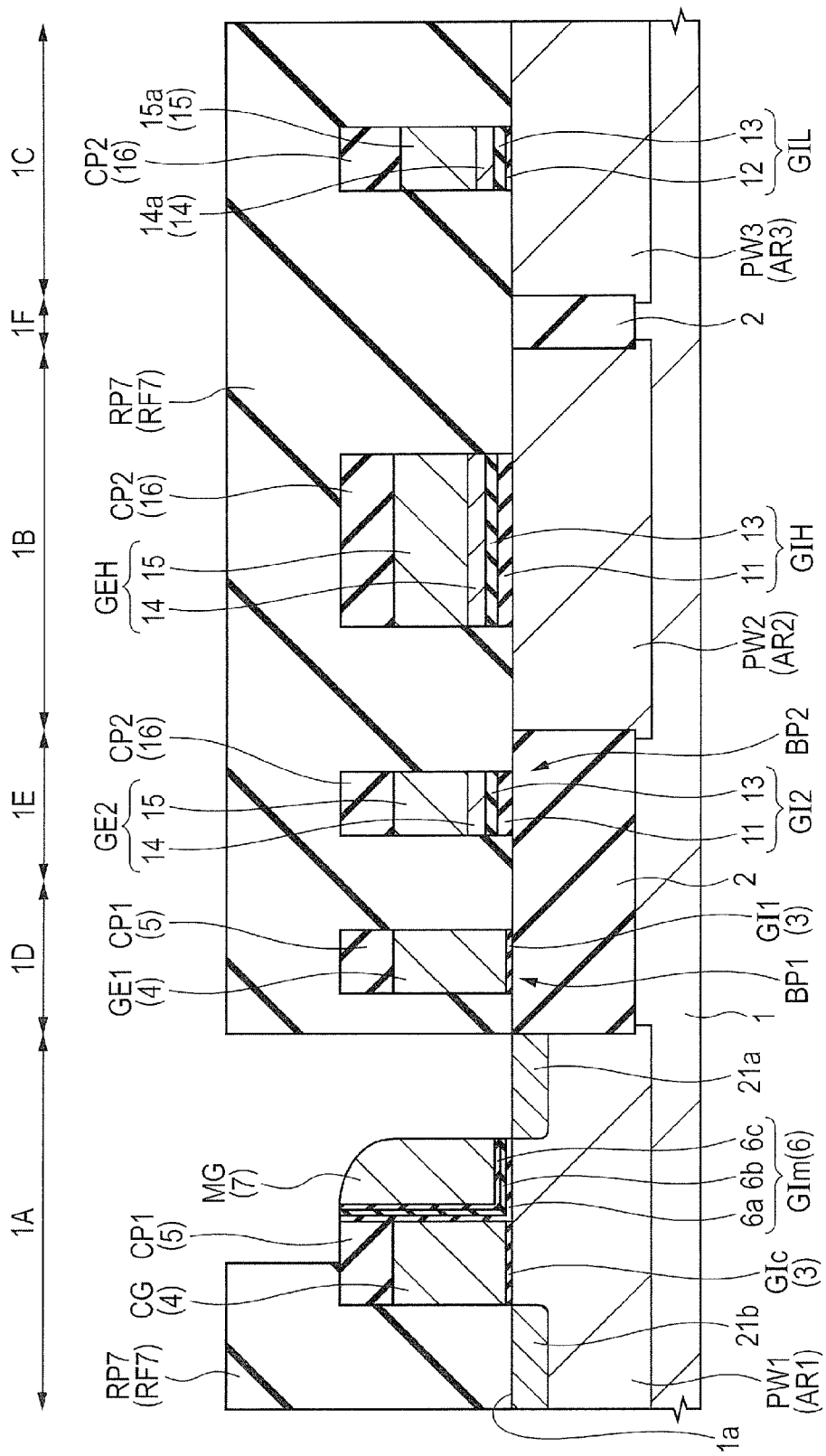
FIG. 19 is a fragmentary cross-sectional view of the semiconductor device of First Embodiment during a manufacturing step thereof.
Figure 20:
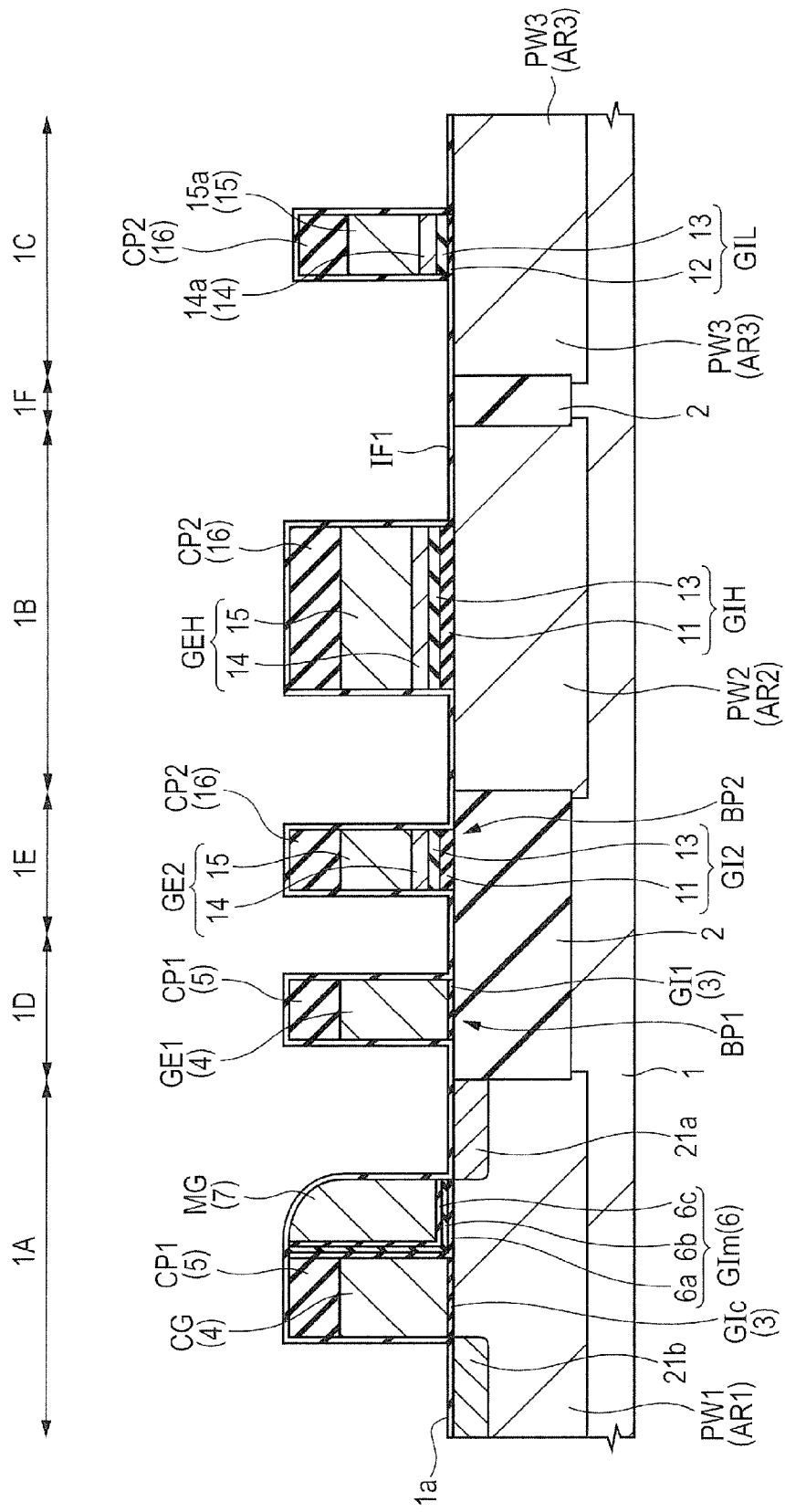
FIG. 20 is a fragmentary cross-sectional view of the semiconductor device of First Embodiment during a manufacturing step thereof.
Figure 21:
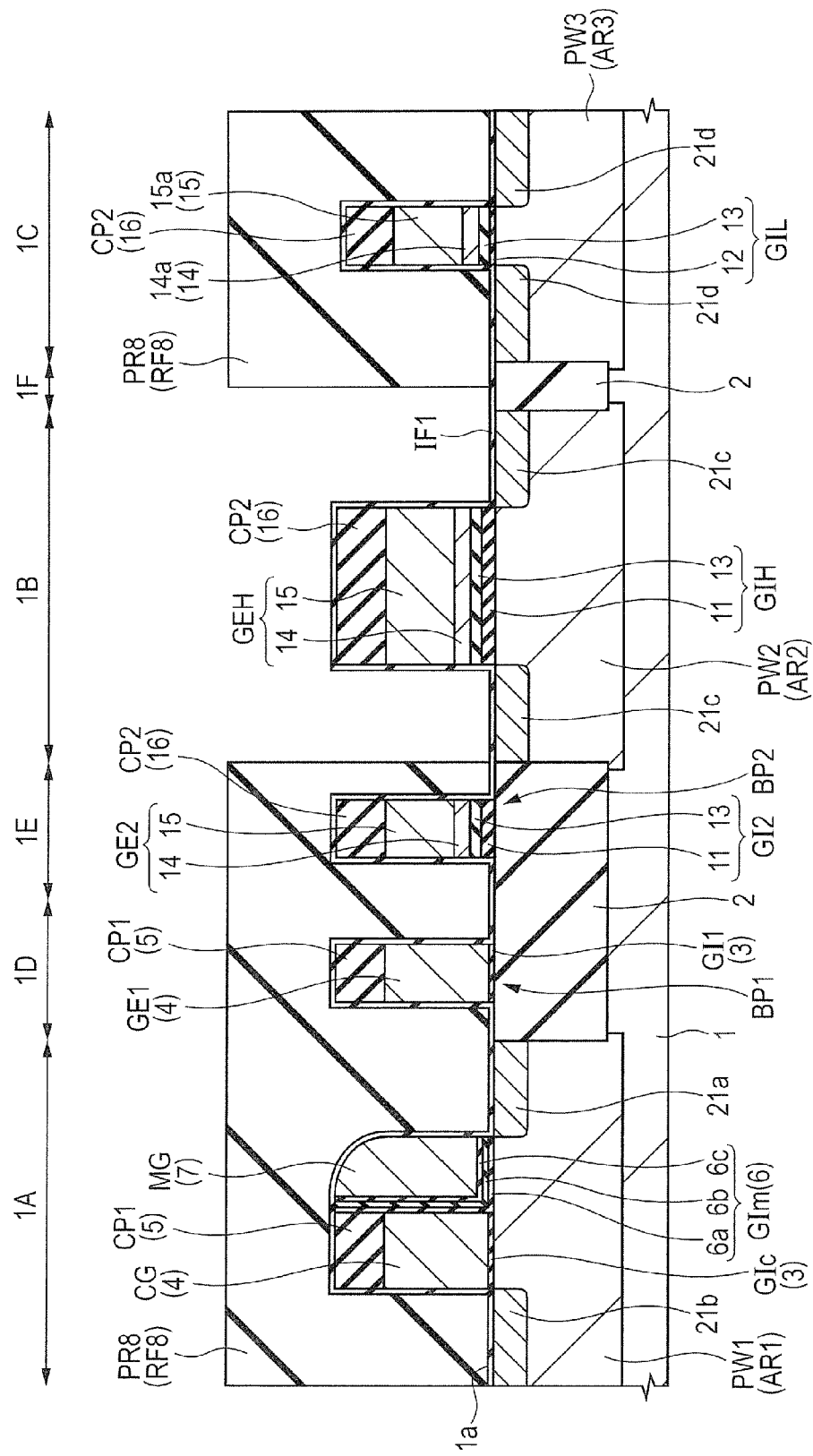
FIG. 21 is a fragmentary cross-sectional view of the semiconductor device of First Embodiment during a manufacturing step thereof.

Next, as shown in FIGS. 19 to 21, n⁻ type semiconductor regions 21a, 21b, 21c, and 21d are formed using photolithography and ion implantation (Step S15 in FIG. 4). In Step S15, an n type impurity, for example, arsenic (As) or phosphorus (P) is doped into the p wells PW1, PW2, and PW3 of the semiconductor substrate 1 with the control gate electrode CG, the memory gate electrode MG, the gate electrode GEH, and the gate electrode GEL as a mask. As a result, n⁻ type semiconductor regions 21a, 21b, 21c, and 21d are formed.

In Step S15, first, as shown in FIG. 19, n⁻ type semiconductor regions 21a and 21b are formed in the p well PW1 in the memory cell region 1A. In this step, in the memory cell region 1A, the n⁻ type semiconductor region 21a is formed in self alignment with the side surface of the memory gate electrode MG and in the memory cell region 1A, the n⁻ type semiconductor region 21b is formed in self alignment with the side surface of the control gate electrode CG.

Ion implantation conditions for forming the n⁻ type semiconductor region 21a may be differentiated from those for forming the n⁻ type semiconductor region 21b. FIG. 19 shows a step of forming, after formation of the n⁻ type semiconductor region 21b, forming the n⁻ type semiconductor region 21a by ion implantation while covering, with the resist pattern RP7 including the resist film RF7, a region other than a region where the n type semiconductor region 21a is to be formed.

Although not illustrated, a pocket region or a halo region that surrounds therewith each of the n⁻ type semiconductor regions 21a and 21b may be formed in the p well PW1 in the memory cell region 1A in order to prevent or suppress a short channel effect.

In Step S15, as shown in FIG. 20, an insulating film IF1 made of, for example, a silicon nitride film is formed on the entire surface of the main surface 1a of the semiconductor substrate 1. The thickness of the insulating film IF1 can be set, for example, at from about 5 to 10 nm. The insulating film IF1 can be formed, for example, by CVD. In Step S15, ion implantation into the p wells PW2 and PW3 is performed while covering the main surface 1a of the semiconductor substrate 1 with the insulating film IF1.

In Step S15, next, as shown in FIG. 21, n⁻ type semiconductor regions 21c and 21d are formed in the p wells PW2 and PW3 in the high-voltage MISFET region 1B and the low-voltage MISFET region 1C and the low-voltage MISFET region 1C. The n⁻ type semiconductor region 21c is formed in self alignment with the side surface of the gate electrode GEH in the high-voltage MISFET region B and the n⁻ type semiconductor region 21d is formed in self alignment with the side surface of the metal film portion 14a and the conductive film portion 15a in the low-voltage MISFET region 1C.

Ion implantation conditions for forming the n⁻ type semiconductor region 21c may be differentiated with those for forming the n⁻ type semiconductor region 21d in the low-voltage MISFET region 1C. FIG. 21 shows a step of forming, after formation of the n⁻ type semiconductor region 21d, the n⁻ type semiconductor region 21c by ion implantation while covering, with the resist pattern RP8 including the resist film RF8, a region other than a region where the n⁻ type semiconductor region 21c is formed.

Although not illustrated, a pocket region or halo region that surrounds therewith the n⁻ type semiconductor regions 21c may be formed in the p well PW2 in the high-voltage MISFET region 1B in order to prevent or suppress a short channel effect. Although not illustrated, a pocket region or halo region that surrounds the n⁻ type semiconductor region 21d may be formed in the p well PW3 in the low-voltage MISFET region 1C.

The n⁻ type semiconductor regions 21a, 21b, 21c, and 21d may be formed by the same ion implantation step.

Figure 22:
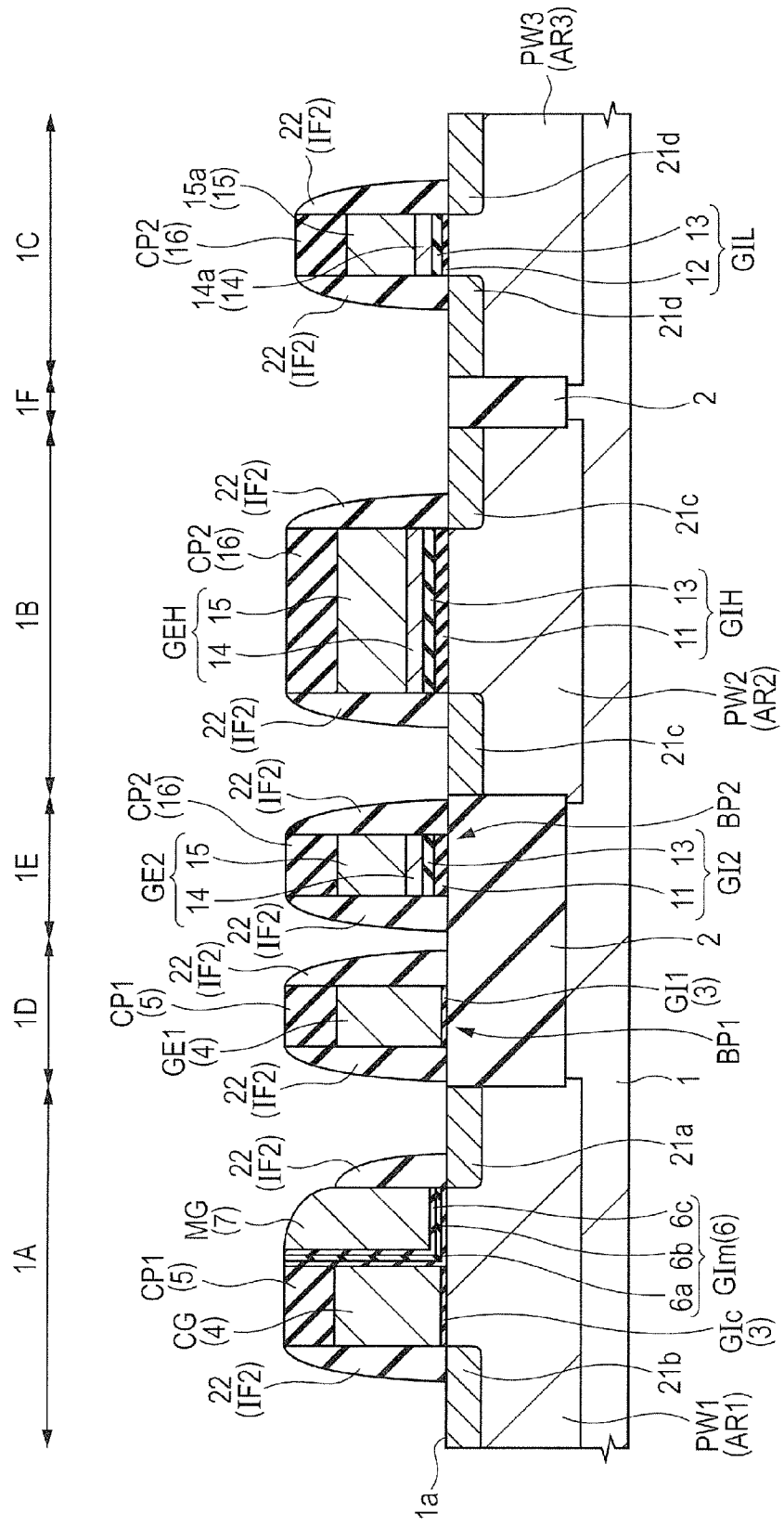
FIG. 22 is a fragmentary cross-sectional view of the semiconductor device of First Embodiment during a manufacturing step thereof.

Next, as shown in FIG. 22, a sidewall spacer 22 is formed on the side wall of the control gate electrode CG, the side wall of the memory gate electrode MG, the side wall of the gate electrode GEH, and the side wall of the gate electrode GEL (Step S16 in FIG. 4).

First, an insulating film IF2 for sidewall spacer 22 is formed on the entire surface of the main surface 1a of the semiconductor substrate 1 and the insulating film IF2 thus formed is etched back, for example, by anisotropic etching. In such a manner, the insulating film IF2 is selectively left on the side wall of the control gate electrode CG, the side wall of the memory gate electrode MG, the side wall of the gate electrode GEH, and the side wall of the gate electrode GEL in the memory cell region 1A, the high-voltage MISFET region 1B, and the low-voltage MISFET region 1C. Thus, the sidewall spacer 22 including the insulating film IF2 is formed. In addition, a sidewall spacer 22 including the insulating film IF2 is formed by selectively leaving the insulating film IF2 on the side wall of the gate electrode GE1 and the side wall of the gate electrode GE2 in the boundary regions 1D and 1E. The insulating film IF2 included in the sidewall spacer 22 is made of an insulating film, for example, a silicon nitride film.

The sidewall spacer 22 includes the insulating film IF1 (refer FIG. 20) but illustration of the insulating film IF1 is omitted from FIG. 22.

Figure 23:
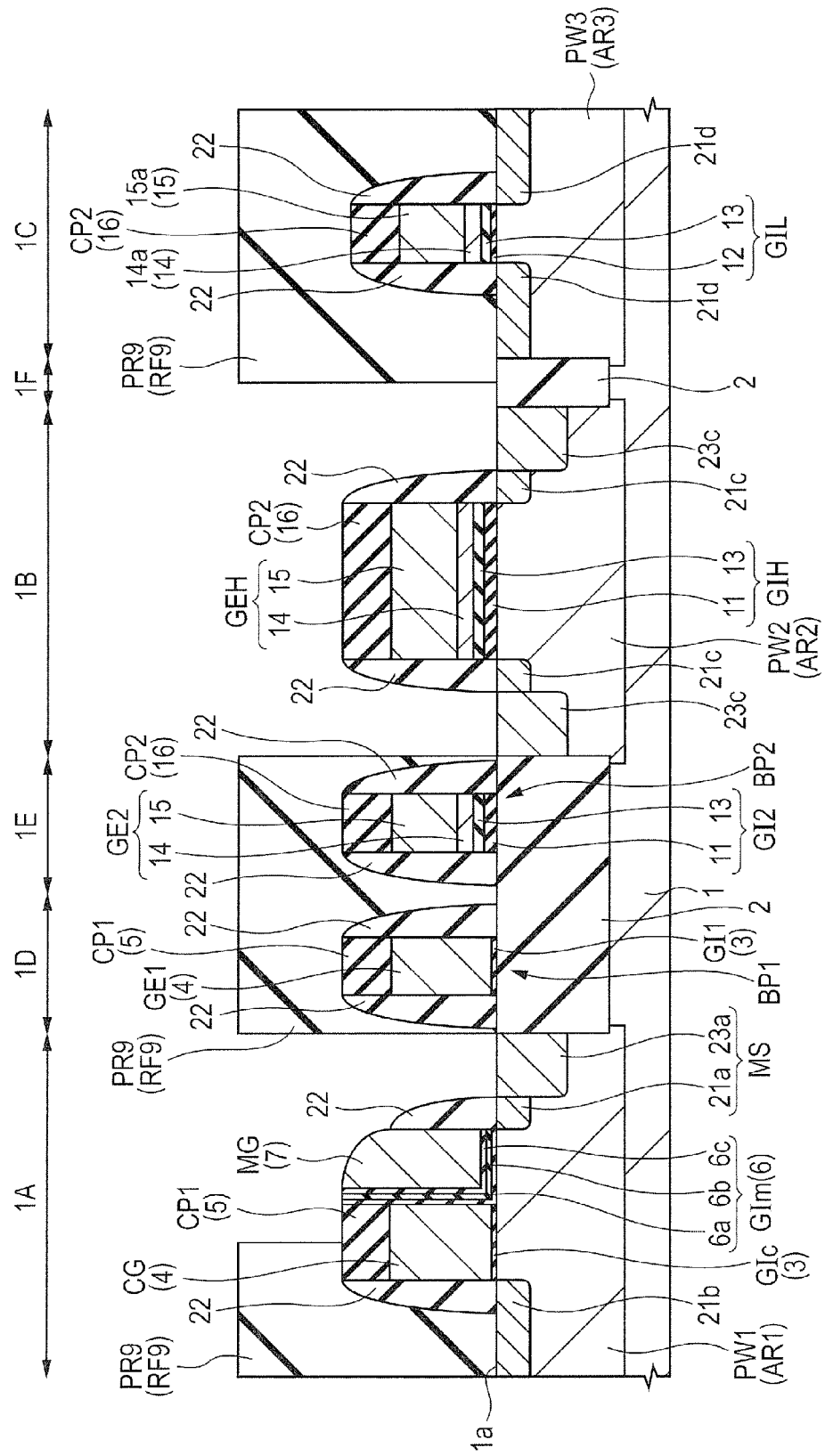
FIG. 23 is a fragmentary cross-sectional view of the semiconductor device of First Embodiment during a manufacturing step thereof.
Figure 24:
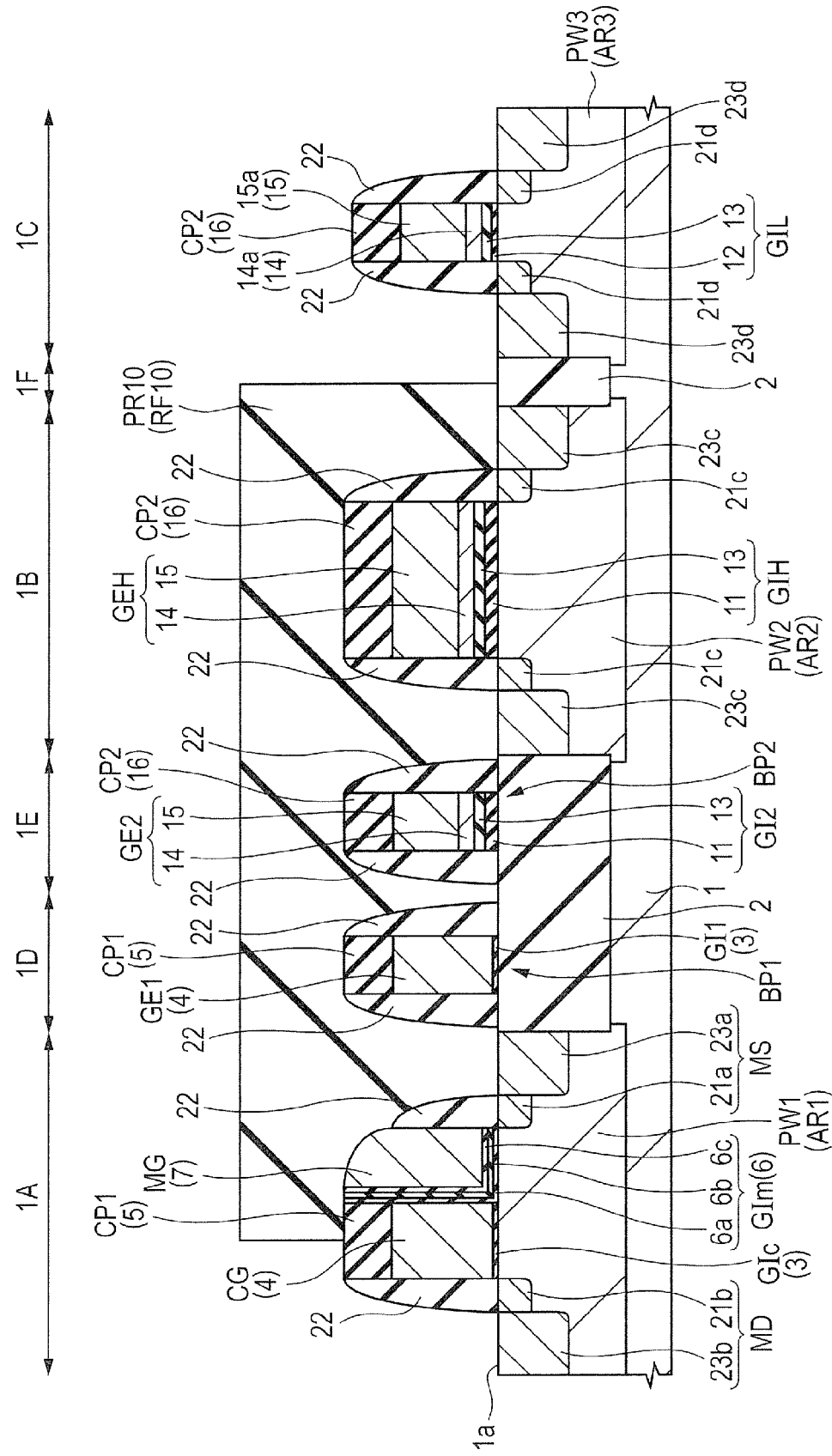
FIG. 24 is a fragmentary cross-sectional view of the semiconductor device of First Embodiment during a manufacturing step thereof.

Next, as shown in FIGS. 23 and 24, n⁺ type semiconductor regions 23a, 23b, 23c, and 23d are formed using ion implantation or the like (Step S17 in FIG. 4). In Step S17, an n type impurity, for example, arsenic (As) or phosphorus (P) is doped into the p wells PW1, PW2, and PW3 of the semiconductor substrate 1 while using the control gate electrode CG, the memory gate electrode MG, the gate electrode GEH, and the gate electrode GEL and the sidewall spacer 22 on the side wall thereof as a mask. Thus, the n⁺ type semiconductor regions 23a, 23b, 23c, and 23d are formed.

In Step S17, first, as shown in FIG. 23, n⁺ type semiconductor regions 23a and 23c are formed in the p wells PW1 and PW2 in the memory cell region 1A and the high voltage MISFET region 1B. The n⁺ type semiconductor region 23a is formed in self alignment with the sidewall spacer 22 on the side wall of the memory gate electrode MG in the memory cell region 1A, while the n⁺ type semiconductor region 23c is formed in self alignment with the sidewall spacer 22 on the side wall of the gate electrode GEH in the high-voltage MISFET region 1B. As a result, an LDD structure including the n⁻ type semiconductor region 21a and the n⁺ type semiconductor region 23a is formed in the memory cell region 1A, while an LDD structure including the n⁻ type semiconductor region 21c and the n⁺ type semiconductor region 23c is formed in the high-voltage MISFET region 1B.

Ion implantation conditions for forming these n⁺ type semiconductor regions 23a and 23c may be differentiated from ion implantation conditions for forming the n⁺ type semiconductor regions 23b and 23d. FIG. 23 shows a step of forming, before formation of the n⁺ type semiconductor regions 23b and 23d, the n⁺ type semiconductor regions 23a and 23c by ion implantation while covering, with the resist pattern RP9 including the resist film RF9, a region other than a region where the n⁺ type semiconductor region 23a and 23c are formed.

In Step S17, next, as shown in FIG. 24, n⁺ type semiconductor regions 23b and 23d are formed in the p wells PW1 and PW3 in the memory cell region 1A and the low-voltage MISFET region 1C. The n⁺ type semiconductor region 23b is formed in self alignment with the sidewall spacer 22 on the side wall of the control gate electrode CG in the memory cell region 1A and the n⁺ type semiconductor region 23d is formed in self alignment with the sidewall spacer 22 on the side wall of the metal film portion 14a and the conductive film portion 15a in the low-voltage MISFET region 1C. As a result, an LDD structure including the n⁻ type semiconductor region 21b and the n⁺ type semiconductor region 23b is formed in the memory cell region 1A, while an LDD structure including the n type semiconductor region 21d and the n⁺ type semiconductor region 23d is formed in the low-voltage MISFET region 1C.

FIG. 24 shows a step of forming the n⁺ type semiconductor regions 23b and 23d by ion implantation while covering, with the resist pattern RP10 including the resist film RF10, a region other than a region where the n⁺ type semiconductor regions 23b and 23d are formed.

In general, implantation energy in ion implantation for forming the n⁺ type semiconductor region 23d is lower than that in ion implantation for forming the n⁺ type semiconductor region 23c. In examples shown in FIGS. 23 and 24, therefore, the n⁺ type semiconductor region 23d is formed by an ion implantation step different from that for forming the n⁺ type semiconductor region 23c. The n⁺ type semiconductor regions 23a, 23b, 23c, and 23d can however be formed by the same ion implantation step.

Thus, an n type semiconductor region MS functioning as a source region of a memory transistor MT (refer to FIG. 27 described later) is formed from the n⁻ type semiconductor region 21a and the n⁻ type semiconductor region 23a which is more heavily doped. In addition, an n⁻ type semiconductor region MD functioning as a drain region of a control transistor CT (refer to FIG. 27 described later) is formed from the n⁻ type semiconductor region 21b and the n⁺ type semiconductor region 23b which is more heavily doped. The semiconductor region MS is formed in an upper layer portion of the p well PW1 located, in plan view, on the side opposite to the control gate electrode CT with the memory gate electrode MG therebetween. The semiconductor region MD is formed in an upper layer portion of the p well PW1 located, in plan view, on the side opposite to the memory gate electrode MG with the control gate electrode CG therebetween.

Then, activation annealing is performed as heat treatment for activating an impurity doped into the n⁻ type semiconductor regions 21a, 21b, 21c, and 21d, and the n⁺ type semiconductor regions 23a, 23b, 23c, and 23d.

Figure 25:
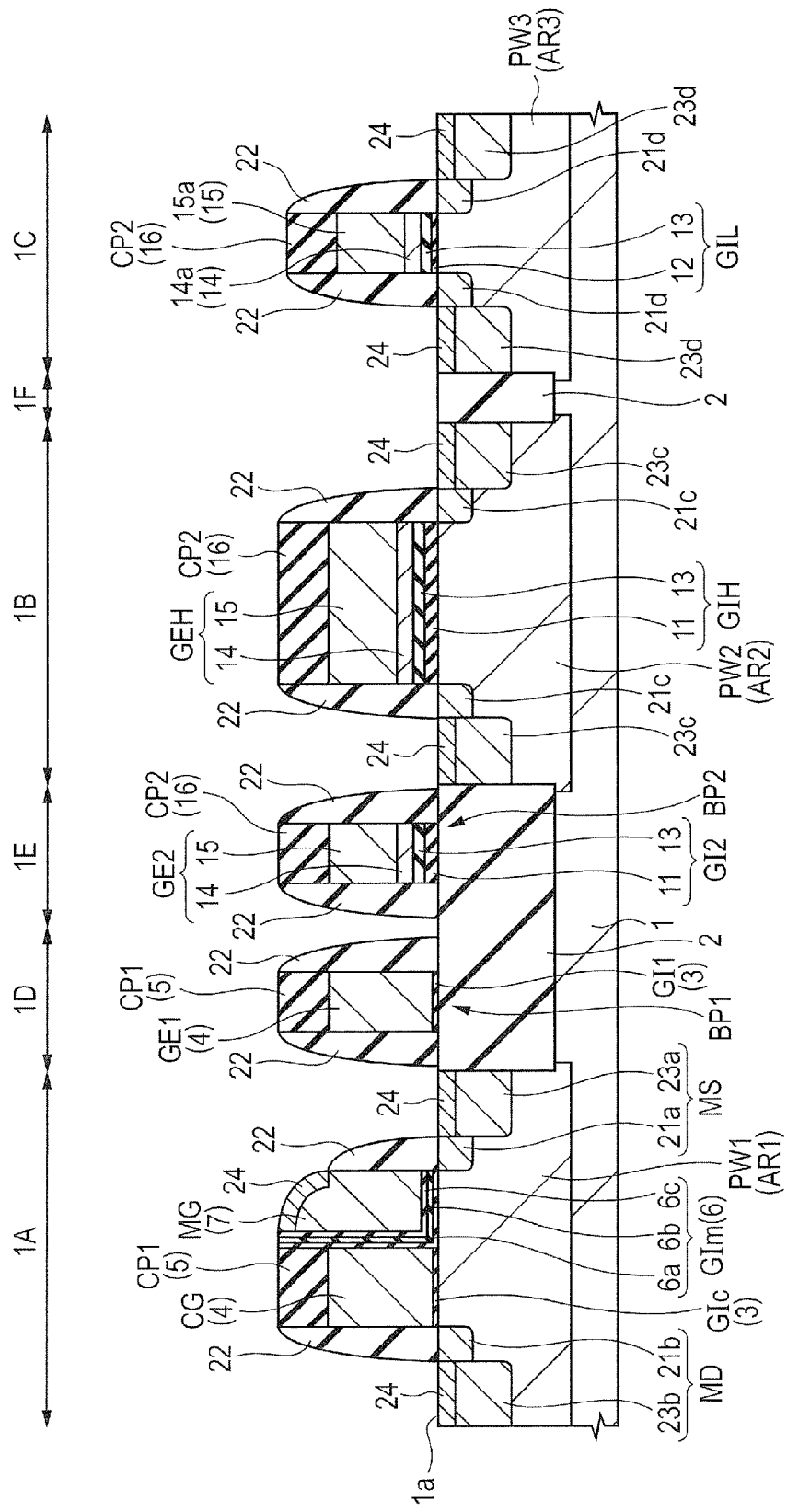
FIG. 25 is a fragmentary cross-sectional view of the semiconductor device of First Embodiment during a manufacturing step thereof.

Next, as shown in FIG. 25, a metal silicide layer 24 is formed (Step S18 in FIG. 4). In Step S18, a metal film is formed on the entire surface of the main surface 1a of the semiconductor substrate 1 so as to cover the control gate electrode CG, the memory gate electrode MG, the gate electrode GEH, the metal film portion 14a, the conductive film portion 15a, the gate electrodes GE1 and GE2, the cap insulating film CP1, and the sidewall spacer 22. The metal film is made of, for example, a cobalt (Co) film, a nickel (Ni) film, or a nickel platinum alloy film and it can be formed by sputtering or the like. Then, the semiconductor substrate 1 is subjected to heat treatment to react the respective upper portions of the n⁺ type semiconductor regions 23a, 23b, 23c, and 23d with the metal film. As a result, a metal silicide layer 24 is formed on each of the n⁺ type semiconductor regions 23a, 23b, 23c, and 23d.

The metal silicide layer 24 may be, for example, a cobalt silicide layer, a nickel silicide layer, or a platinum-added nickel silicide layer. An unreacted portion of the metal film is then removed. By performing such a so-called salicide process, the metal silicide layer 24 can be formed on each of the n⁺ type semiconductor regions 23a, 23b, 23c, and 23d. This metal silicide layer 24 is also formed on the memory gate electrode MG.

Figure 26:
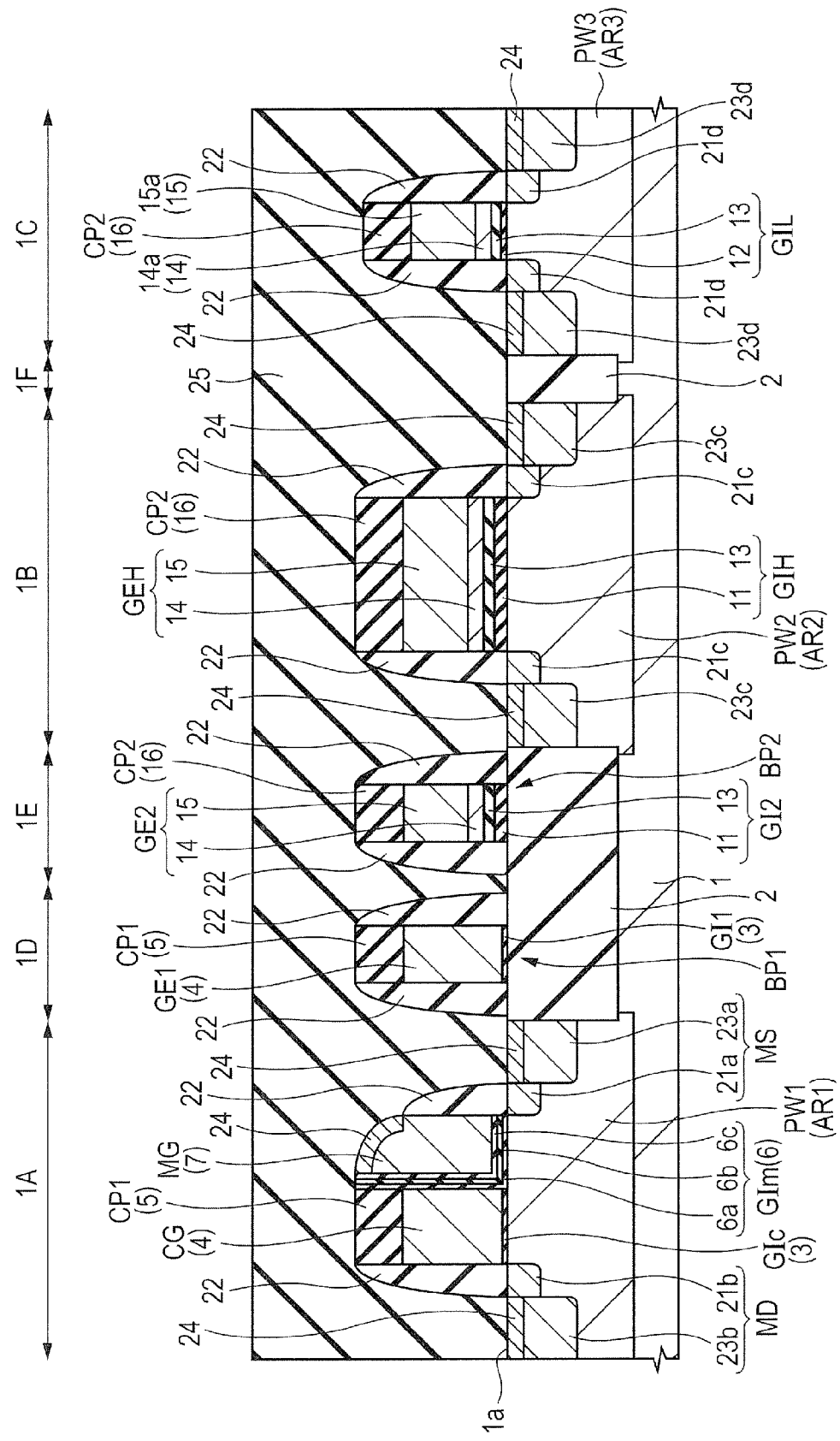
FIG. 26 is a fragmentary cross-sectional view of the semiconductor device of First Embodiment during a manufacturing step thereof.

Next, as shown in FIG. 26, an insulating film 25 is formed (Step S19 in FIG. 4). In Step S19, the insulating film 25 is formed on the entire surface of the main surface 1a of the semiconductor substrate 1, that is, on the semiconductor substrate 1 so as to cover the control gate electrode CG, the memory gate electrode MG, the gate electrode GEH, the metal film portion 14a, the conductive film portion 15a, the gate electrodes GE1 and GE2, the cap insulating film CP1, and the sidewall space 22. The insulating film 25 is made of, for example, a silicon nitride film and can be formed, for example, by CVD.

Figure 27:
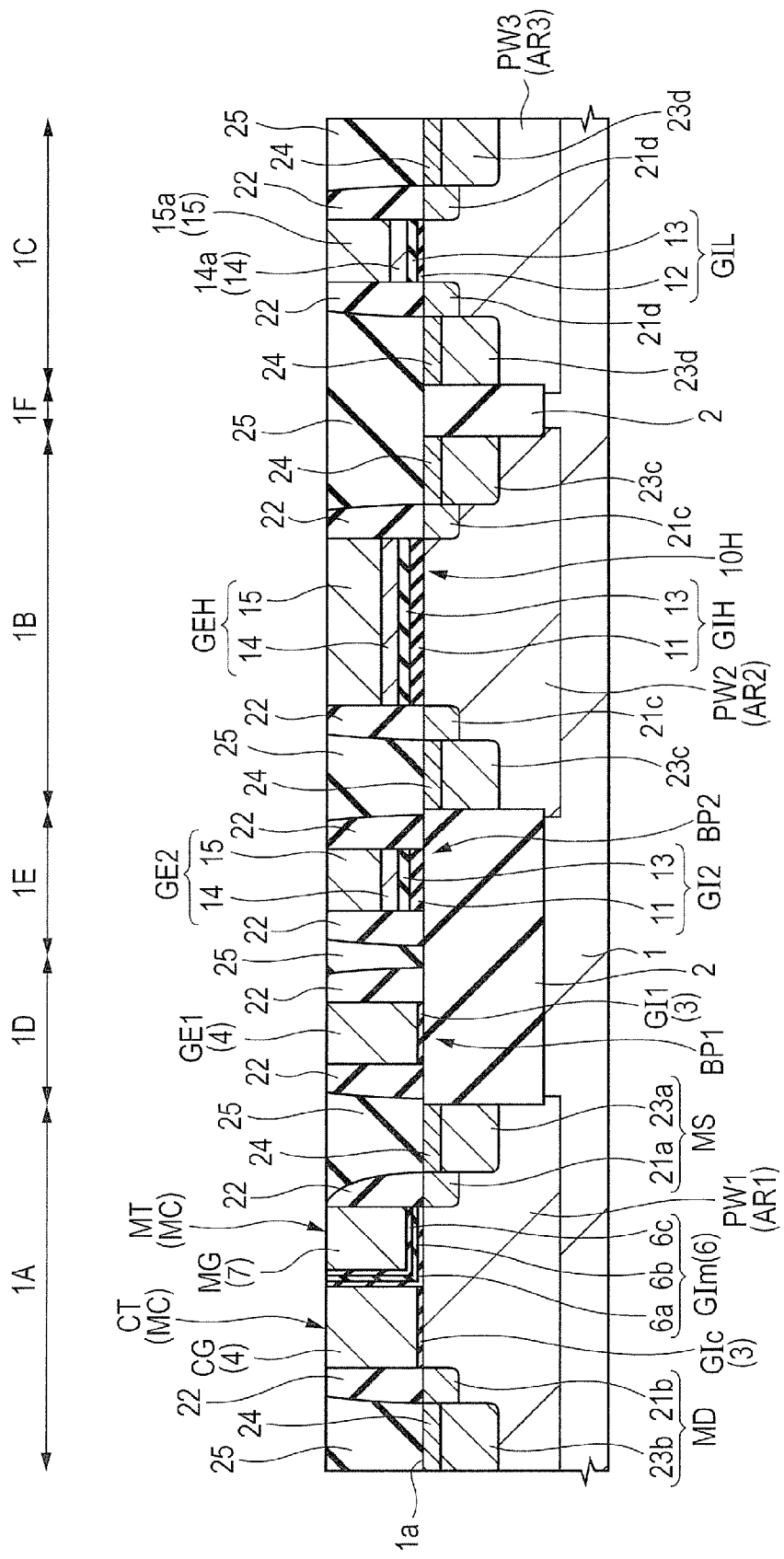
FIG. 27 is a fragmentary cross-sectional view of the semiconductor device of First Embodiment during a manufacturing step thereof.

Next, as shown in FIG. 27, the insulating film 25 is polished (Step S20 in FIG. 4). In Step S20, the insulating film 25 and the cap insulating film CP1 are polished using, for example, CMP (chemical mechanical polishing) to planarize the upper surface of the insulating film 25 and expose the upper surface of the conductive film portion 15a in the low-voltage MISFET region 1C. In the memory cell region 1A, the upper surface of each of the control gate electrode CG and the memory gate electrode MG is exposed; in the high-voltage MISFET region 1B, the upper surface of the gate electrode GEH is exposed: and in the boundary regions 1D and 1E, the upper surface of each of the gate electrodes GE1 and GE2 is exposed. In example shown in FIG. 27, the metal silicide layer 24 formed on the surface of the memory gate electrode MG is also removed.

Thus, as shown in FIG. 27, the control transistor CT and the memory transistor MT are formed in the memory cell region 1A and a memory cell MC as a nonvolatile memory is formed from the control transistor CT and the memory transistor MT. In other words, the memory cell MC as a nonvolatile memory is formed from the control gate electrode CG, the gate insulating film GIc, the memory gate electrode MG, and the gate insulating film GIm.

As shown in FIG. 27, a high-voltage MISFET 10H is formed in the high-voltage MISFET region 1B. In other words, the high-voltage MISFET 10H is formed from the gate electrode GEH and the gate insulating film GIH.

Figure 28:
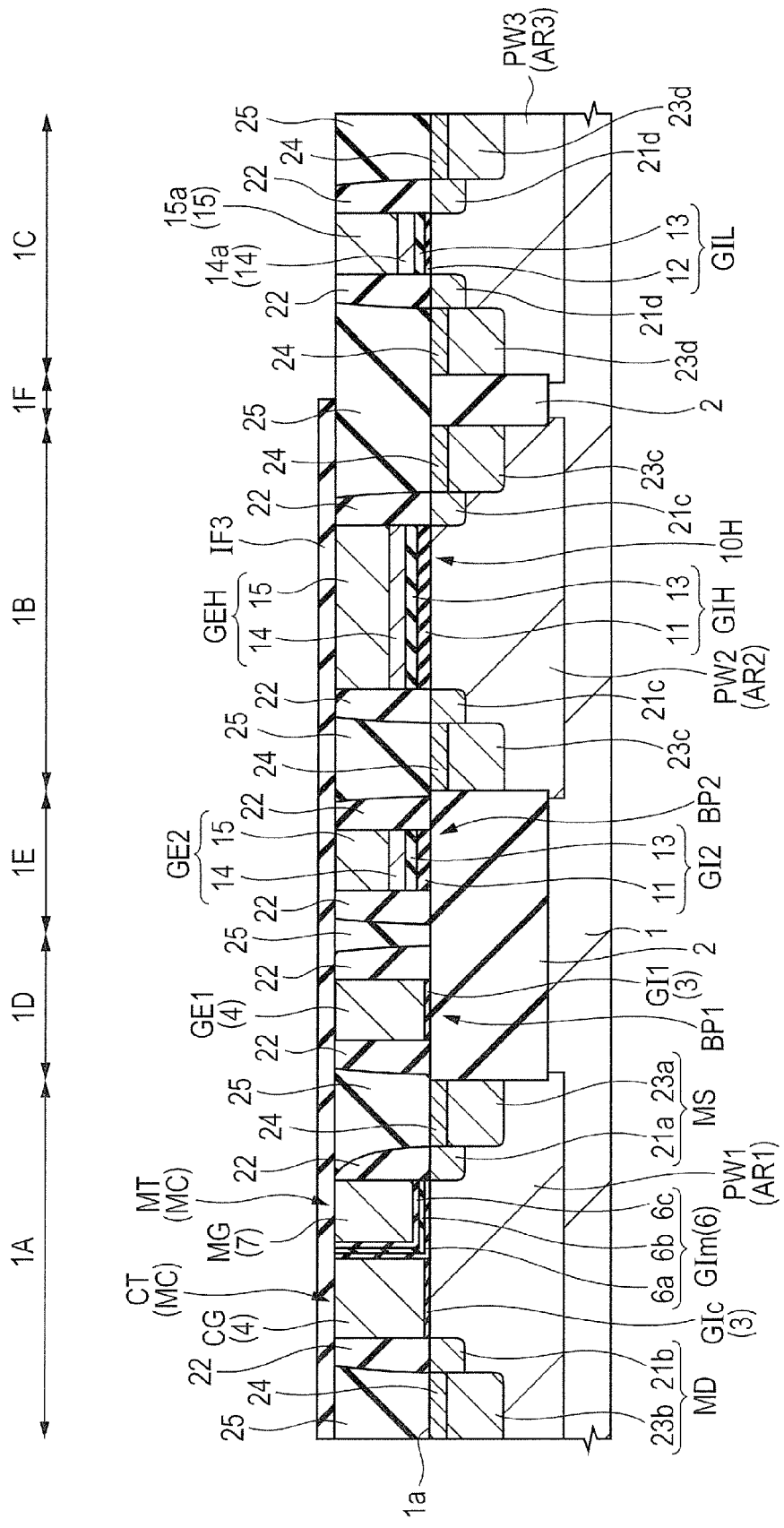
FIG. 28 is a fragmentary cross-sectional view of the semiconductor device of First Embodiment during a manufacturing step thereof.
Figure 29:
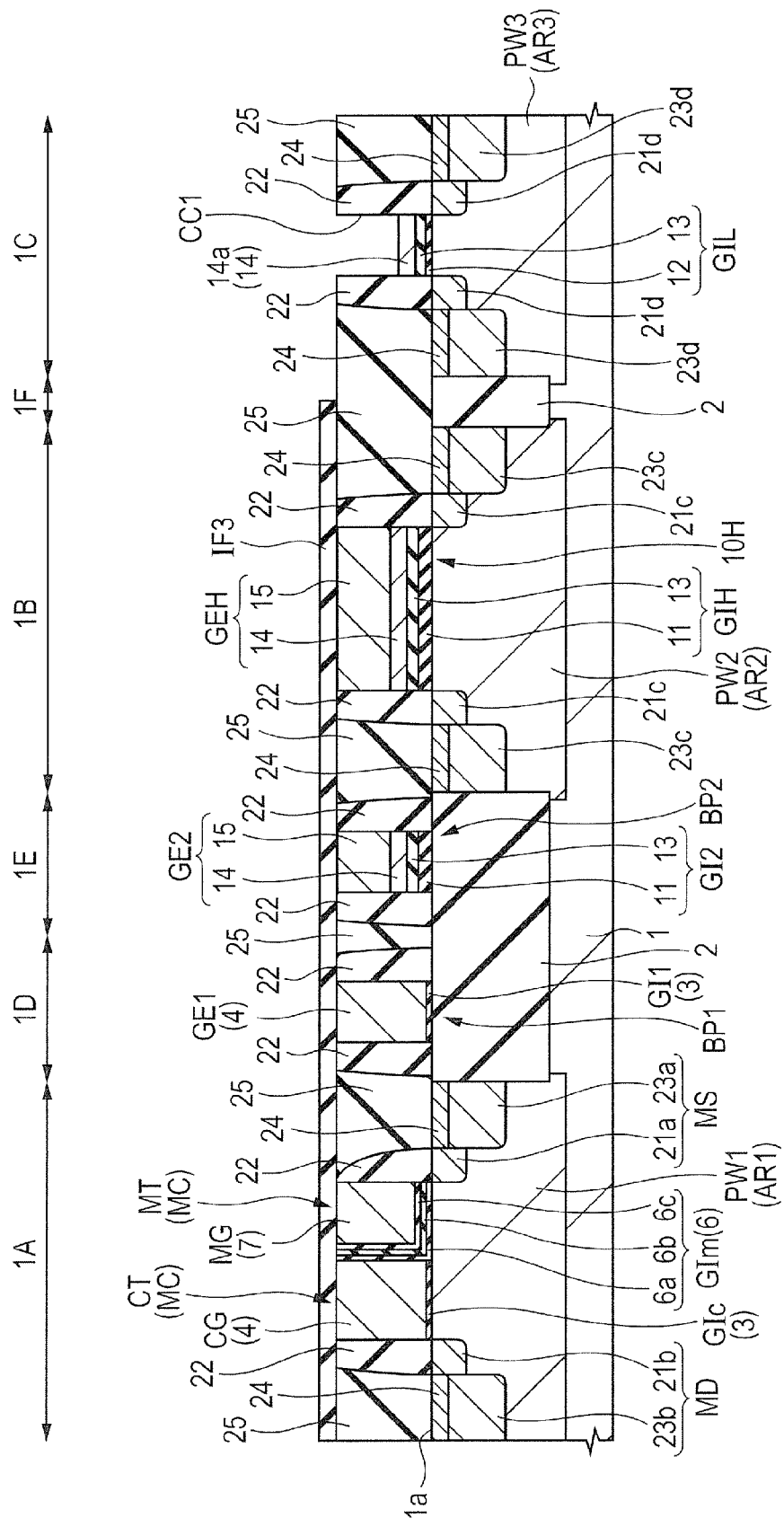
FIG. 29 is a fragmentary cross-sectional view of the semiconductor device of First Embodiment during a manufacturing step thereof.

Next, as shown in FIGS. 28 and 29, the conductive film portion 15a is removed (Step S21 in FIG. 4).

In Step S21, first, as shown in FIG. 28, an insulating film IF3 made of, for example, a silicon oxide film is formed, for example, by CVD on the entire surface 1a of the main surface of the semiconductor substrate 1. Next, the insulating film IF3 is patterned using photolithography and dry etching to remove the insulating film IF3 from the low-voltage MISFET region 1C while leaving the insulating film IF3 in the memory cell region 1A, the high-voltage MISFET region 1B, and the boundary regions 1D and 1E. As a result, the conductive film portion 15a is exposed from the insulating film IF3 in the low-voltage MISFET region 1C.

In Step S21, next, as shown in FIG. 29, the exposed conductive film portion 15a is removed by etching. This means that the conductive film portion 15a functions, as described above, a dummy gate electrode.

In Step S21, the conductive film portion 15a can be removed, for example, by dry etching. Alternatively, the conductive film portion 15a may be removed, for example, by wet etching with an etchant.

By Step S21, the conductive film portion 15a made of, for example, a silicon film is removed and the metal film portion 14a under the conductive film portion 15a is exposed. In a portion from which the conductive film 15a has been removed, a trench CC1 is formed. The metal film portion 14a is exposed from the bottom portion of the trench CC1 and from the side wall, that is, the side surface of the trench CC1, the sidewall spacer 22 is exposed.

In Step S21, by etching the conductive film portion 15a under etching conditions which do not facilitate etching of the metal film portion 14a compared with etching of the conductive film portion 15a, the conductive film portion 15a is selectively removed. In other words, the metal film portion 14a made of, for example, a titanium nitride film is used as an etching stopper when the conductive film portion 15a made of, for example, a silicon film is etched.

When the gate insulating film GIL does not have the metal film portion 14a thereon but it has the conductive film portion 15a directly thereon, etching of the conductive film portion 15a may etch the gate insulating film GIL and moreover, etch the p well PW3 of the semiconductor substrate 1. On the other hand, when the gate insulating film GIL has thereon the conductive film portion 15a via the metal film portion 14a, the metal film portion 14a functions as an etching stopper at the time of etching the conductive film portion 15a. During etching of the conductive film portion 15a, therefore, etching of the gate insulating film GIL and the p well PW3 can be prevented.

In the memory cell region 1A and the high-voltage MISFET region 1B, on the other hand, the control gate electrode CG, the memory gate electrode MG, and the gate electrode GEH are not exposed, covered with the insulating film IF3 so that they are not etched. In the boundary regions 1D and 1E, the gate electrodes GE1 and GE2 are not exposed, covered with the insulating film IF3 so that they are not etched.

Figure 30:
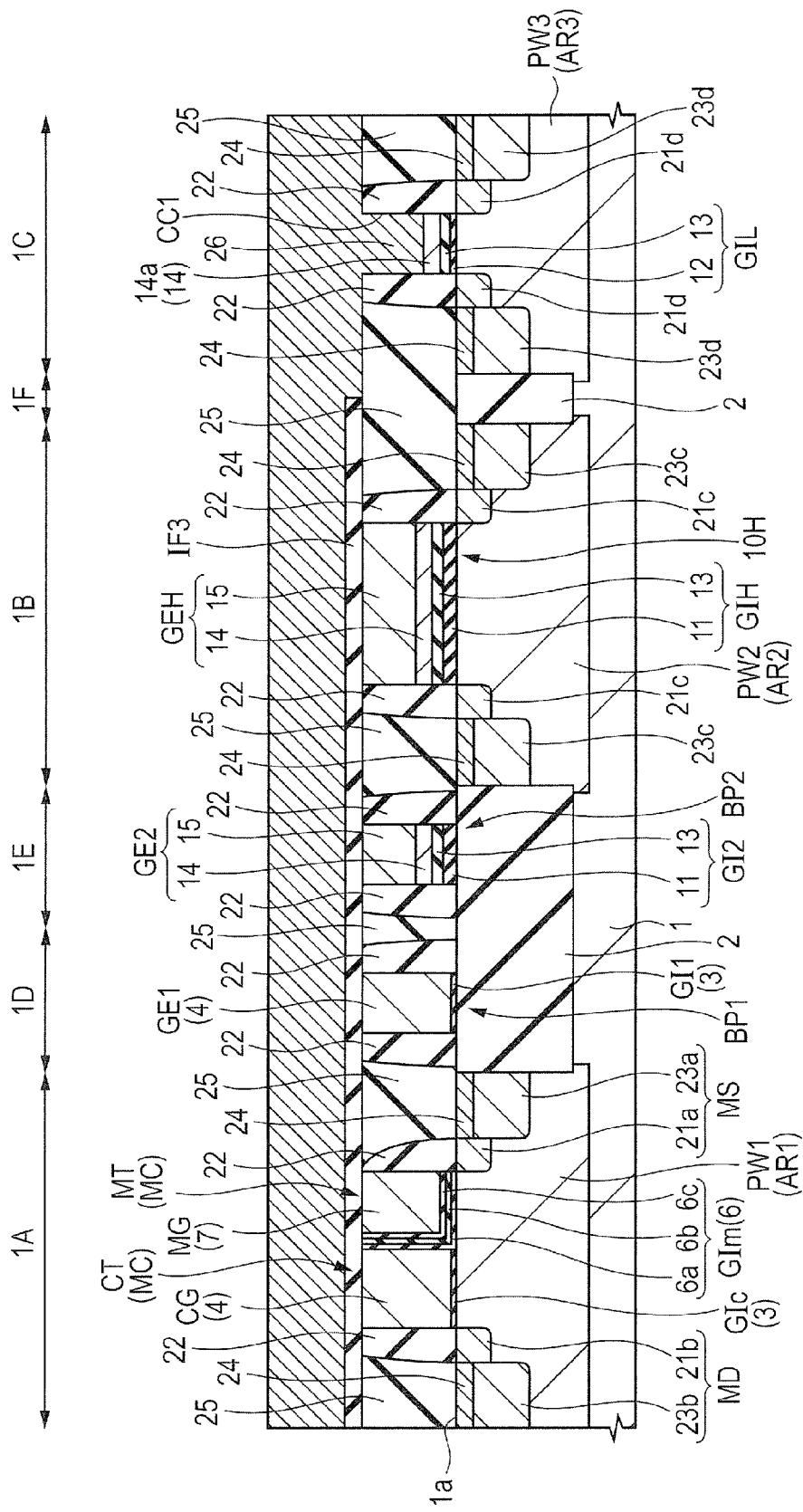
FIG. 30 is a fragmentary cross-sectional view of the semiconductor device of First Embodiment during a manufacturing step thereof.

Next, as shown in FIG. 30, a conductive film 26 is formed (Step S22 in FIG. 5). In Steps S22, a conductive film 26 for gate electrode GEL (refer to FIG. 31 described later) is formed on the entire surface of the main surface 1a of the semiconductor substrate 1. The conductive film 26 is formed on the metal film portion 14a exposed from the bottom portion of the trench CC1 formed in Step S21 so as to come into contact with the metal film portion 14a. The trench CC1 is then filled with the conductive film 26.

As the conductive film 26, a metal film other than a silicon film such as polycrystalline silicon film can be used. A metal film made of, for example, an aluminum (Al) film, a tantalum nitride (TaN) film, or a titanium nitride (TiN) film is suited for use. The conductive film 26 can be formed, for example, by physical vapor deposition (PVD) such as sputtering. A metal film for adjusting a work function of a gate electrode GEL (refer to FIG. 31 described later) may be formed between the metal film portion 14a and the conductive film 26.

Figure 31:
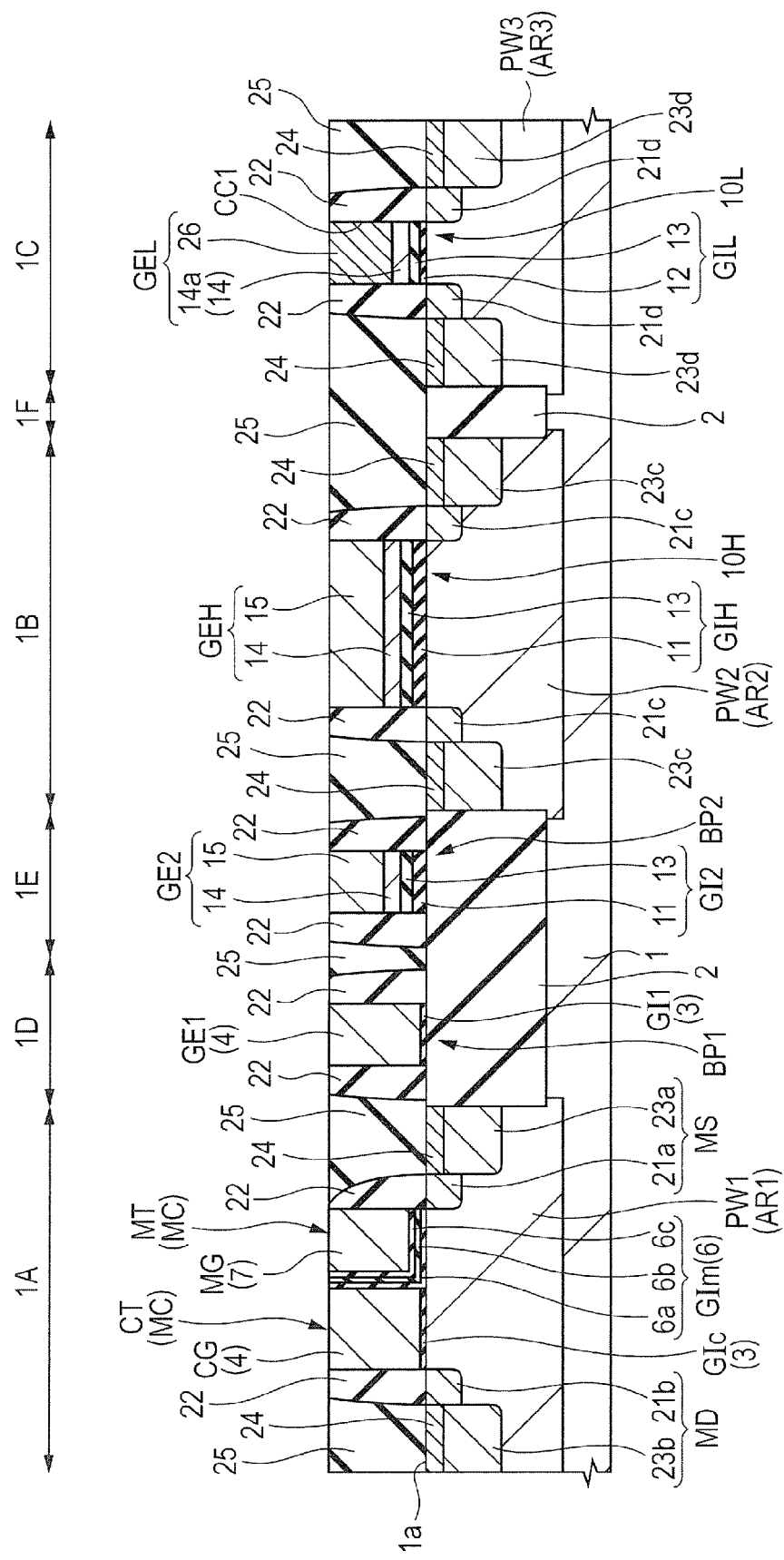
FIG. 31 is a fragmentary cross-sectional view of the semiconductor device of First Embodiment during a manufacturing step thereof.

Next, as shown in FIG. 31, the conductive film 26 is polished (Step S23 in FIG. 5). In Step S23, by using, for example, CMP, the conductive film 26 outside the trench CC1 is removed and the conductive film 26 is left in the trench 1. As a result, a gate electrode GEL including the metal film portion 14a on the gate insulating film GIL and the conductive film 26 formed on the metal film portion 14a and at the same time, left in the trench CC1 is formed in the low-voltage MISFET region 1C. During removing the conductive film 26 outside the trench CC1, the insulating film IF3 formed in the memory cell region 1A, the high-voltage MISFET region 1B, and the boundary regions 1D and 1E are removed.

As described above, as shown in FIG. 31, a low-voltage MISFET 10L is formed in the low-voltage MISFET region 1C. This means that the low-voltage MISFET 10L is formed from the gate electrode GEL and the gate insulating film GIL.

Since the metal film portion 14a made of, for example, a titanium nitride film is placed at a portion of the gate electrode GEL contiguous to the gate insulating film GIL, the gate electrode GEL can be allowed to function as a metal gate electrode. This makes it possible to prevent depletion of a portion of the gate electrode GEL contiguous to the gate insulating film GIL, compared with the case where a portion of the gate electrode GEL contiguous to the gate insulating film GIL is made of a silicon film. The resulting MISFET 10L can therefore have improved performance.

In addition, a portion of the gate electrode GEL on the metal film portion 14a has a conductive film 26 made of, for example, an aluminum film so that the MISFET 10L can have further improved performance compared with the case where a portion of the gate electrode GEL on the metal film portion 14a is made of a silicon film.

Figure 32:
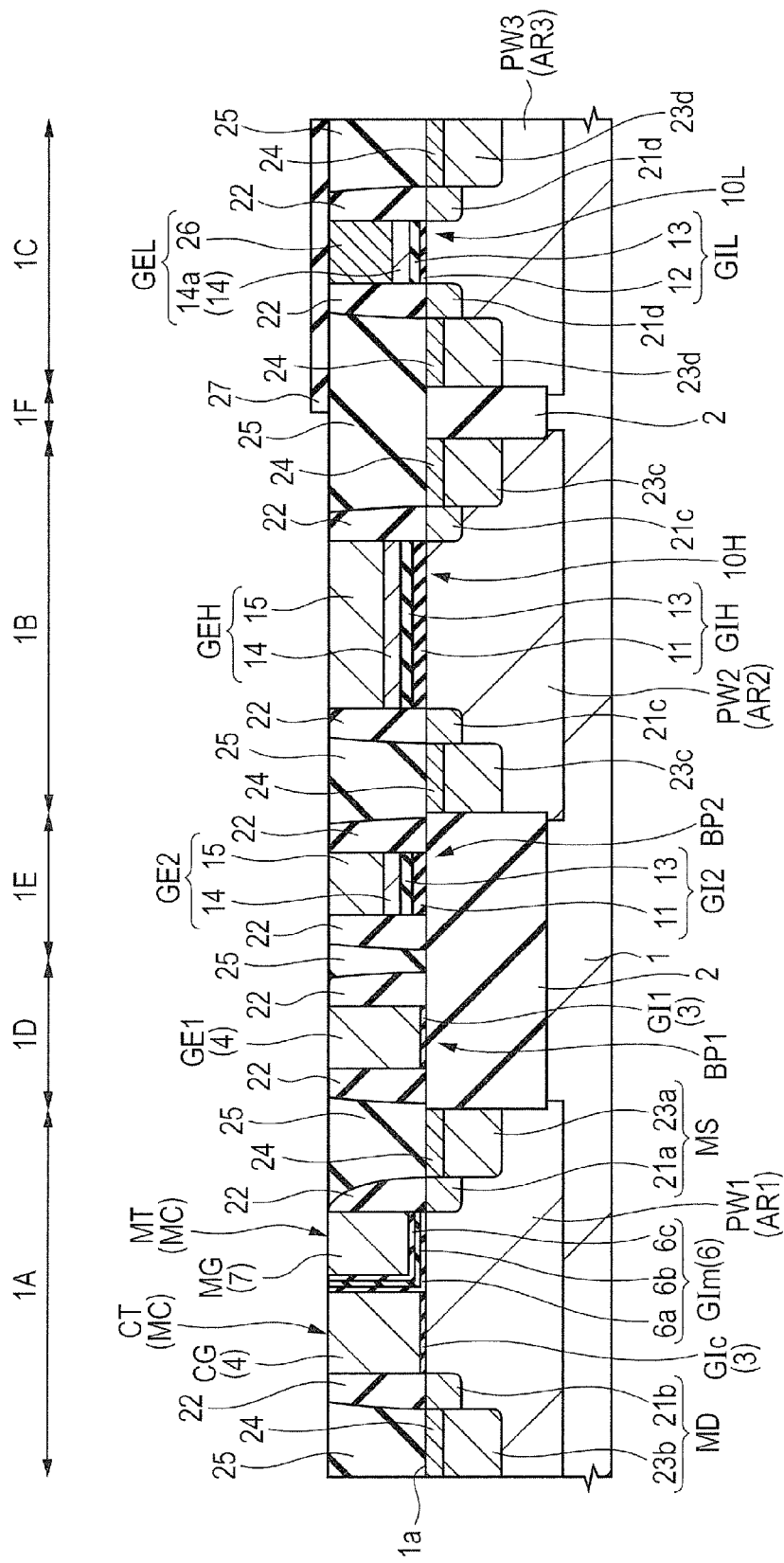
FIG. 32 is a fragmentary cross-sectional view of the semiconductor device of First Embodiment during a manufacturing step thereof.
Figure 33:
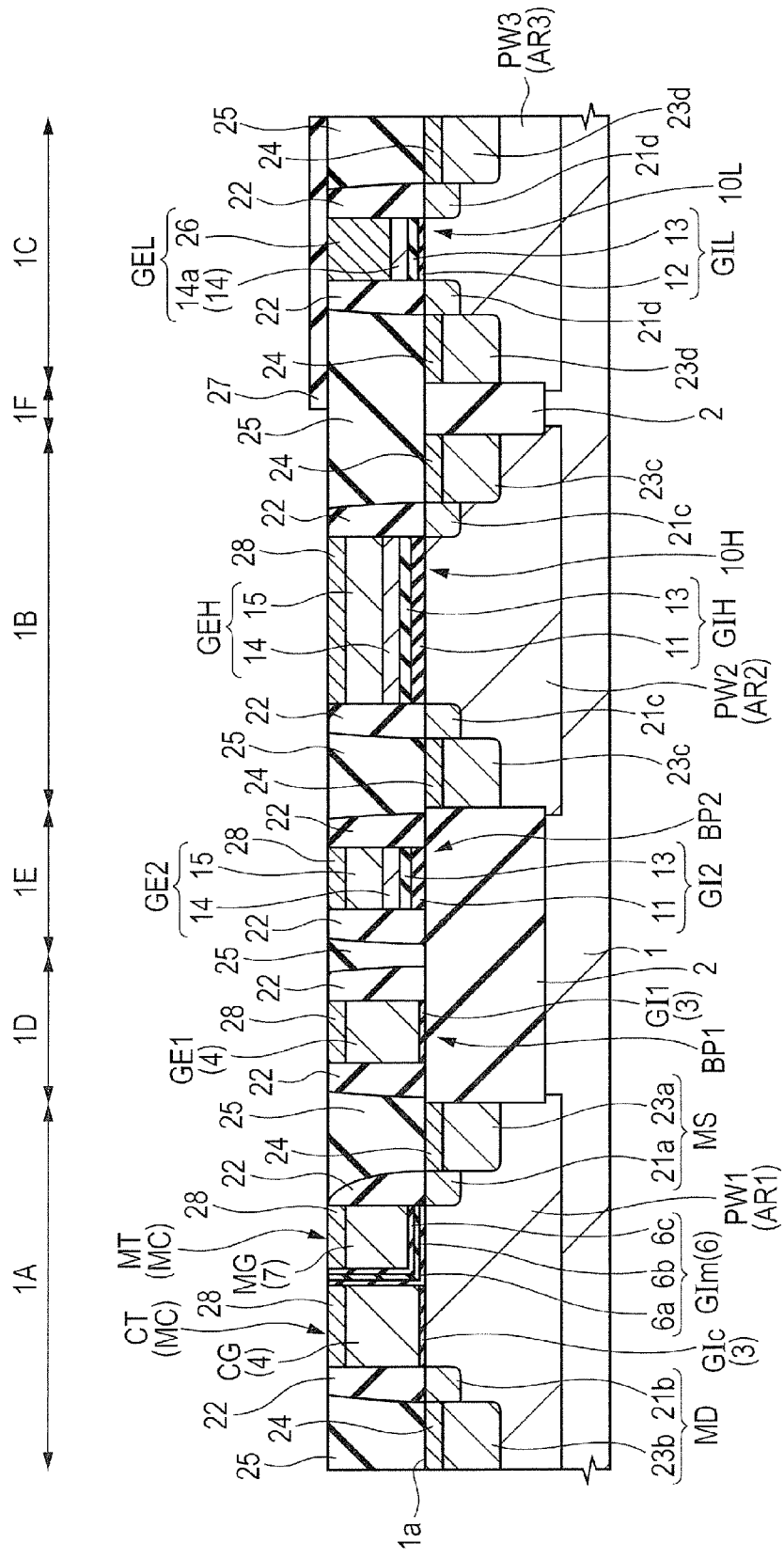
FIG. 33 is a fragmentary cross-sectional view of the semiconductor device of First Embodiment during a manufacturing step thereof.

Next, as shown in FIGS. 32 and 33, a metal silicide layer 28 is formed (Step S24 in FIG. 5).

In Step S24, first, as shown in FIG. 32, an insulating film 27 made of, for example, a silicon nitride film is formed, for example, by CVD on the entire surface of the main surface 1a of the semiconductor substrate 1. Next, the insulating film 27 is patterned using photolithography and dry etching to remove the insulating film 27 from the memory cell region 1A, the high-voltage MISFET region 1B, and the boundary regions 1D and 1E and leave the insulating film 27 in the low-voltage MISFET region 1C. As a result, the control gate electrode CG, the memory gate electrode MG, and the gate electrodes GEH, GE1, and GE2 are exposed from the insulating film 27 in the memory cell region 1A, the high-voltage MISFET region 1B, and the boundary regions 1D and 1E.

In Step S24, next, as shown in FIG. 33, a metal film is formed on the entire surface of the main surface 1a of the semiconductor substrate 1 so as to cover the control gate electrode CG, the memory gate electrode MG, and the gate electrodes GEH, GE1, and GE2. The metal film is made of, for example, a cobalt (Co) film, a nickel (Ni) film, or a nickel platinum alloy film and can be formed using sputtering or the like. The semiconductor substrate 1 is then subjected to heat treatment to react an upper layer portion of the control gate electrode CG, the memory gate electrode MG, and the gate electrodes GEH, GE1, and GE2 with the metal film. As a result, a metal silicide layer 28 is formed on each of the control gate electrode CG, the memory gate electrode MG, the gate electrodes GEH, GE1, and GE2.

The metal silicide layer 28 may be, similar to the metal silicide layer 24, for example, a cobalt silicide layer, a nickel silicide layer, or a platinum-added nickel silicide layer. Then, an unreacted portion of the metal film is removed. By performing such a salicide process, the metal silicide layer 28 can be formed on each of the control gate electrode CG, the memory gate electrode MG, and the gate electrodes GEH, GE1, and GE2, as shown in FIG. 33.

Next, as shown in FIG. 2, an interlayer insulating film 29 is formed (Step S25 in FIG. 5). In Step S25, an interlayer insulating film 29 is formed as an insulating film on the entire surface of the main surface 1a of the semiconductor substrate 1. The interlayer insulating film 29 is made of a single silicon oxide film or a stacked film of a silicon nitride film and a silicon oxide film and can be formed, for example, by CVD.

Next, as shown in FIG. 2, a plug PG is formed (Step S26 in FIG. 5). In Step S26, with a resist pattern (not shown) formed, as an etching mask, on the insulating film 16 by photolithography, the interlayer insulating film 29 and the insulating film 25 are dry etched to form a contact hole CNT penetrating the interlayer insulating film 29 and the insulating film 25. Next, a conductive plug PG made of tungsten (W) or the like is formed in the contact hole CNT as a conductor portion.

The plug PG is formed, for example, in the following manner. A barrier conductor film made of, for example, a titanium (Ti) film, a titanium nitride (TiN) film, or a stacked film thereof is formed on the interlayer insulating film 29 and inside of the contact hole CNT. Then, a main conductor film made of, for example, a tungsten (W) film is formed on the resulting barrier conductor film so as to fill the contact hole CNT therewith and an unnecessary portion of the main conductor film and the barrier conductor film on the interlayer insulating film 29 is removed by CMP, etch-back, or the like. The plug PG can be formed by the above steps. In order to simplify FIG. 2, the barrier conductor film and the main conductor film configuring the plug PG is shown as a single film.

The contact hole CNT and the plug PG that has filled the hole are formed on each of the $n^+$ type semiconductor regions 23a, 23b, 23c and 23d, the control gate electrode CG, the memory gate electrode MG, and the gate electrodes GEH and GEL. From the bottom portion of the contact hole CNT, for example, a portion of the metal silicide layer 24 on the surface of each of the $n^+$ type semiconductor regions 23a, 23b, 23c, and 23d is exposed and a portion of the metal silicide layer 28 on the surface of each of the control gate electrode CG, the memory gate electrode MG, and the gate electrodes GEH and GEL is exposed.

Next, as shown in FIG. 2, a wiring M1, which is a first-layer wiring, is formed on the interlayer insulating film 29 having the plug PG therein (Step S27 in FIG. 5). Formation of the wiring M1 using as a damascene technology, for example, a single damascene technology will be described.

First, an insulating film 30 is formed on the interlayer insulating film 29 having the plug PG therein. The insulating film 30 may be a stacked film of a plurality of insulating films. Next, by dry etching with a resist pattern (not shown) as an etching mask, a wiring trench is formed in a predetermined region of the insulating film 30.

Next, a barrier conductor film made of, for example, a titanium nitride (TiN) film, a tantalum (Ta) film, or a tantalum nitride (TaN) film is formed on the insulating film 30 and also on the bottom portion and side wall of the wiring trench. Then, a copper (Cu) seed layer is formed on the barrier conductor film by CVD or sputtering, followed by formation of a copper (Cu) plating film on the seed layer by electroplating or the like to fill the wiring trench with the Cu plating film. Then, the main conductor film and the barrier conductor film are removed using CMP from a region other than the wiring trench to form a first-layer wiring M1 having, as a main conductive material, Cu that has filled the wiring trench. In order to simplify FIG. 2, the barrier conductor film, the seed layer, and the Cu plating film configuring the wiring M1 are shown as a single film.

The wiring M1 is electrically coupled to the semiconductor region MS and the semiconductor region MD of the memory cell MC, the $n^+$ type semiconductor region 23c of the MISFET 10H, the $n^+$ type semiconductor region 23d of the MISFET 10L, and the like via the plug PG. Then, second and subsequent wirings are formed by a dual damascene method, but illustration and description of it will be omitted here. The wiring M1 and wirings thereabove are not limited to a damascene wiring and they can also be formed by patterning a conductive film for wiring. They can be formed, for example, as a tungsten (W) wiring or aluminum (Al) wiring.

The semiconductor device of First Embodiment as described referring to FIG. 2 is manufactured in such a manner.

Manufacturing Method of Semiconductor Device of Comparative Example 1

Figure 34:
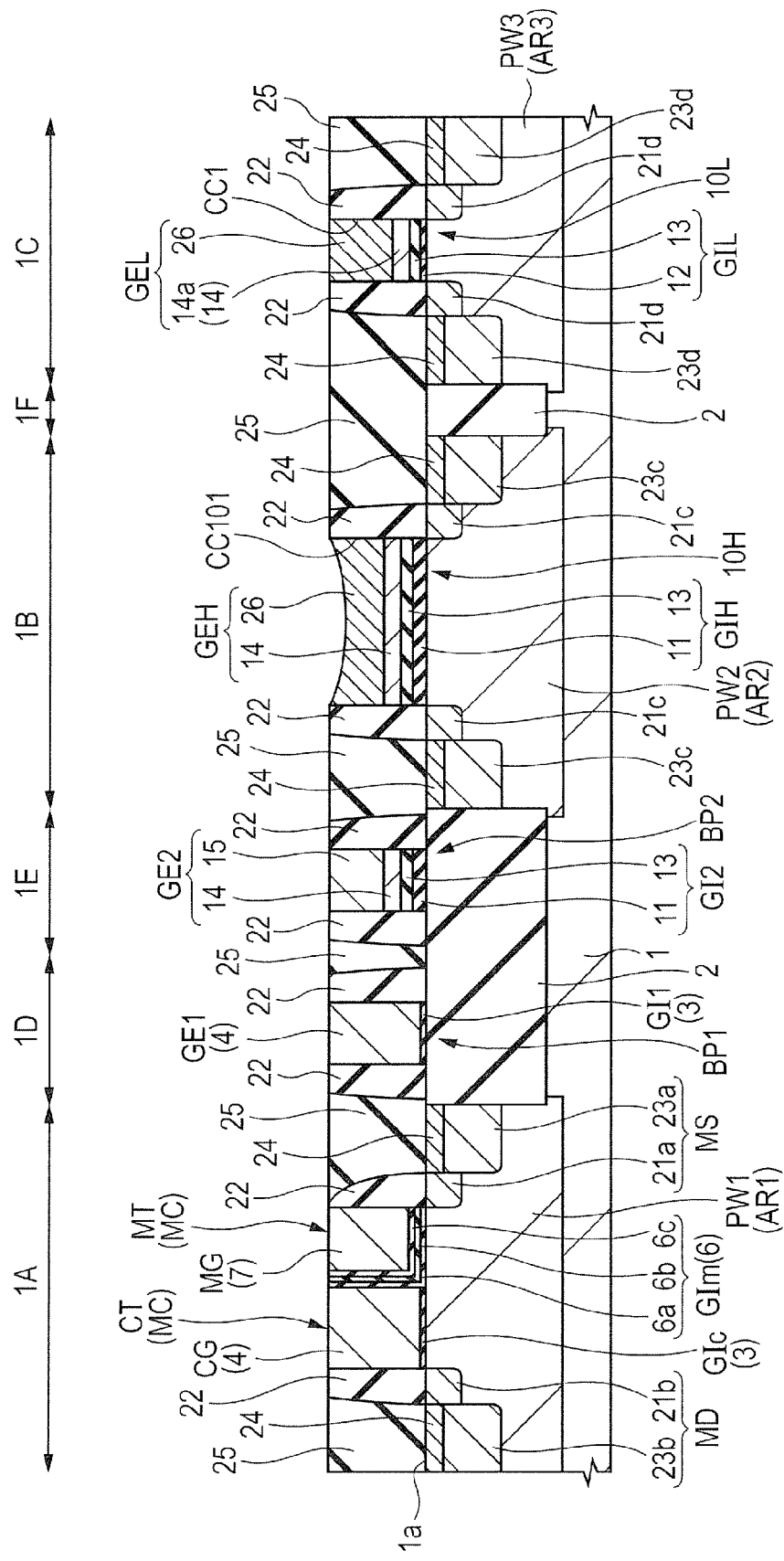
FIG. 34 is a fragmentary cross-sectional view of a semiconductor device of Comparative Example 1 during a manufacturing step thereof.
Figure 35:
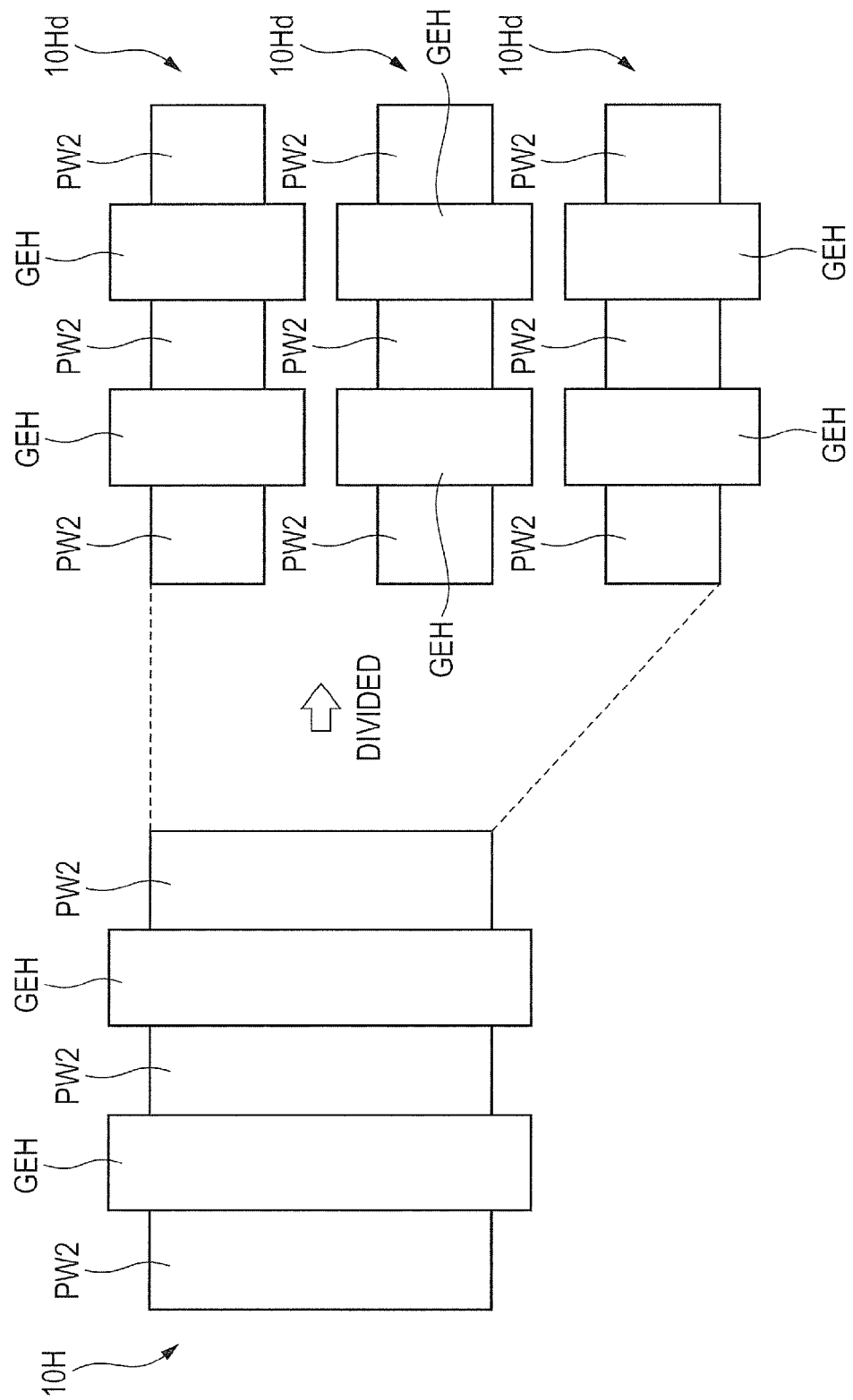
FIG. 35 is a fragmentary plan view of the semiconductor device of Comparative Example 1.

Next, a manufacturing method of a semiconductor device of Comparative Example 1 will be described. FIG. 34 is a fragmentary cross-sectional view of the semiconductor device of Comparative Example 1 during a manufacturing step thereof. FIG. 35 is a fragmentary plan view of the semiconductor device of Comparative Example 1.

In the manufacturing steps of the semiconductor device of Comparative Example 1, the insulating film 25 is polished after steps similar to Step S3 in FIG. 3 to Step S20 in FIG. 4 are performed. Next, a step corresponding to Step S21 in FIG. 4 is performed and as shown in FIG. 29, during removing the conductive film portion 15a (refer to FIG. 28) including the conductive film 15 from the low-voltage MISFET region 1C, the conductive film 15 is removed also from the high-voltage MISFET region 1B. Then, as shown in FIG. 34, a trench CC101 is formed in the high-voltage MISFET region 1B.

Next, a step corresponding to Step S22 in FIG. 5 is performed to form a conductive film 26. When the trench CC1 is filled with the conductive film 26 in the low-voltage MISFET region 1C, the trench CC101 in the high-voltage MISFET region 1B is also filled with the conductive film 26.

Next, a step corresponding to Step S23 in FIG. 5 is performed to polish the conductive film 26, for example, by CMP as shown in FIG. 34.

As described above, the gate length (channel length) of the high-voltage MISFET 10H is longer than the gate length (channel length) of the low-voltage MISFET 10L so that the width of the trench CC101 in the gate length direction is wider than the width of the trench CC1 in the gate length direction. When the conductive film 26 is polished by CMP, dishing may occur in the high-voltage MISFET region 1B. The term "dishing" means that the conductive film 26 is excessively polished due to elasticity of a pad used in CMP and the height position of the upper surface of a portion of the conductive film 26 at the center of the trench CC101 becomes lower than the height of the upper surface of a portion of the insulating film 25 adjacent to the trench CC101.

The gate insulating film GIH has a thickness greater than that of the gate insulating film GIL. In addition, the height of the upper surface of the insulating film 25 is equal between the high-voltage MISFET region 1B and the low-voltage MISFET region 1C. The thickness of the gate electrode GEH formed in the high-voltage MISFET region 1B becomes less than the thickness of the gate electrode GEL formed in the low-voltage MISFET region 1C. When dishing occurs and the thickness of the gate electrode GEH becomes less than a desired thickness and becomes even less than that of the gate electrode GEL, the semiconductor device of Comparative Example cannot have improved performance because of deterioration or fluctuation in the transistor characteristics, for example, threshold voltage Vth of the high-voltage MISFET 10H.

As described above, the width of the trench CC101 in the gate length direction (channel length direction) is wider than the width of the trench CC1 in the gate length direction (channel length direction). Even when the length of the trench CC101 in the gate width direction (channel width direction) is equal to the length of the trench CC1 in the gate length direction (channel length direction), influence of dishing on the high-voltage MISFET 10H is greater than that on the low-voltage MISFET 10L.

When the high-voltage MISFET 10H is used for an input/output circuit or ESD (electrostatic discharge) circuit, an increase in current flowing through the high-voltage MISFET 10H is required. As shown, for example, on the left side of FIG. 35, a plurality of gate electrode GEH is, in plan view, preferably placed with a space in the gate length direction (channel length direction) and an increase in the length, in the gate width direction (channel width direction), of the gate electrode GEH is desired.

As described above, however, the influence of dishing on the high-voltage MISFET 10H is greater than that on the low-voltage MISFET 10L. As shown, for example, on the right side of FIG. 35, therefore, the high-voltage MISFET 10H should be divided into a plurality of MISFET 10Hds in the gate width direction (channel width direction). Due to an area of a region where the element isolation film is formed between the MISFET 10Hds adjacent to each other, an area of a region necessary for the formation of the high-voltage MISFET 10H increases.

In other words, prevention or suppression of dishing in the semiconductor device of Comparative Example 1 is accompanied by limitation on the size or planar shape such as dimension or area of the gate electrode GEH included in the high-voltage MISFET 10H. This causes an increase in an area of a region necessary for the formation of the high-voltage MISFET 10H and as a result, a downsized semiconductor device cannot be manufactured easily.

Manufacturing Method of Semiconductor Device of Comparative Example 2

Figure 36:
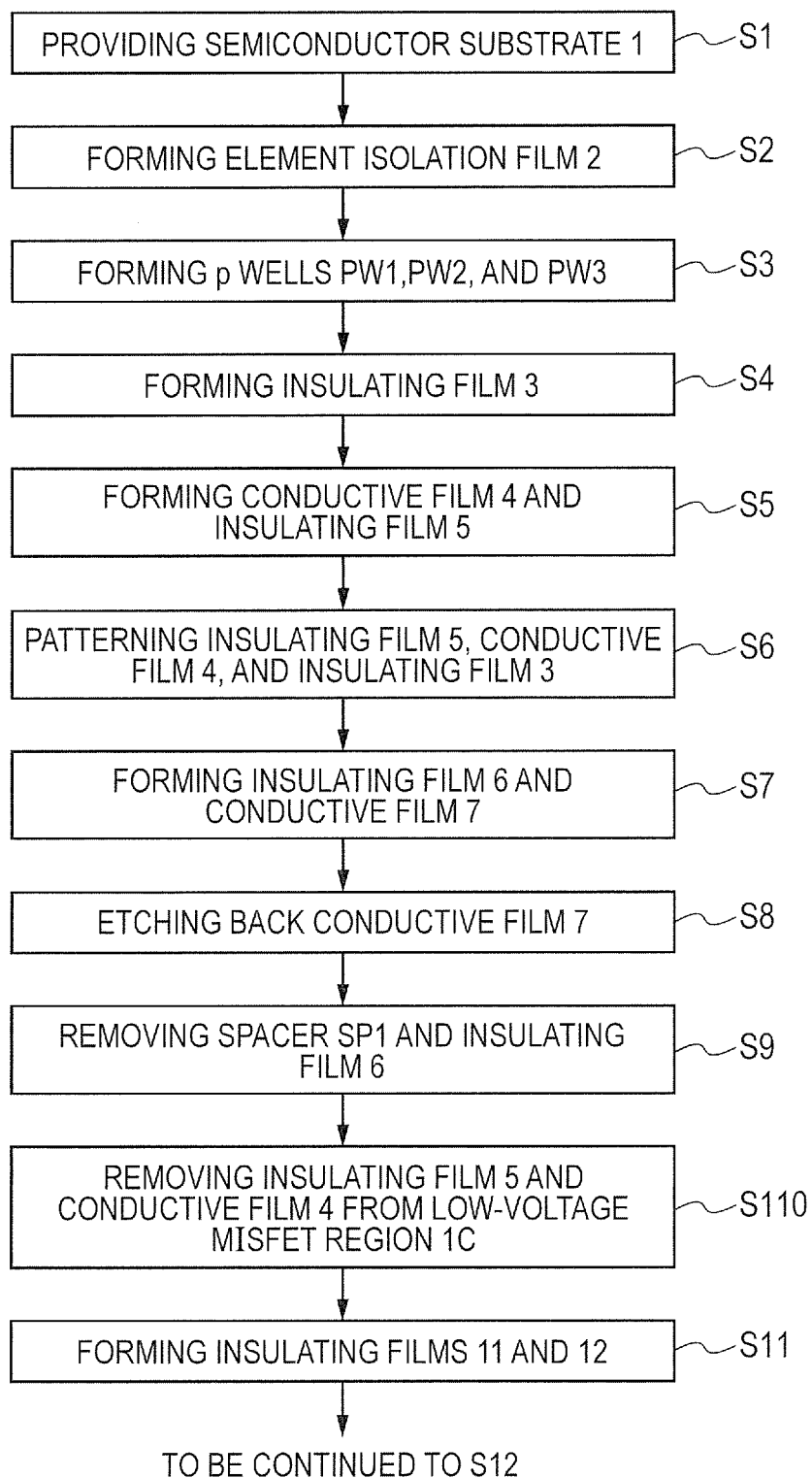
FIG. 36 is a process flow chart showing some of manufacturing steps of a semiconductor device of Comparative Example 2.
Figure 37:
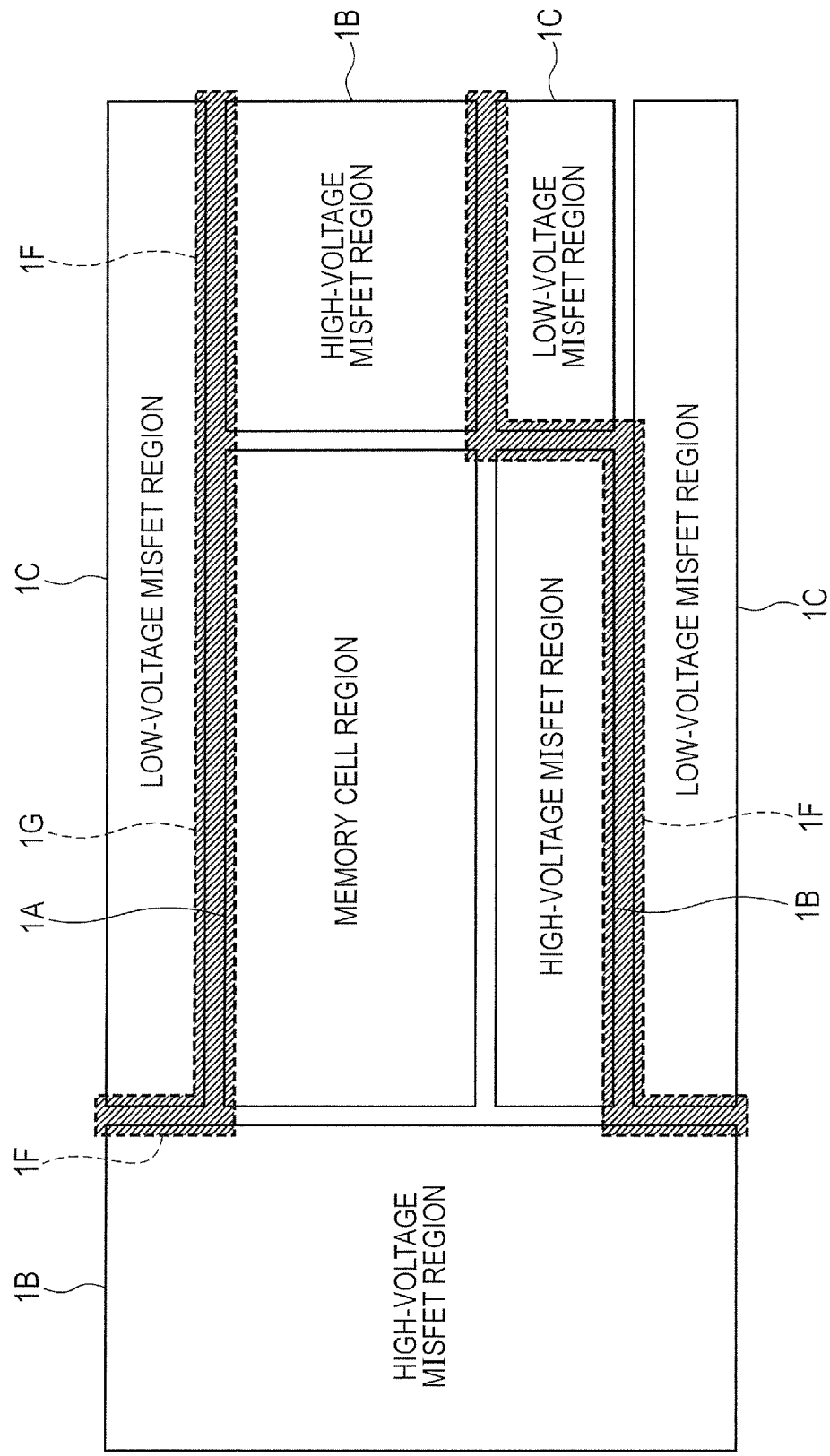
FIG. 37 shows a layout configuration example of the semiconductor device of Comparative Example 2.

Next, a manufacturing method of a semiconductor device of Comparative Example 2 will be described. FIG. 36 is a process flow chart showing some manufacturing steps of the semiconductor device of Comparative Example 2. FIG. 37 shows the layout configuration example of the semiconductor device of Comparative Example 2.

In the manufacturing steps of the semiconductor device of Comparative Example 2, after a step similar to Step S20 in FIG. 4 is performed, the insulating film 25 is polished. Next, a step corresponding to Step S21 in FIG. 4 is performed. As shown in FIG. 29, during removal of the conductive film portion 15a (refer to FIG. 28) including the conductive film 15 from the low-voltage MISFET region 1C, the conductive film 15 is not removed in the high-voltage MISFET region 1B as in First Embodiment. In the manufacturing steps of the semiconductor device of Comparative Example 2, different from the manufacturing steps of the semiconductor device of Comparative Example 1, when a step corresponding to Step S23 in FIG. 5 is performed to polish the conductive film 26, for example, by CMP, dishing may not occur in the high-voltage MISFET region 1B.

In the manufacturing steps of the semiconductor device of Comparative Example 2, on the other hand, steps (Step S1 to Step S9 in FIG. 36) similar to Step S1 to Step S9 in FIG. 3 are performed to remove the spacer SP1 and the insulting film 6. Next, when a step (Step S110 in FIG. 36) corresponding to Step S10 in FIG. 3 is performed to remove the insulating film 5 and the conductive film 4 as shown in FIG. 11, the insulating film 5 and the conductive film 4 are removed from the low-voltage MISFET region 1C, but removal of the insulating film 5 and the conductive film 4 is not performed in the high-voltage MISFET region 1B. The gate electrode GEH included in the high-voltage MISFET 10H therefore includes, instead of the metal film 14 and the conductive film 15, a conductive film formed in the same layer as that of the conductive film 4 included in the control gate electrode CG. In other words, in the high-voltage MISFET region 1B, the conductive film 4 is not replaced by the metal film 14 and the conductive film 15, while in the low-voltage MISFET region 1C, the conductive film 4 is replaced by the metal film 14 and the conductive film 15.

As shown in FIG. 37, therefore, the semiconductor device of Comparative Example 2 has the film portions BP1 and BP2 (refer to FIG. 2) not between the memory cell region 1A and the high-voltage MISFET region 1B but between the high-voltage MISFET region 1B and the low-voltage MISFET region 1C. The width of a boundary region between a region where the conductive film 4 is replaced by the metal film 14 and the conductive film 15 and a region where the conductive film 4 is not replaced by the metal film 14 and the conductive film 15 increases by the width of the film portions BP1 and BP2. In the semiconductor device of Comparative Example 2, therefore, the boundary region 1F between the high-voltage MISFET region 1B and the low-voltage MISFET region 1C has an increased width. In the semiconductor device of Comparative Example 2, the boundary region 1G between the memory cell region 1A and the low-voltage MISFET region 1C also has an increased width.

In general, the low-voltage MISFET region 1C is, in plan view, scattered in a semiconductor chip as a semiconductor device, while at considerably many places of the semiconductor chip, the high-voltage MISFET region 1B and the low-voltage MISFET region 1C are adjacent to each other. The boundary region 1F between the high-voltage MISFET region 1B and the low-voltage MISFET region 1C extends over a long distance while showing complicated curves in the semiconductor chip. Due to an increase in the proportion of an area of the boundary region 1F in the semiconductor chip as a semiconductor device, the semiconductor device cannot have improved performance. For example, when the boundary region 1F needs a width of from about 0.5 to 1.0

μm, the proportion of an area of the boundary region 1F in the semiconductor chip becomes markedly large.

This means that the planar layout of the semiconductor device of Comparative Example 2 becomes complicated and the planar layout of the semiconductor device of Comparative Example 2 cannot easily be designed.

Main Characteristics and Advantages of the Present Embodiment

In the manufacturing steps of the semiconductor device of First Embodiment, after formation of a control gate electrode CG and a memory gate electrode MG in the memory cell region 1A, a conductive film 15 made of a silicon film is formed on an insulating film 13 made of a high-dielectric-constant film via a metal film 14 containing a metal nitride in the high-voltage MISFET region 1B and the low-voltage MISFET region 1C. Next, by patterning the conductive film 15 and the metal film 14, a gate electrode GEH including the metal film 14 and the conductive film 15 is formed in the high-voltage MISFET region 1B and a metal film portion 14a including the metal film 14 and a conductive film portion 15a including the conductive film 15 are formed in the low-voltage MISFET region 1C. Next, in the low-voltage MISFET region 1C, the conductive film portion 15a is removed to expose the metal film portion 14a. A conductive film 26 is formed on the exposed metal film portion 14a, followed by formation of a gate electrode GEL including the metal film portion 14a and the conductive film 26.

The semiconductor device of First Embodiment manufactured using such manufacturing steps of a semiconductor device has a control gate electrode CG and a memory gate electrode MG, each formed in the memory cell region 1A. The semiconductor device thus obtained has, in the high-voltage MISFET region 1B, a gate insulating film GIH formed on the semiconductor substrate 1 and a gate electrode GEH formed on the gate insulating film GIH. The gate insulating film GIH includes an insulating film 11 made of a low-dielectric-constant film and an insulating film 13 made of a high-dielectric-constant film on the insulating film 11. The gate electrode GEH includes a metal film 14 containing a metal nitride on the insulating film 13 and a conductive film 15 on the metal film 14. The semiconductor device has, in the low-voltage MISFET region 1C, a gate insulating film GIL formed on the semiconductor substrate 1 and a gate electrode GEL formed on the gate insulating film GIL. The gate insulating film GIL includes an insulating film 12 made of a low-dielectric-constant film and an insulating film 13 made of a high-dielectric-constant film on the insulating film 12. The gate electrode GEL includes a metal film portion 14a containing a metal nitride on the insulating film 13 and a conductive film 26 on the metal film portion 14a. The insulating film 12 has a thickness less than that of the insulating film 11.

In the manufacturing steps of the semiconductor device of First Embodiment, the conductive film 15 is not removed from the high-voltage MISFET region 1B when the conductive film portion 15a including the conductive film 15 is removed from the low-voltage MISFET region 1C. In the manufacturing steps of the semiconductor device of First Embodiment, different from the semiconductor device of Comparative Example 1, occurrence of dishing in the high-voltage MISFET region 1B can be prevented or suppressed when the conductive film 26 is polished using, for example, CMP.

The thickness of the gate electrode GEH can be prevented or suppressed from becoming less than the desired thickness and becoming further less than the thickness of the gate electrode GEL. This results in improvement in transistor characteristics, such as threshold voltage Vth, of the high-voltage MISFET 10H. The semiconductor device thus obtained can therefore have improved performance. In addition, dishing is prevented or suppressed so that the planar shape, such as dimension or area, of the gate electrode GEH included in the high-voltage MISFET 10H is less limited. As a result, an area of a region necessary for the formation of the high-voltage MISFET 10H can be reduced, facilitating downsizing of a semiconductor device.

Figure 38:
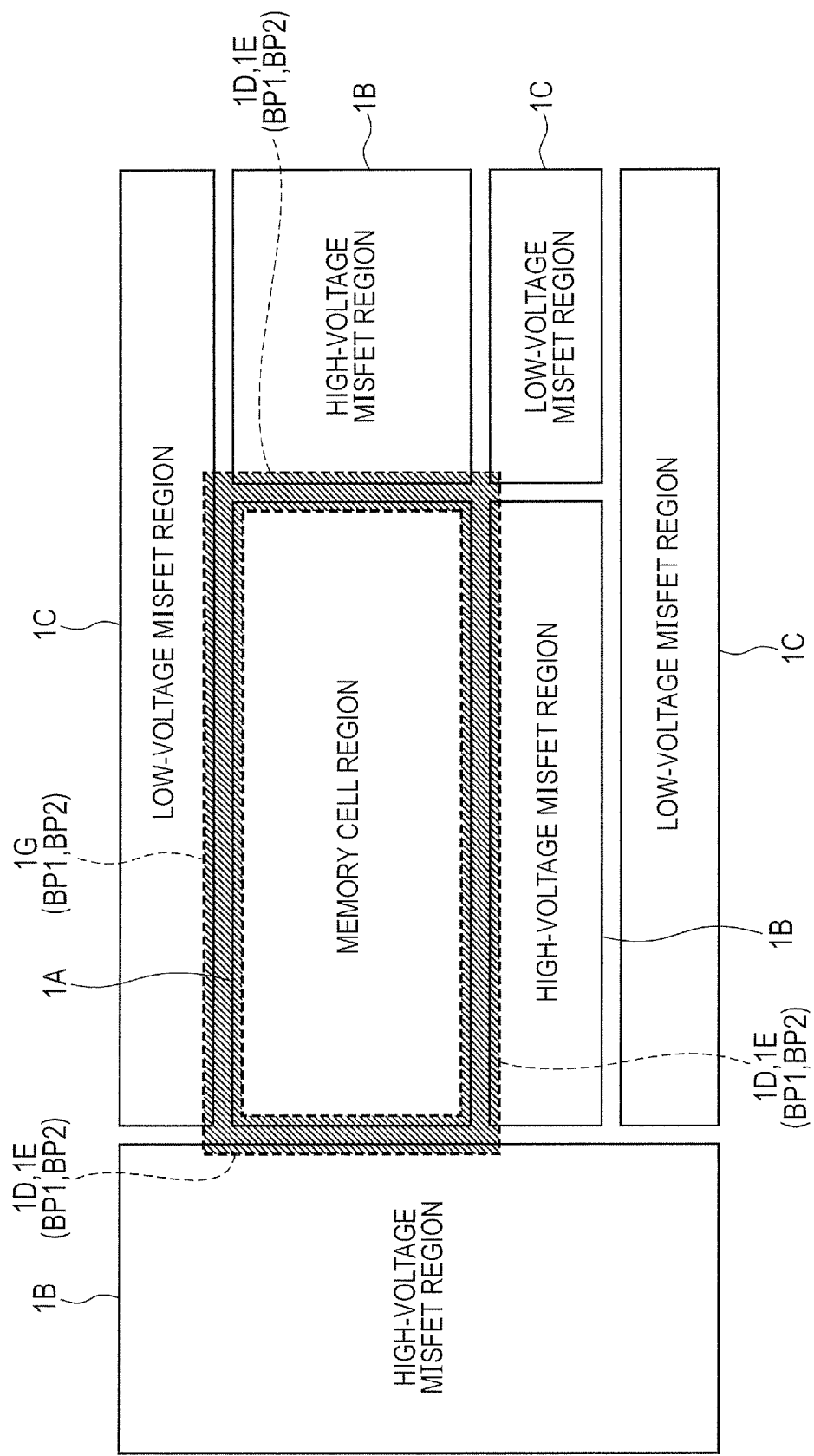
FIG. 38 shows a layout configuration Example of the semiconductor device of First Embodiment.

FIG. 38 shows the layout configuration example of the semiconductor device of First Embodiment.

As shown in FIG. 38, in the semiconductor device of First Embodiment, the film portions BP1 and BP2 are formed not between the high-voltage MISFET region 1B and the low-voltage MISFET region 1C but between the memory cell region 1A and the high-voltage MISFET region 1B. As described above, an increase in the width of a boundary region between a region in which the conductive film 4 is replaced by the metal film 14 and the conductive film 15 and a region in which the conductive film 4 is not replaced by the metal film 14 and the conductive film 15 leads to an increase the width of the boundary regions 1D and 1E between the memory cell region 1A and the high-voltage MISFET region 1B in the semiconductor device of First Embodiment. The width of the boundary region 1F (refer to FIG. 37) between the high-voltage MISFET region 1B and the low-voltage MISFET region 1C does not increase.

As described above, the high-voltage MISFET region 1B and the low-voltage MISFET region 1C are adjacent to each other in extremely many parts of a semiconductor chip, but the memory cell region 1A is not so frequently adjacent to the high voltage MISFET region 1B in the semiconductor chip. The boundary regions 1D and 1E between the memory cell region 1A and the high-voltage MISFET region 1B therefore do not extend over a long distance in the semiconductor chip and the proportion of an area of the boundary regions 1D and 1E in the semiconductor chip does not increase. For example, when the boundary regions 1D and 1E need a width of from about 0.5 to 1.0 μm, the proportion of an area of the boundary regions 1D and 1E in the semiconductor chip does not increase so much.

The semiconductor device of First Embodiment can therefore be prevented from having a complicated planar shape, which facilitates designing of the planar layout of the semiconductor device of First Embodiment.

In the manufacturing steps of the semiconductor device of First Embodiment, after formation of the control gate electrode CG and the memory gate electrode MG, insulating films 11 and 12 included in the gate insulating films GIH and GIL are formed. The thickness of each of the gate insulating films GIH and GIL can therefore be controlled precisely, leading to improvement in uniformity of the thickness between any two of the gate insulating films GIH and uniformity of thickness between any two of the gate insulating films GIL.

Second Embodiment

In the manufacturing steps of the semiconductor device of First Embodiment, the insulating film 11 is formed before formation of the control gate electrode CG and the memory gate electrode MG. In the manufacturing steps of a semiconductor device of Second Embodiment, on the other hand, the insulating film 11 is formed prior to formation of the control gate electrode CG and the memory gate electrode MG.

The semiconductor device of Second Embodiment is substantially similar to that of First Embodiment so that a description on it is omitted.

<Manufacturing Method of Semiconductor Device>

Figure 39:
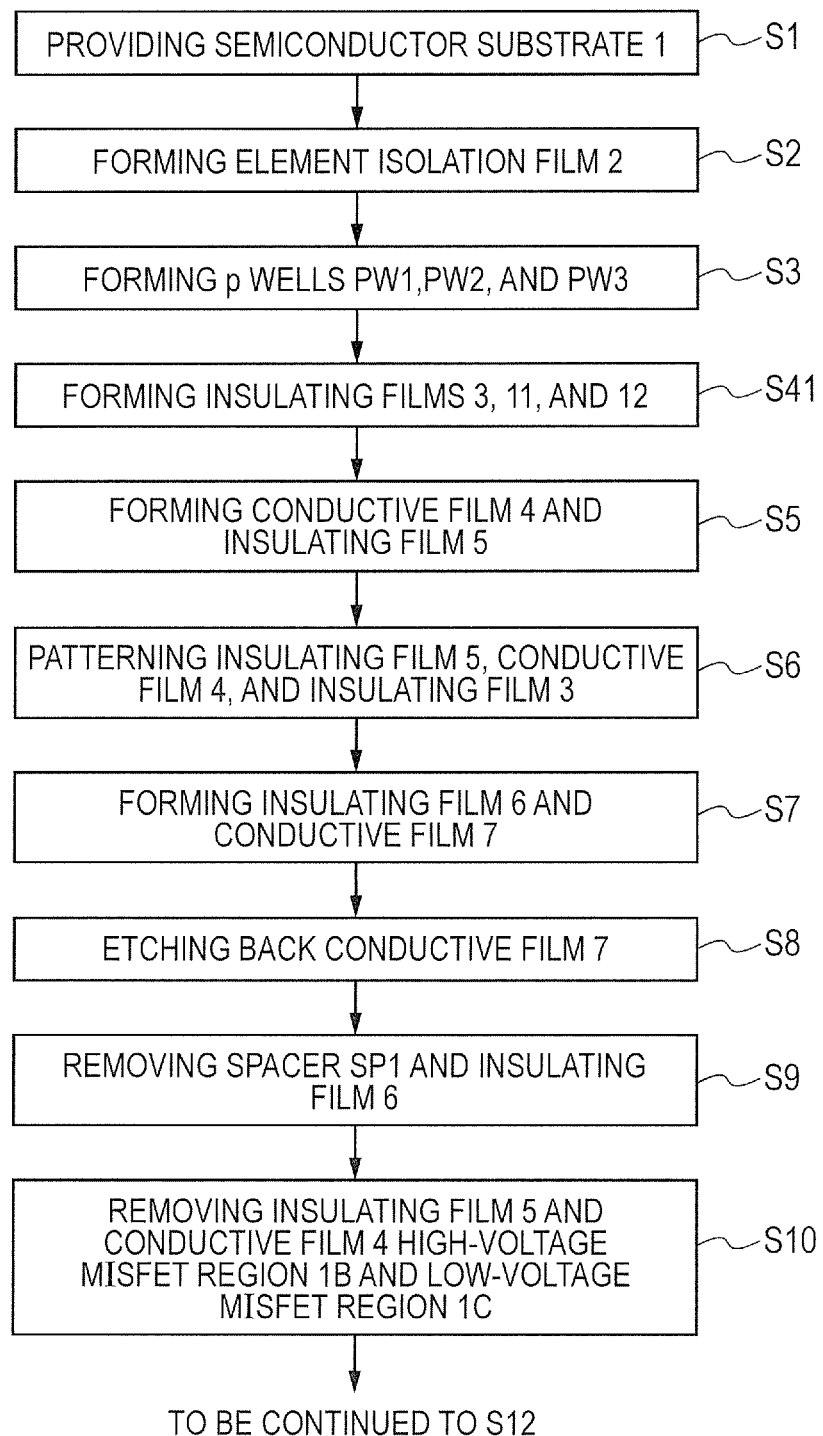
FIG. 39 is a process flow chart showing some of manufacturing steps of a semiconductor device of Second Embodiment.

FIG. 39 is a process flow chart showing some manufacturing steps of the semiconductor device of Second Embodiment. FIGS. 40 to 51 are fragmentary cross-sectional views of the semiconductor device of Second Embodiment during manufacturing steps thereof. The cross-sectional views of FIGS. 40 to 51 each include a fragmentary cross-sectional view of the memory cell region 1A, the high-voltage MISFET region 1B, and the low-voltage MISFET region 1C. In addition, the cross-sectional views of FIGS. 40 to 51 each include a fragmentary cross-sectional view of the boundary regions 1D, 1E, and 1F.

Figure 47:
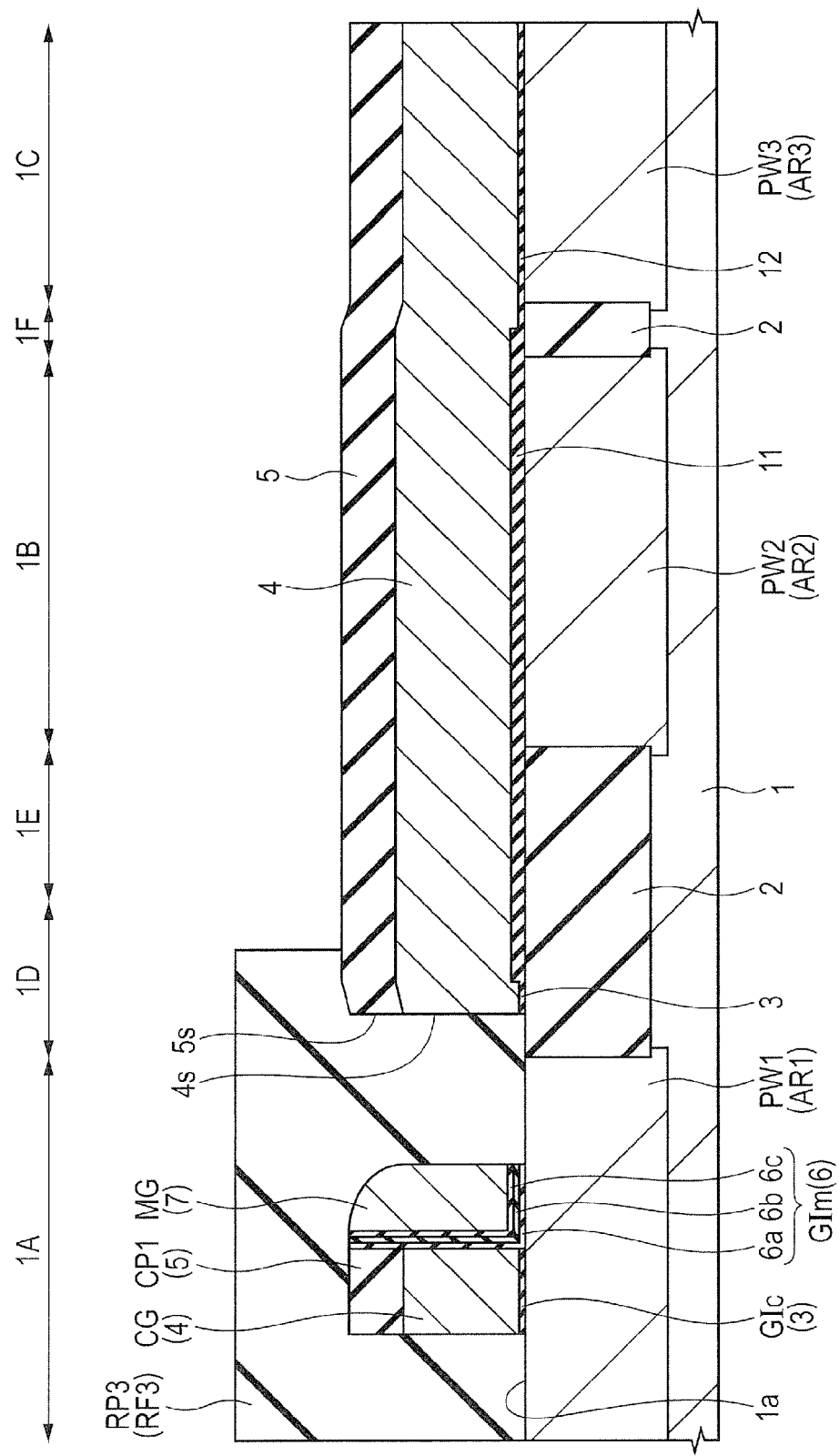
FIG. 47 is a fragmentary cross-sectional view of the semiconductor device of Second Embodiment during a manufacturing step thereof.
Figure 48:
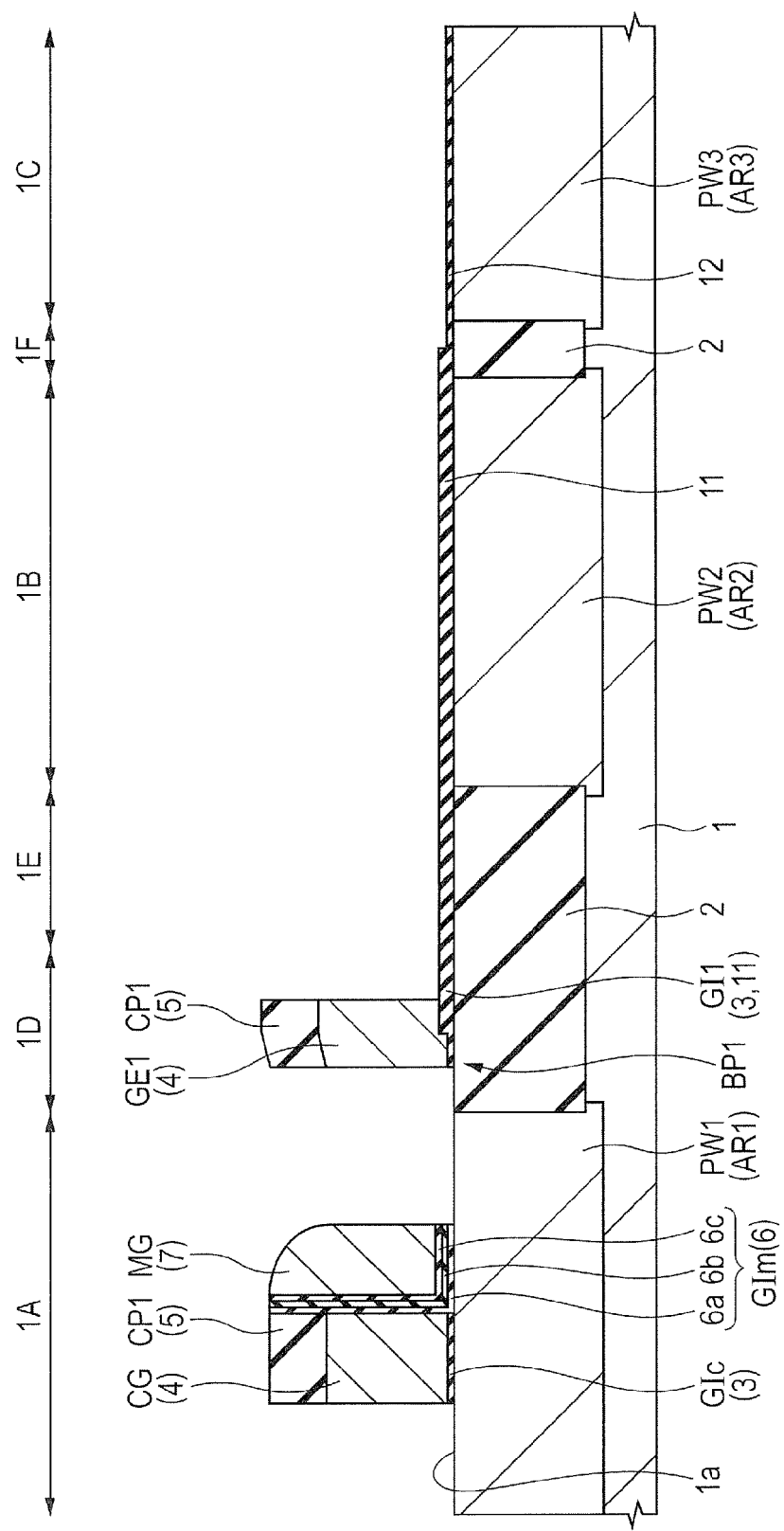
FIG. 48 is a fragmentary cross-sectional view of the semiconductor device of Second Embodiment during a manufacturing step thereof.
Figure 49:
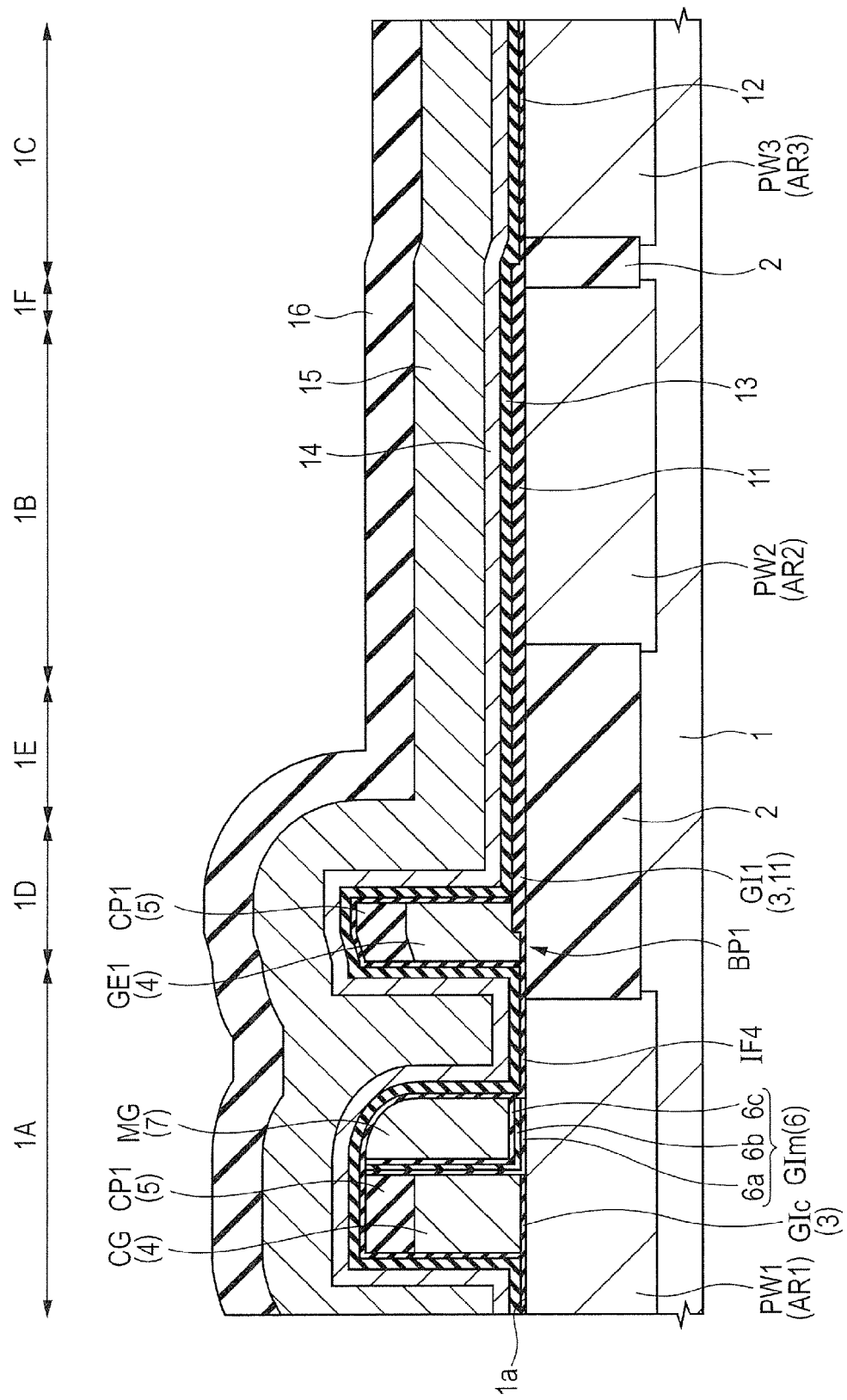
FIG. 49 is a fragmentary cross-sectional view of the semiconductor device of Second Embodiment during a manufacturing step thereof.
Figure 50:
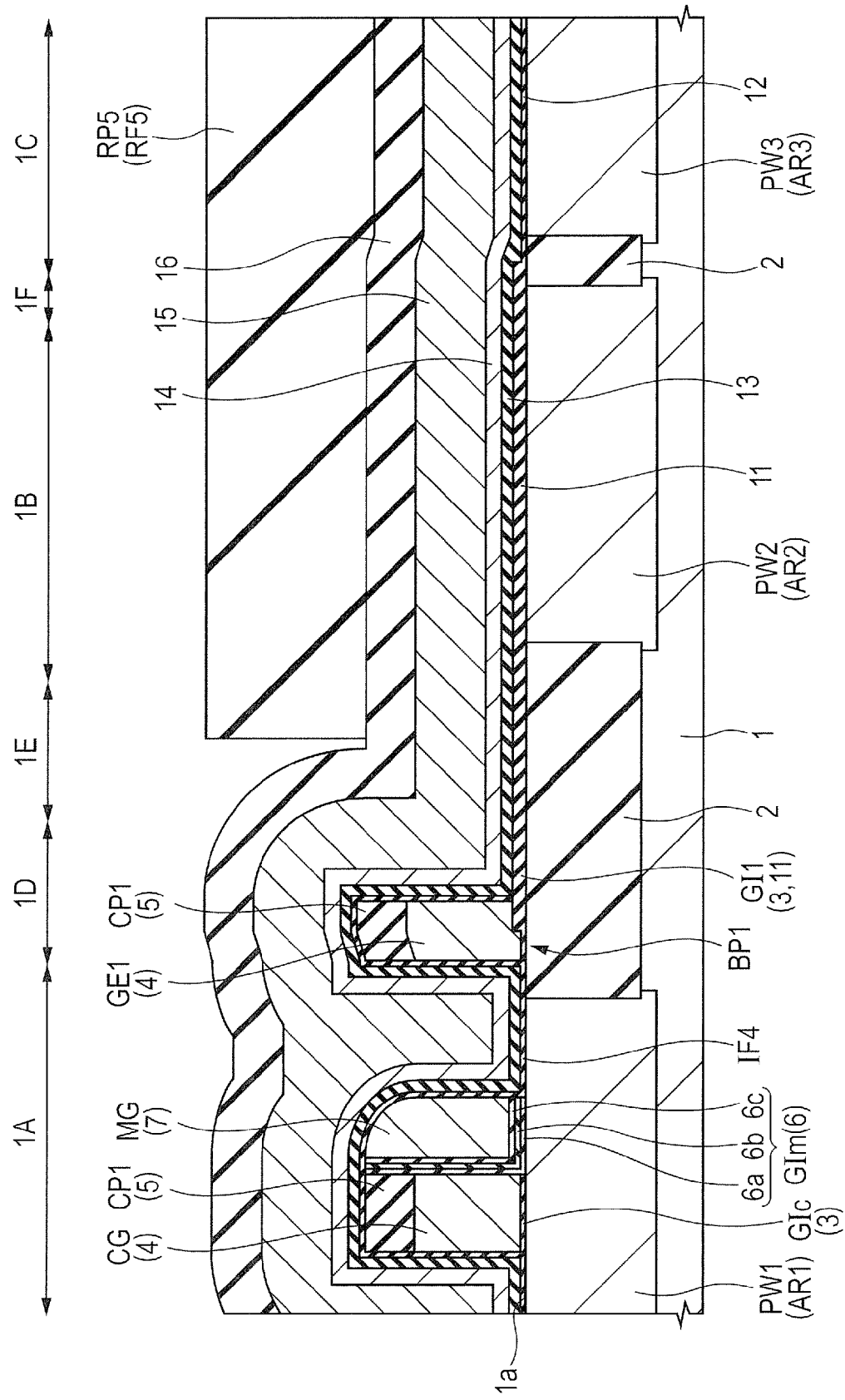
FIG. 50 is a fragmentary cross-sectional view of the semiconductor device of Second Embodiment during a manufacturing step thereof.
Figure 51:
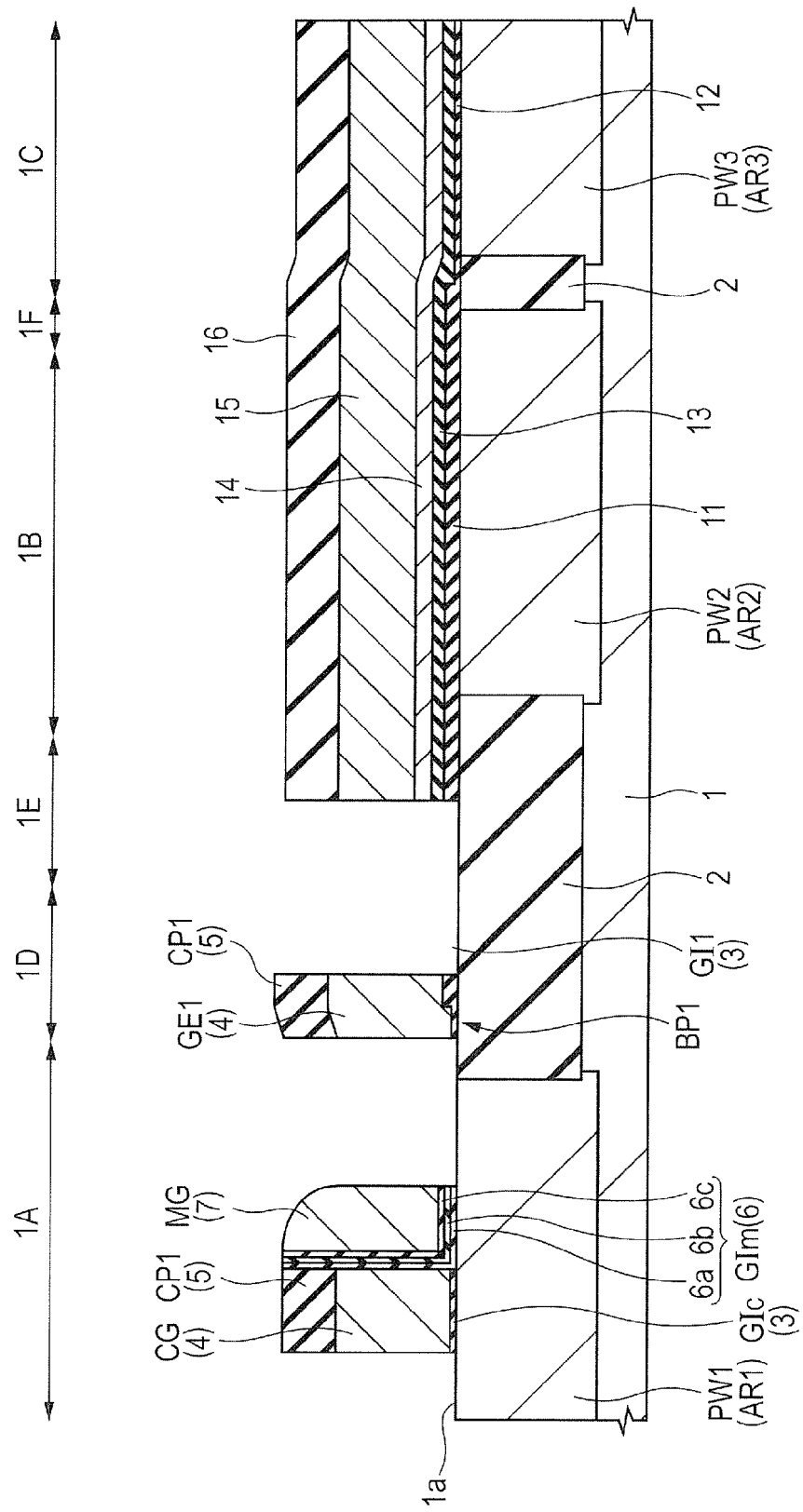
FIG. 51 is a fragmentary cross-sectional view of the semiconductor device of Second Embodiment during a manufacturing step thereof.

The width of the boundary regions 1D and 1E In FIGS. 49 to 51 is greater than the width of the boundary regions 1D and 1E in FIGS. 40 to 48.

The cross-sectional views of FIGS. 40 to 51 show, as one example, the memory cell region 1A and the high voltage MISFET region 1B adjacent to each other and the high-voltage MISFET region 1B and the low-voltage MISFET region 1C adjacent to each other. At this time, the boundary region 1D is placed between the memory cell region 1A and the high-voltage MISFET region 1B adjacent to each other and the boundary region 1E is placed between the boundary region 1D and the high-voltage MISFET region 1B.

Figure 40:
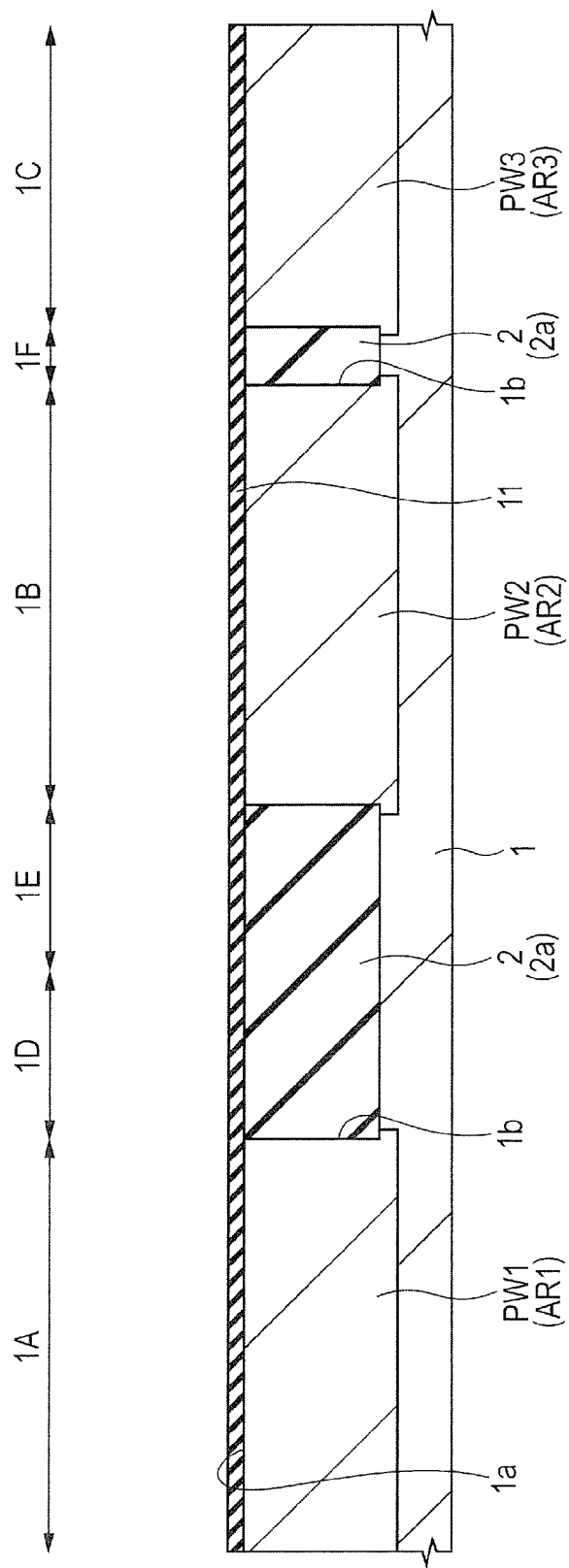
FIG. 40 is a fragmentary cross-sectional view of the semiconductor device of Second Embodiment during a manufacturing step thereof.
Figure 41:
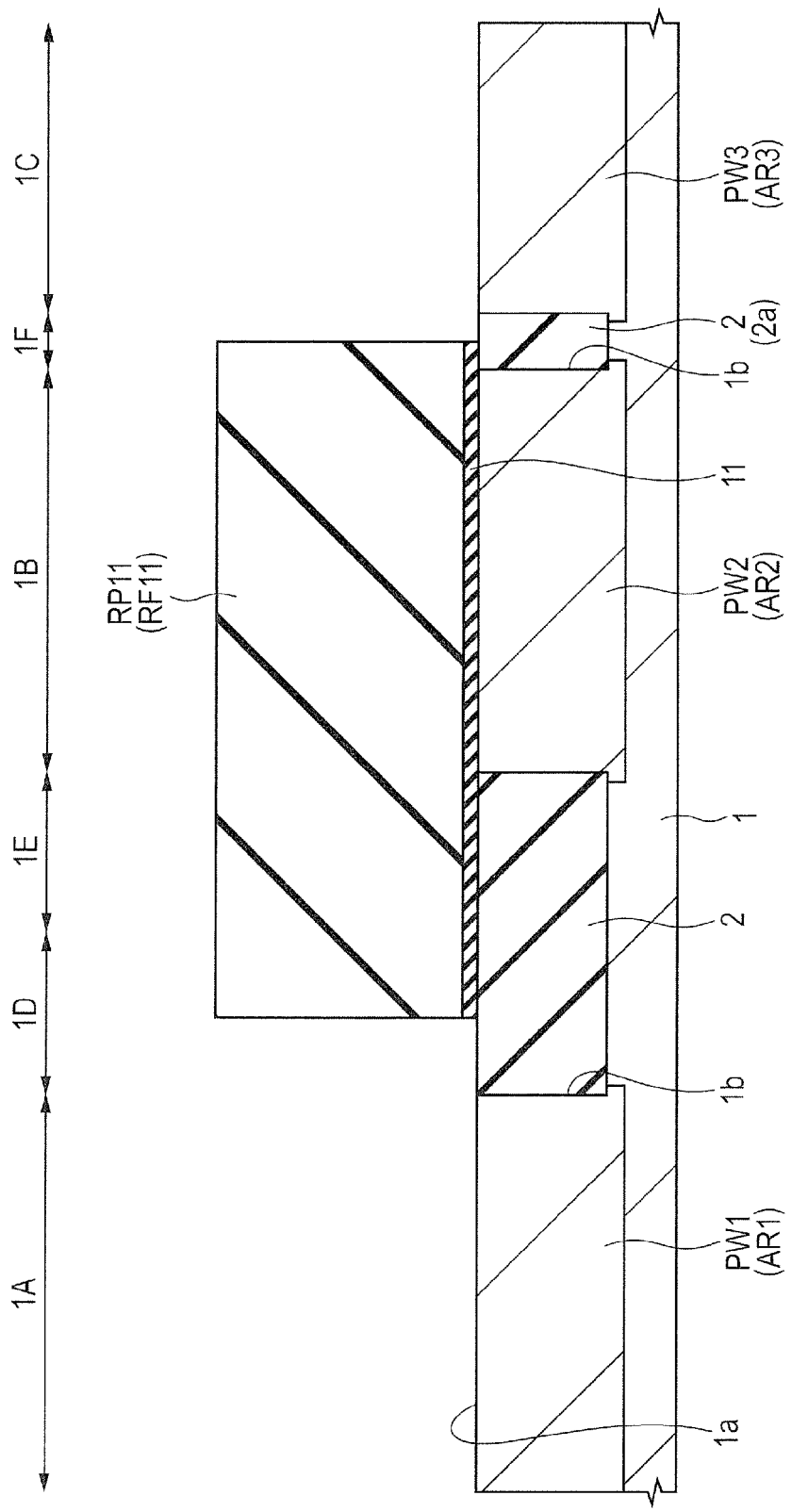
FIG. 41 is a fragmentary cross-sectional view of the semiconductor device of Second Embodiment during a manufacturing step thereof.
Figure 42:
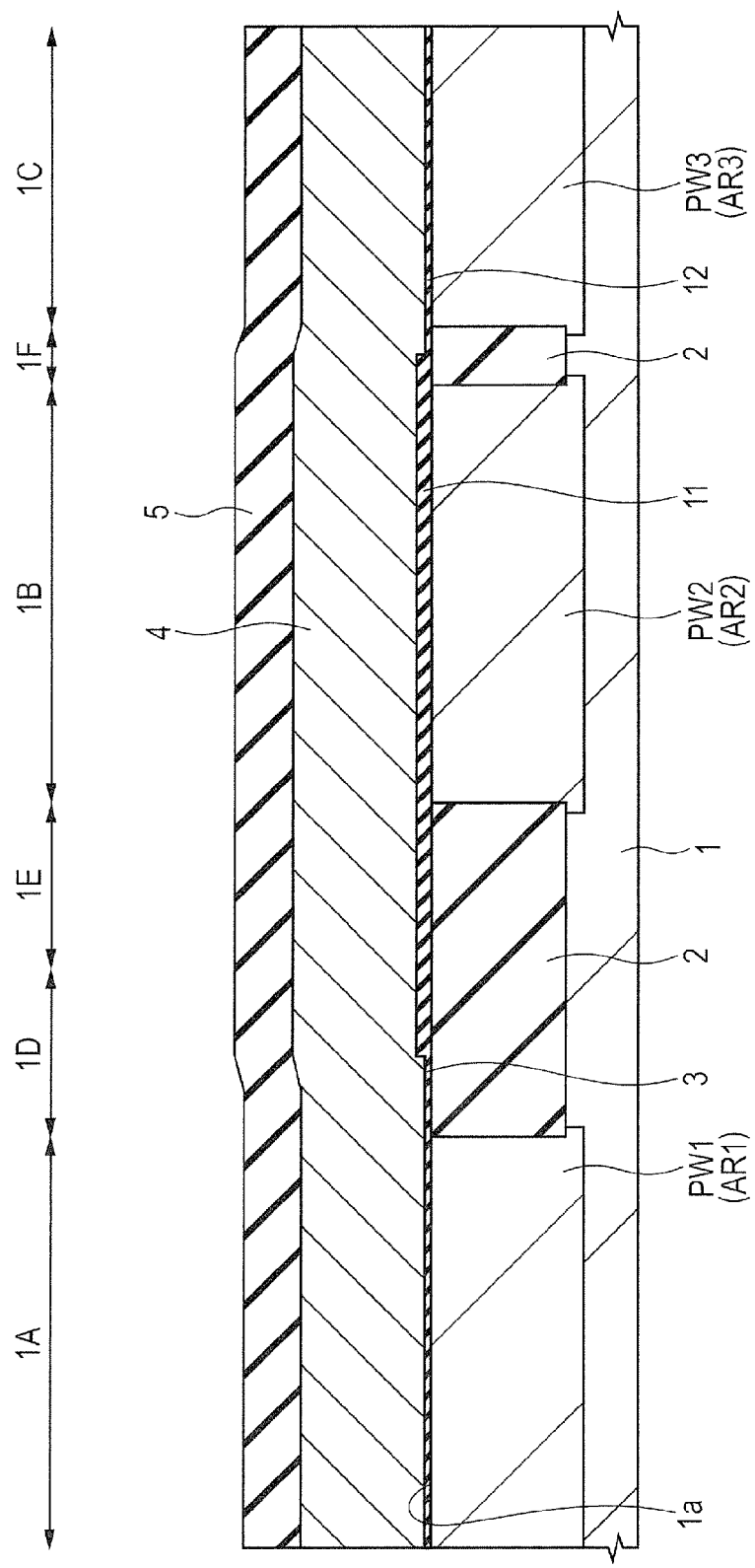
FIG. 42 is a fragmentary cross-sectional view of the semiconductor device of Second Embodiment during a manufacturing step thereof.

In the manufacturing steps of the semiconductor device of Second Embodiment, steps (Step S1 to S3 in FIG. 39) similar to Step S1 to Step S3 in FIG. 3 are performed to form p wells PW1, PW2, and PW3 as shown in FIG. 40 and then, insulating films 3, 11, and 12 are formed as shown in FIGS. 40 to 42 (Step S41 in FIG. 39).

In Step S41, first, as shown in FIG. 40, an insulating film 11 is formed on the main surface 1a of the semiconductor substrate 1 in the memory cell region 1A, the high voltage MISFET region 1B, and the low-voltage MISFET region 1C. Also in the boundary regions 1D, 1E, and 1F, the insulating film 11 is formed on the main surface 1a of the semiconductor substrate 1. The thickness of the insulating film 11 can be set, for example, at about 15 nm. A step of forming the insulating film 11 can be performed in a manner similar to the step (Step S11 in FIG. 3) of forming the insulating film 11 described referring to FIG. 12 in First Embodiment.

In Step S41, next, as shown in FIG. 41, a resist film RF11 is formed on the insulating film 11. By photolithography, an opening portion penetrating the resist film RF11 and reaching the insulating film 11 is formed and a resist pattern RP11 including the resist film RF11 having the opening portion therein is formed. At this time, the insulating film 11 is exposed from the resist film RF11 in the memory cell region 1A and the low-voltage MISFET region 1C and the insulating film 11 is covered with the resist film RF11 in the high-voltage MISFET region 1B and the boundary regions 1D and 1E.

In Step S41, next, as shown in FIG. 41, with the resist pattern RP11 as an etching mask, the insulating film 11 is patterned by etching, for example, dry etching. By this patterning, the insulating film 11 is removed from the memory cell region 1A and the low-voltage MISFET region 1C and the insulating film 11 is left in the high-voltage MISFET region 1B and the boundary regions 1D and 1E. Then, the resist pattern RP11, that is, the resist film RF11 is removed.

In Step S41, next, as shown in FIG. 42, an insulating film 3 is formed on the main surface 1a of the semiconductor substrate 1 in the memory cell region 1A and an insulating film 12 is formed in the same layer as that of the insulating film 3 on the main surface 1a of the semiconductor substrate 1 in the low-voltage MISFET region 1C. The thickness of the insulating film 3 can be set, for example, at from 2 to 3 nm, while the thickness of the insulating film 12 can be set, for example, at from 1 to 2 nm. The step of forming the insulating films 3 and 12 can be performed in a manner similar to the step (Step 4 in FIG. 3) of forming the insulating film 3 described referring to FIG. 6 in First Embodiment.

It is to be noted that in Step S41, the thickness of the insulating film 12 is made equal to that of the insulating film 3 and by a step described later referring to FIG. 49, the insulating film 12 can be formed by a step different from Step S41 by forming the insulating film 12 again.

Next, a step similar to Step S5 in FIG. 3 is performed to form a conductive film 4 and an insulating film 5 on the insulating films 3, 11, and 12 as shown in FIG. 42 (Step S5 in FIG. 39). At this time, the conductive film 4 that covers the insulating films 11 and 12 is formed on the semiconductor substrate 1 in the high-voltage MISFET region 1B and the low-voltage MISFET region 1C.

Figure 43:
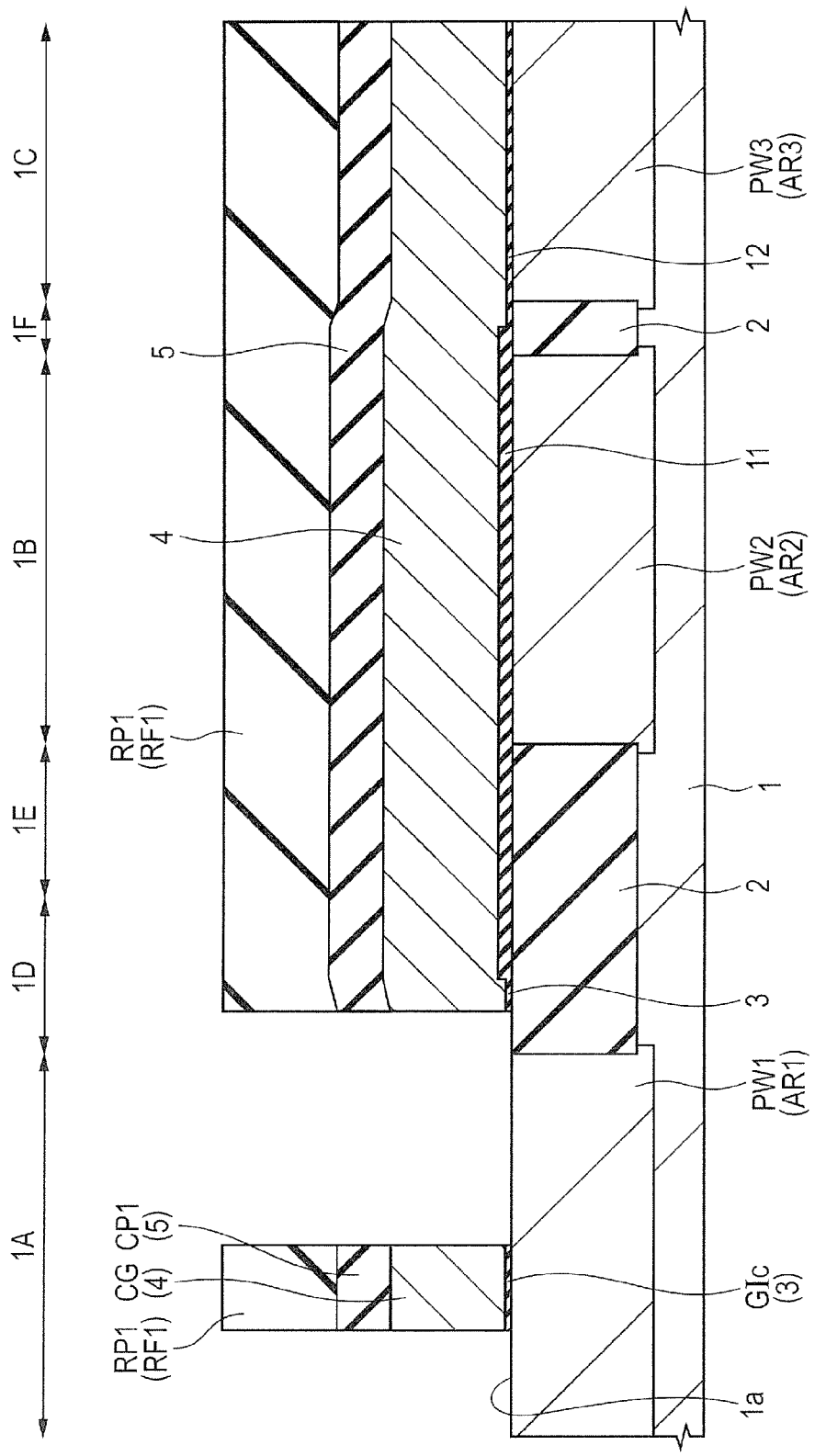
FIG. 43 is a fragmentary cross-sectional view of the semiconductor device of Second Embodiment during a manufacturing step thereof.

Next, as shown in FIG. 43, a step similar to that of Step S6 in FIG. 3 is performed to pattern the insulating film 5, the conductive film 4, and the insulating film 3 with the resist pattern RP1 including the resist film RF1 as an etching mask (Step S6 in FIG. 39).

By this patterning, in the memory cell region 1A, a gate insulating film GIc including the insulating film 3 on the semiconductor substrate 1, that is, on the p well PW1 is formed and a control gate electrode CG including the conductive film 4 on the gate insulating film GIc is formed. A cap insulating film CP1 including the insulating film 5 on the control gate electrode CG may be formed.

In the high-voltage MISFET region 1B and the low-voltage MISFET region 1C, on the other hand, the insulating film 5, the conductive film 4, and the insulating films 11 and 12 are left. In addition, the insulating film 5, the conductive film 4, and the insulating films 11 and 12 are left in a portion of the boundary regions 1D and 1E where a gate electrode GE1 (refer to FIG. 48 described later) is to be formed and in a portion of these regions on the side opposite to the memory cell region 1A with respect to the portion where a gate electrode GE1 is to be formed.

Figure 44:
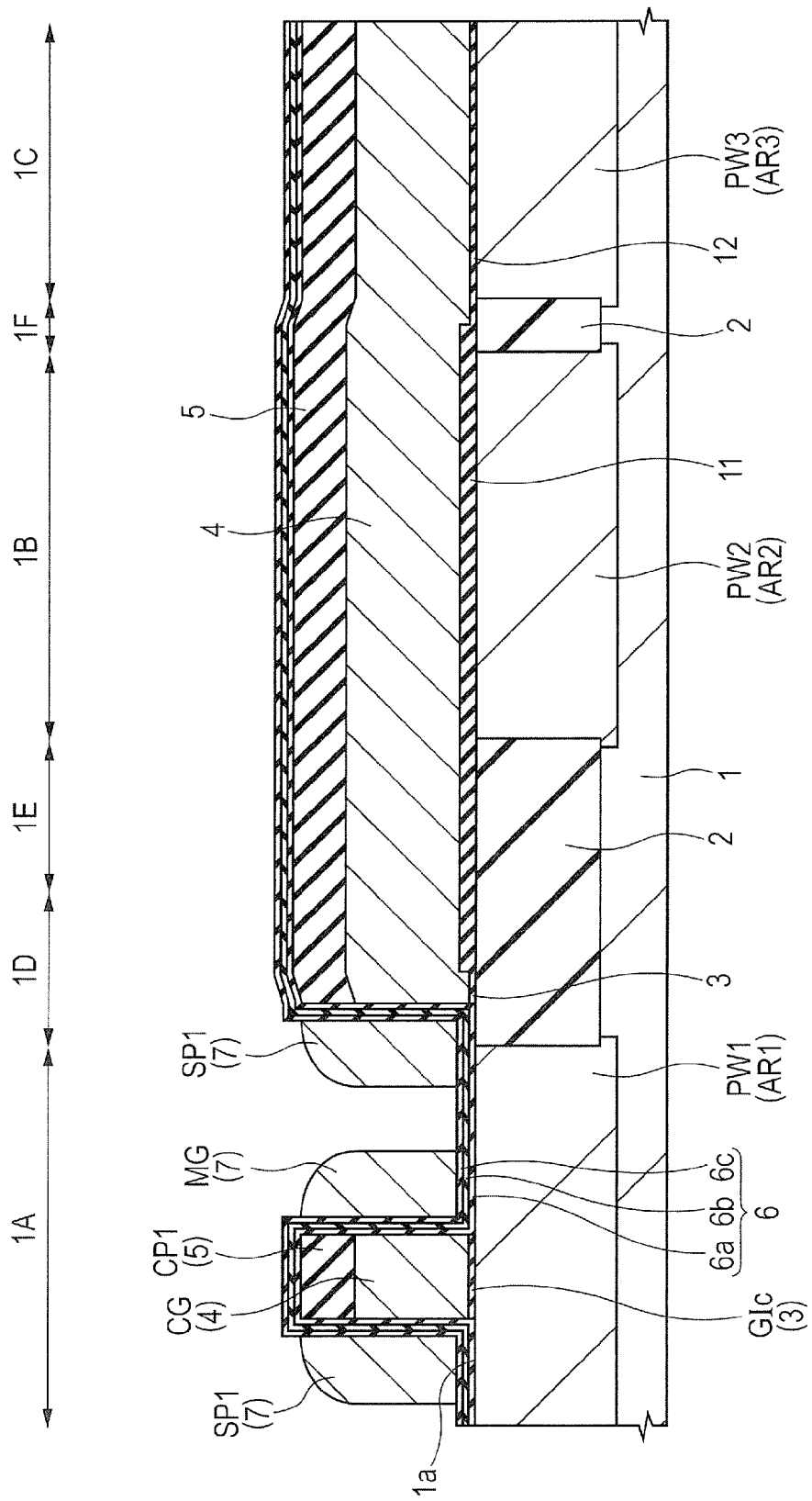
FIG. 44 is a fragmentary cross-sectional view of the semiconductor device of Second Embodiment during a manufacturing step thereof.

Next, the conductive film 7 is etched back as shown in FIG. 44 by performing steps (Step S7 and Step S8 in FIG. 39) similar to Step S7 and Step S8 in FIG. 3. By these steps, in the memory cell region 1A, a memory gate electrode MG and a spacer SP1 made of the conductive film 7 left in sidewall spacer form via the insulating film 6 are formed on the side wall on both sides of the control gate electrode CG.

Figure 45:
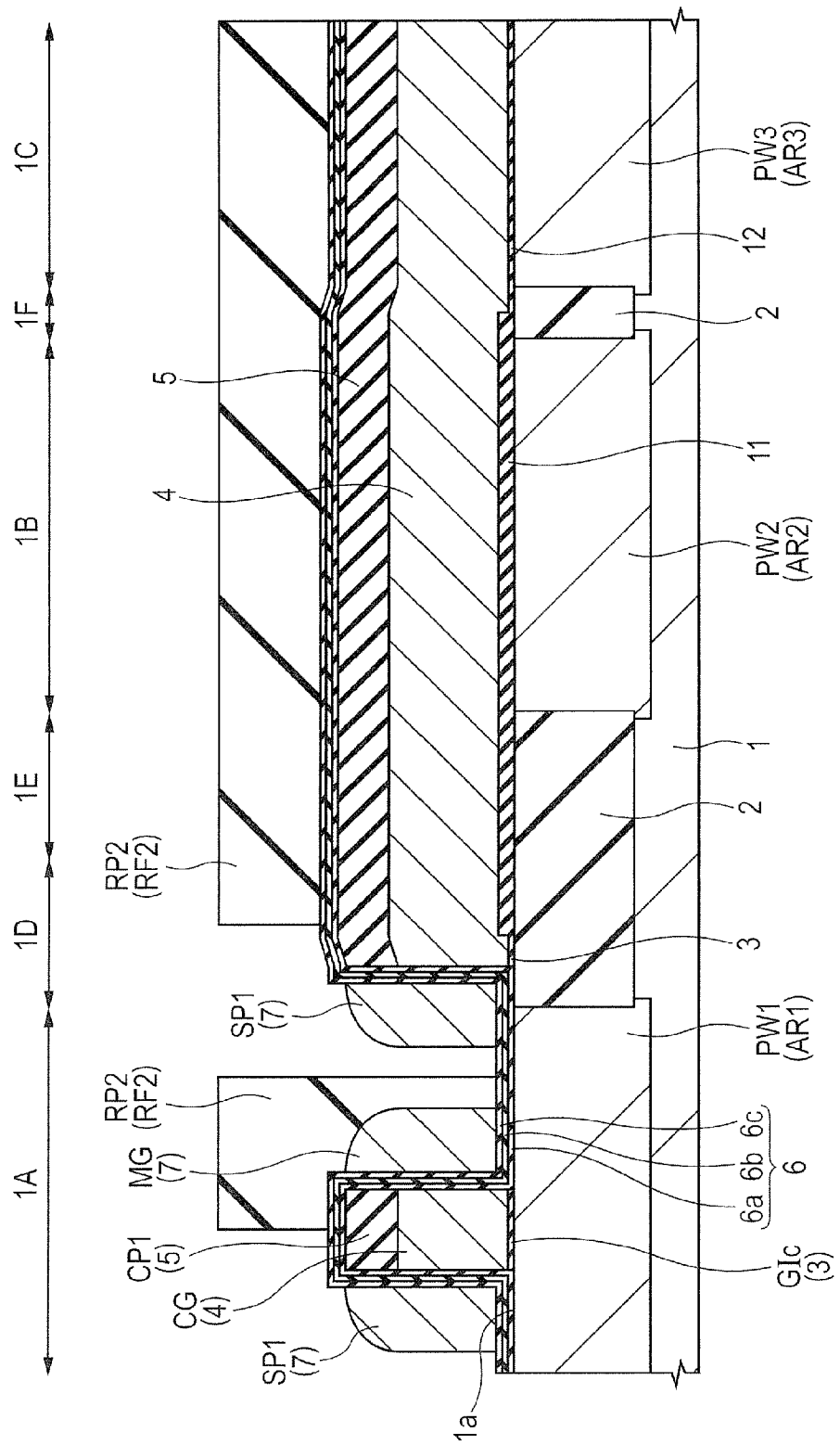
FIG. 45 is a fragmentary cross-sectional view of the semiconductor device of Second Embodiment during a manufacturing step thereof.
Figure 46:
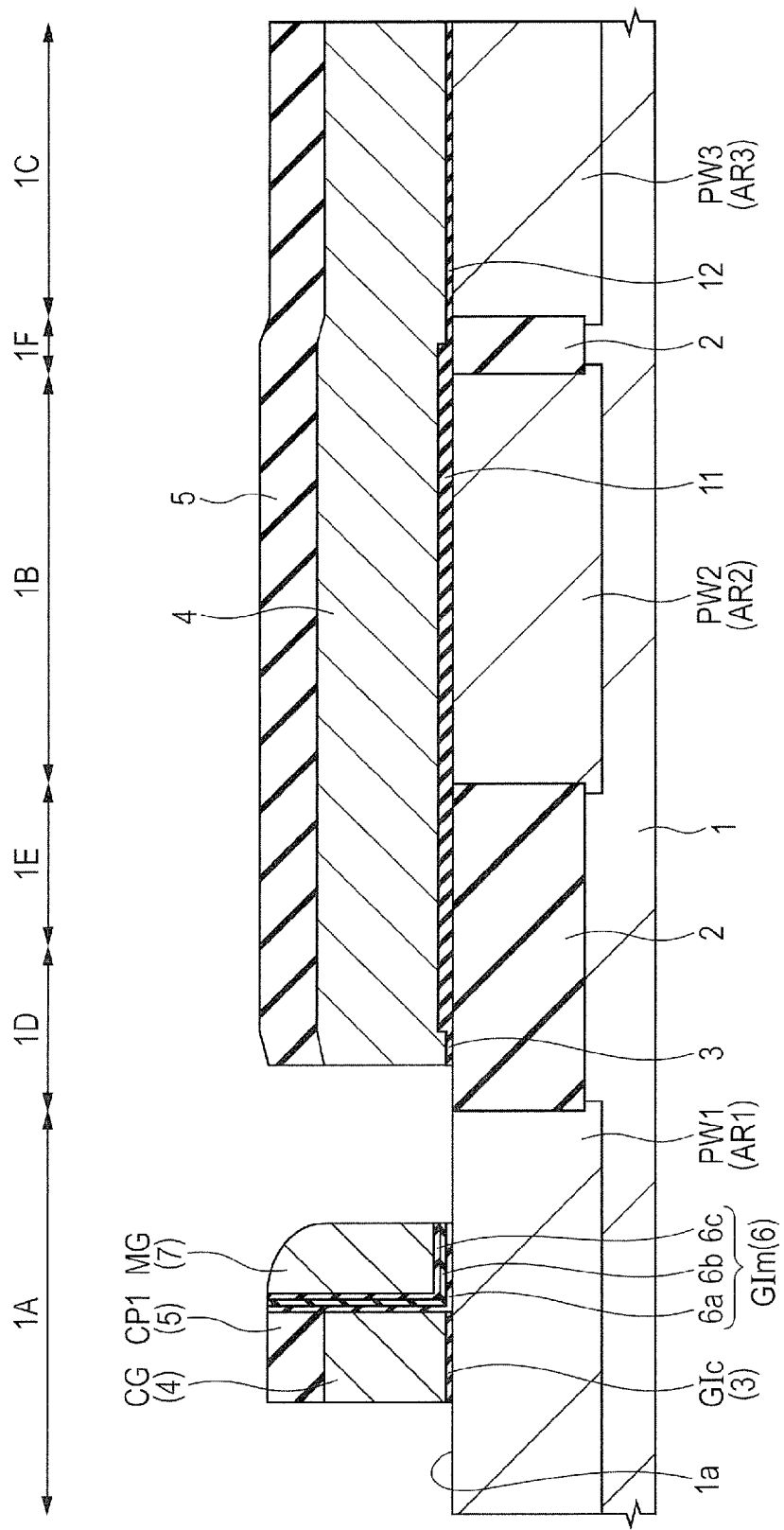
FIG. 46 is a fragmentary cross-sectional view of the semiconductor device of Second Embodiment during a manufacturing step thereof.

Next, a step similar to Step S9 in FIG. 3 is performed to remove the spacer SP1 and the insulating film 6 as shown in FIGS. 45 and 46 (Step S9 in FIG. 39). Described specifically, as shown in FIG. 45, a resist pattern RP2 including a resist film RF2 that covers the memory gate electrode MG and exposes the spacer SP1 is formed on the semiconductor substrate 1 by photolithography. By dry etching with the resulting resist pattern RP2 as an etching mask, the spacer SP1 is removed as shown in FIG. 46. At this time, a gate insulating film GIm including a portion of the insulating film 6 left between the memory gate electrode MG and the p well PW1 and a portion of it left between the memory gate electrode MG and the control gate electrode CG is formed in the memory cell region 1A.

Next, a step similar to Step S10 in FIG. 3 is performed to remove the insulating film 5 and the conductive film 4 from the high-voltage MISFET region 1B and the low-voltage MISFET region 1C as shown in FIGS. 47 and 48 (Step S10 in FIG. 39).

In Step S10, first, as shown in FIG. 47, a resist pattern RP3 including a resist film RF3 is formed. Then, as shown in FIG. 48, the insulating film 5 and the conductive film 4 are patterned by etching, for example, dry etching, with the resist pattern RP3 as an etching mask. By this patterning, a film portion BP1 including the gate insulating film GI1 and the gate electrode GE1 is formed in the boundary region 1D. A cap insulating film CP1 including the insulating film 5 on the gate electrode GE1 may be formed. On the other hand, the insulating films 11 and 12 are left in the high-voltage MISFET region 1B and the low-voltage MISFET region 1C.

In Second Embodiment, different from First Embodiment, the insulating films 11 and 12 have already been formed so that steps similar to Step S12 and Step S13 in FIG. 4 are performed to form an insulating film 13, a metal film 14, a conductive film 15, and an insulating film 16 as shown in FIG. 49. Prior to formation of the insulating film 13, an insulating film IF4 made of, for example, a silicon oxide film may be formed on the main surface 1a of the semiconductor substrate 1 in the memory cell region 1A and the boundary region 1D.

In Step S10, during etching of the insulating film 5 and the conductive film 4, it is desired to precisely control, after removal of the conductive film 4, the stop timing of etching to avoid a decrease in the thickness of the insulating film 11 in the high-voltage MISFET region 1B. Also in Step S10, during etching of the insulating film 5 and the conductive film 4, it is desired to precisely control, after removal of the conductive film 4, the stop timing of etching to avoid removal of the insulating film 12 from the low-voltage MISFET region 1C.

Alternatively, in Step S10, the insulating film 12 may be removed from the low-voltage MISFET region 1C by continuing etching even after removal of the conductive film 4. In such a case, when an insulating film 13, a metal film 14, a conductive film 15, and an insulating film 16 are formed as shown in FIG. 49 by performing steps similar to Step S12 and Step S13 in FIG. 4, the insulating film 12 may be formed again on the main surface of the semiconductor substrate 1 in the low-voltage MISFET region 1C before formation of the insulating film 13.

In the manufacturing steps of the semiconductor device of First Embodiment, the insulating film 11 is formed after formation of the control gate electrode CG and the memory gate electrode MG. As described above, therefore, there is a possibility of a bird's beak being formed between the memory gate electrode MG and the semiconductor substrate 1 when only thermal oxidation is used for the formation of the insulating film 11.

In the manufacturing steps of the semiconductor device of Second Embodiment, on the other hand, the insulating film 11 may be formed before formation of the control gate electrode CG and the memory gate electrode MG. Even when the insulating film 11 is formed only by thermal oxidation, formation of a bird's beak between the memory gate electrode MG and the semiconductor substrate 1 can be prevented.

Next, a step similar to Step S14 in FIG. 4 is performed to pattern the insulating film 16, the conductive film 15, the metal film 14, and the insulating film 13.

In Step S14, first, as shown in FIG. 50, a resist pattern RP5 including a resist film RF5 is formed.

In Step S14, next, as shown in FIG. 51, the insulating film 16, the conductive film 15, the metal film 14, and the insulating film 13 are patterned by etching, for example, dry etching, with the resist pattern RP5 as an etching mask.

By this patterning, the insulating film 16, the conductive film 15, the metal film 14, and the insulating film 13 are removed from the memory cell region 1A, the boundary region 1D, and a portion of the boundary region 1E on the side of the memory cell region 1A with respect to a portion of the region where the film portion BP2 (refer to FIG. 18) is to be formed. On the other hand, the insulating film 16, the conductive film 15, the metal film 14, and the insulating film 13 are left in the high-voltage MISFET region 1B, the low-voltage MISFET region 1C, the boundary region 1F, a portion of the boundary region 1E where the film portion BP2 is to be formed, and a portion of the boundary region 1E on the side opposite to the side of the memory cell region 1A with respect to the portion of the region where the film portion BP2 is to be formed. Then, the resist pattern RP5, that is, the resist film RF5 is removed.

In Step S14, next, as shown in FIG. 17, a resist pattern RP6 including a resist film RF6 is formed.

In Step S14, next, as shown in FIG. 18, the insulating film 16, the conductive film 15, the metal film 14, and the insulating film 13 are patterned by etching, for example, dry etching, with the resist pattern RP6 as an etching mask.

By this patterning, a gate insulating film GIH and a gate electrode GEH are formed in the high-voltage MISFET region 1B and a gate insulating film GIL, a metal film portion 14a, and a conductive film portion 15a are formed in the low-voltage MISFET region 1C. In the boundary region 1E, a gate insulating film GI2 and a gate electrode GE2 are formed and a film portion BP2 including the gate insulating film GI2 and the gate electrode GE2 is formed.

Next, similar to First Embodiment, Step S15 in FIG. 4 to Step S27 in FIG. 5 and steps thereafter are performed to manufacture a semiconductor device of Second Embodiment.

Main Characteristics and Advantages of the Present Embodiment

Manufacturing steps of the semiconductor device of Second Embodiment have steps similar to those of the semiconductor device of First Embodiment. The semiconductor device of Second Embodiment has a structure similar to that of the semiconductor device of First Embodiment. Also in the manufacturing steps of Second Embodiment similar to the manufacturing steps of First Embodiment, therefore, occurrence of dishing in the high-voltage MISFET region 1B can be prevented or suppressed when the conductive film 26 (refer to FIG. 31) is polished, for example, by CMP. As a result, the present embodiment can provide a semiconductor device having improved performance. In addition, it facilitates manufacture of a smaller semiconductor device.

Also in Second Embodiment similar to First Embodiment, the proportion of an area of the boundary regions 1D and 1E in the semiconductor chip does not become large and the planar layout of the semiconductor device of Second Embodiment does not become so complicated so that the planar layout of the semiconductor device of Second Embodiment can be designed easily.

In the manufacturing steps of the semiconductor device of Second Embodiment different from those of the semiconductor device of First Embodiment, an insulating film 11 is formed before formation of the control gate electrode CG and the memory gate electrode MG. Even when the insulating film 11 is formed only by thermal oxidation, formation of a bird's beak between the memory gate electrode MG and the semiconductor substrate 1 can be prevented. This leads to reduction in the influence of a bird's beak on the memory cell MC.

The invention made by the present inventors has been described specifically based on some embodiments. It is however needless to say that the invention is not limited by these embodiments and the invention can be changed in various ways without departing from the gist of the invention.

What is claimed is:

1. A method of manufacturing a semiconductor device, comprising:
    (a) providing a semiconductor substrate,
    (b) forming a first gate insulating film over the semiconductor substrate in a first region of a main surface of the semiconductor substrate, forming a first gate electrode containing silicon over the first gate insulating film, forming a second gate electrode adjacent to the first gate electrode over the semiconductor substrate in the first region, and forming a second gate insulating film having therein a charge storage portion between the second gate electrode and the first gate electrode and between the second gate electrode and the semiconductor substrate;
    (c) forming a first insulating film over the semiconductor substrate in a second region of the main surface of the semiconductor substrate and forming a second insulating film over the semiconductor substrate in a third region of the main surface of the semiconductor substrate;
    (d) after the (b) and the (c), forming a third insulating film over the first insulating film and over the second insulating film;
    (e) forming a first conductive film containing a metal nitride over the third insulating film;
    (f) forming a second conductive film containing silicon over the first conductive film;
    (g) patterning the second conductive film, the first conductive film, the third insulating film, the second insulating film, and the first insulating film and
    thereby forming, in the second region, a third gate insulating film including the first insulating film and the third insulating film over the semiconductor substrate and a third gate electrode including the first conductive film and the second conductive film over the third gate insulating film,
    forming, in the third region, a fourth gate insulating film including the second insulating film and the third insulating film over the semiconductor substrate,
    forming a first film portion including the first conductive film over the fourth gate insulating film, and
    forming a second film portion including the second conductive film over the first film portion;
    (h) after the (g), removing the second film portion to expose the first film portion; and
    (i) after the (h), forming a third conductive film containing a metal over the exposed first film portion and forming, in the third region, a fourth gate electrode including the first film portion and the third conductive film over the fourth gate insulating film, wherein the first insulating film and the second insulating film each has a dielectric constant not higher than that of silicon nitride,
wherein the third insulating film has a dielectric constant higher than that of silicon nitride, and
wherein the second insulating film has a film thickness less than that of the first insulating film.

2. The method of manufacturing a semiconductor device according to claim 1,
wherein the (b) comprises:
    (b1) forming a fourth insulating film over the semiconductor substrate in the first region;
    (b2) forming a fourth conductive film covering the fourth insulating film and containing silicon over the semiconductor substrate in the first region, the second region, and the third region;
    (b3) patterning the fourth conductive film and the fourth insulating film and thereby forming, in the first region, the first gate insulating film including the fourth insulating film and the first gate electrode including the fourth conductive film over the first gate insulating film, while leaving the fourth conductive film in the second region and the third region;
    (b4) after the (b3), forming a fifth insulating film covering the first gate electrode and the fourth conductive film and having a charge storage portion inside over the semiconductor substrate in the first region, the second region, and the third region;
    (b5) forming a fifth conductive film containing silicon over the fifth insulating film;
    (b6) etching back the fifth conductive film and thereby leaving, in the first region, the fifth conductive film over a side surface of the first gate electrode via the fifth insulating film to form the second gate electrode, while removing the fifth conductive film from the second region and the third region;
    (b7) after the (b6), removing the fifth insulating film exposed from the second gate electrode in the first region, the second region, and the third region to form the second gate insulating film including the fifth insulating film between the second gate electrode and the first gate electrode and between the second gate electrode and the semiconductor substrate; and
    (b8) after the (b7), removing the fourth conductive film from the second region and the third region.

3. The method of manufacturing a semiconductor device according to claim 2,
wherein the second region is adjacent to the first region,
wherein in the (b1), the fourth insulating film is formed over the semiconductor substrate in a fourth region of the main surface over the semiconductor substrate which is placed between the first region and the second region,
wherein in the (b2), the fourth conductive film is formed over the semiconductor substrate in the fourth region,
wherein in the (b8), a third film portion including the fourth insulating film and the fourth conductive film over the fourth insulating film is formed in the fourth region,
wherein in the (c), the first insulating film is formed over the semiconductor substrate in a fifth region of the main surface of the semiconductor substrate which is placed between the fourth region and the second region, and
wherein in the (g), a fourth film portion including the first insulating film, the third insulating film over the first insulating film, the first conductive film over the third insulating film, and the second conductive film over the first conductive film is formed in the fifth region.

4. The method of manufacturing a semiconductor device according to claim 3, further comprising:
(j) forming, in the fourth region and the fifth region, an element isolation trench in the main surface of the semiconductor substrate; and
(k) forming an element isolation film including a sixth insulating film that has filled the element isolation trench,
wherein in the (b1), the fourth insulating film is formed over the element isolation film, and
wherein in the (c), the first insulating film is formed over the element isolation film in the fifth region.

5. The method of manufacturing a semiconductor device according to claim 2,
wherein in the (b1), the fourth insulating film is formed over the semiconductor substrate in the second region and the third region,
wherein in the (b3), the fourth insulating film is left in the second region and the third region,
wherein in the (b8), the fourth insulating film is removed from the second region and the third region, and
wherein in the (c), the first insulating film and the second insulating film are formed after the (b8).

6. The method of manufacturing a semiconductor device according to claim 2,
wherein in the (c), the first insulating film and the second insulating film are formed before the (b2),
wherein in the (b2), the fourth conductive film that covers the first insulating film and the second insulating film is formed over the semiconductor substrate in the second region and the third region,
wherein in the (b3), the first insulating film and the second insulating film are left in the second region and the third region, and
wherein in the (b8), the first insulating film and the second insulating film are left in the second region and the third region.

7. The method of manufacturing a semiconductor device according to claim 1, further comprising:

(l) after the (i), forming a first metal silicide layer over the first gate electrode, a second metal silicide layer over the second gate electrode, and a third metal silicide layer over the third gate electrode.

8. The method of manufacturing a semiconductor device according to claim 1,
wherein the (h) comprises:
(h1) forming a seventh insulating film that covers the second film portion;
(h2) polishing the seventh insulating film to expose the upper surface of the second film portion; and
(h3) after the (h2), removing the second film portion to form a trench and expose the first film portion from the bottom portion of the trench.

9. The method of manufacturing a semiconductor device according to claim 2,
wherein the fifth insulating film includes a first silicon oxide film, a first silicon nitride film over the first silicon oxide film, and a second silicon oxide film over the first silicon nitride film,
wherein the (b4) comprises:
(b9) forming, in the first region, the second region, and the third region, the first silicon oxide film that covers the first gate electrode and the fourth conductive film over the semiconductor substrate;
(b10) forming the first silicon nitride film over the first silicon oxide film; and
(b11) forming the second silicon oxide film over the first silicon nitride film.

10. The method of manufacturing a semiconductor device according to claim 1,
wherein the first gate insulating film, the first gate electrode, the second gate insulating film, and the second gate electrode configure a nonvolatile memory,
wherein the third gate insulating film and the third gate electrode configure a first transistor, and
wherein the fourth gate insulating film and the fourth gate electrode configure a second transistor.

* * * * *